(12) United States Patent
Murakami et al.

(10) Patent No.: US 8,607,131 B2
(45) Date of Patent: Dec. 10, 2013

(54) DECODER, RECEIVING APPARATUS, DECODING METHOD, AND RECEIVING METHOD

(71) Applicant: Panasonic Corporation, Osaka (JP)

(72) Inventors: Yutaka Murakami, Osaka (JP); Shutai Okamura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/900,264

(22) Filed: May 22, 2013

(65) Prior Publication Data

US 2013/0262955 A1    Oct. 3, 2013

Related U.S. Application Data

(63) Continuation of application No. 13/122,942, filed as application No. PCT/JP2009/005286 on Oct. 9, 2009, now Pat. No. 8,473,827.

(30) Foreign Application Priority Data

Oct. 10, 2008  (JP) .............................. 2008-264382
Nov. 12, 2008  (JP) .............................. 2008-290022

(51) Int. Cl.
  *H03M 13/03*    (2006.01)
(52) U.S. Cl.
  USPC ........................... 714/790; 714/752; 714/758
(58) Field of Classification Search
  USPC ....................................... 714/752, 758, 790
  See application file for complete search history.

(56) References Cited

U.S. PATENT DOCUMENTS

| 7,089,479 | B2 * | 8/2006 | Matsumoto | 714/758 |
| 7,805,653 | B2 * | 9/2010 | Uchida et al. | 714/752 |
| 8,321,745 | B2 * | 11/2012 | Myung et al. | 714/752 |
| 2006/0123277 | A1 | 6/2006 | Hocevar | |
| 2010/0070820 | A1 | 3/2010 | Sakai | |
| 2010/0107033 | A1 * | 4/2010 | Kuri et al. | 714/752 |

FOREIGN PATENT DOCUMENTS

| EP | 2 053 751 | 4/2009 |
| EP | 2 096 763 | 9/2009 |
| WO | 2008/016117 | 2/2008 |
| WO | 2008/075627 | 6/2008 |
| WO | 2008/093717 | 8/2008 |

OTHER PUBLICATIONS

International Search Report dated Dec. 22, 2009.
Extended European Search Report dated Jan. 25, 2013.

(Continued)

*Primary Examiner* — Sam Rizk
(74) *Attorney, Agent, or Firm* — Dickinson Wright PLLC

(57) ABSTRACT

Disclosed are an encoder, a transmission device, and an encoding method with which the transmission amount is reduced and a deterioration in transmission efficiency is suppressed while improving reception quality when QC-LDPC or a like block encoding is used. A puncture pattern setting unit searches for a puncture pattern for each integral multiple of the number of columns or for each divisor of the number of columns of a sub block matrix that forms a check matrix (H) of a QC-LDPC code, and a puncture unit (data reduction unit) switches the puncture pattern for each integral multiple of the number of columns or for each divisor of the number of columns of the sub block matrix that forms the check matrix of the QC-LDPC code.

10 Claims, 33 Drawing Sheets

(56) References Cited

OTHER PUBLICATIONS

S. Choi et al., "Effective Puncturing Schemes for Block-type Low-Density Parity-Check Codes," IEEE 65th Vehicular Technology Conference, VTC2007-Spring, Apr. 22, 2007, pp. 1841-1845.

T. Yoshikawa, et al., "Rate Estimation Techniques for Rate-Compatible LDPC Codes," IEICE Transactions, vol. J89 A, No. 12, Dec. 2006, pp. 1175-1184.

M. Fossorier, "Quasi-Cyclic Low-Density Parity-Check Codes From Circulant Permutation Matrices," IEEE Transactions on Information Theory, vol. 50, No. 8, Aug. 2004, pp. 1788-1793.

L. Chen, et al. "Near-Shannon-Limit Quasi-Cyclic Low-Density Parity-Check Codes," IEEE Transactions on Communications, vol. 52, No. 7, Jul. 2004, pp. 1038-1042.

IEEE P802.11n/D3.00, Unapproved IEEE Standards Draft, Sep. 2007, pp. 274-281.

D. MacKay, "Good Error-Correcting Codes Based on Very Sparse Matrices," IEEE Transactions on Information Theory, vol. 45, No. 2, Mar. 1999, pp. 399-431.

M. Fossorier et al., "Transactions Papers: Reduced Complexity Iterative Decoding of Low-Density Parity Check Codes Based on Belief Propagation," IEEE Transactions on Communications, vol. 47, No. 5, May 1999, pp. 673-680.

J. Chen et al., "Transaction Papers: Reduced-Complexity Decoding of LDPC Codes," IEEE Transactions on Communications, vol. 53, No. 8, Aug. 2005, pp. 1288-1299.

E. Choi, et al., "Rate-Compatible Puncturing for Low-Density Parity-Check Codes with Dual-Diagonal Parity Structure," IEEE 16$^{th}$ International Symposium on Personal, Indoor and Mobile Radio Communications, vol. 4, XP010928170, Sep. 2005, pp. 2642-2646.

S. Hong, et al., "Optimal Puncturing of Block-Type LDPC Codes and Their Fast Convergence Decoding," 2006 IEEE International Symposium on Information Theory, Jul. 9-14, 2006, pp. 826-830.

* cited by examiner

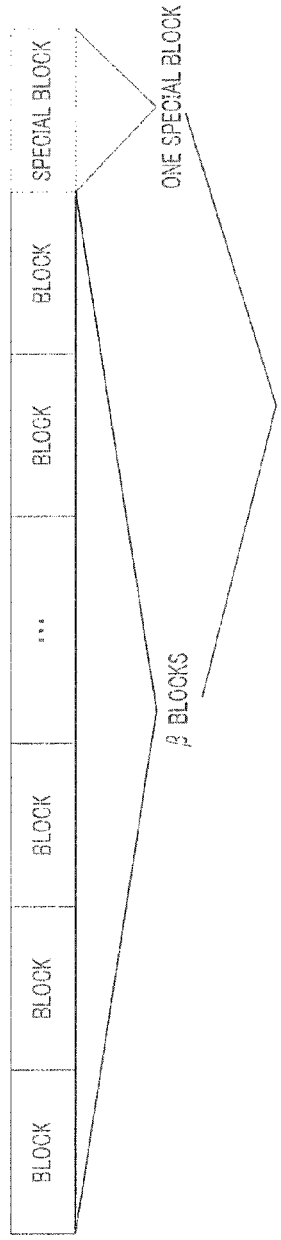
FIG. 13

| $0 < \alpha \leqq a1$ | $a1 < \alpha \leqq a2$ | $a2 < \alpha \leqq M-1$ |
|---|---|---|
| ZERO MATRIX #1 (METHOD #1 FOR REDUCING PARITY BITS TO BE TRANSMITTED) | ZERO MATRIX #2 (METHOD #2 FOR REDUCING PARITY BITS TO BE TRANSMITTED) | NO ZERO MATRIX (PARITY BITS TO BE TRANSMITTED ARE NOT REDUCED) |

CHECK MATRIX $H_b$ OF CODING RATE 5/6

PARTIAL MATRIX $H_{b1}$
RELATED TO INFORMATION BITS

PARTIAL MATRIX $H_{b2}$
RELATED TO PARITY BITS

```
1  25 -1  47  4 -1 91 84  8 86 52 82 33  5  0 36 20  4 77 | 80  0 -1 -1 -1
-1  6 -1 36 40 47 12 79 47 -1 41 21 12 71 14 72  0 44 49  0  0  0 -1  0 -1
51 81 83  4 67 -1 21 -1 31 24 91 61 81  9 86 78 60 88 67 15 -1 -1  0 -1  0
50 -1 50 15 -1 36 13 10 11 20 53 90 29 92 57 30 84 92 11 66 80  0 -1 -1  0
```

PUNCTURING PATTERN #A IS USED
(TO BE THE SAME PUNCTURING PATTERN)

CYCLE OF PUNCTURING PATTERN:
NUMBER OF COLUMNS OF SUBBLOCK

FIG.20A $w = [1011111101\ 1111111110\ 0111101100\ 1011111101\ 0011111111]$ $vi = [\ \ \ \ s50*i,\ \ s50*i+1,\ s50*i+2,\ s50*i+3\ ,\ s50*i+4\ ,\ s50*i+5,\ s50*i+6\ ,\ s50*i+7\ ,\ s50*i+8,\ s50*i+9,$
$s50*i+10,\ s50*i+11,\ s50*i+12,\ s50*i+13,\ s50*i+14,\ s50*i+15,\ s50*i+16,\ s50*i+17,\ s50*i+18,\ s50*i+19,$
$s50*i+20,\ s50*i+21,\ s50*i+22,\ s50*i+23,\ s50*i+24,\ s50*i+25,\ s50*i+26,\ s50*i+27,\ s50*i+28,\ s50*i+29,$
$s50*i+30,\ s50*i+31,\ s50*i+32,\ s50*i+33,\ s50*i+34,\ s50*i+35,\ s50*i+36,\ s50*i+37,\ s50*i+38,\ s50*i+39,$
$s50*i+40,\ s50*i+41,\ s50*i+42,\ s50*i+43,\ s50*i+44,\ s50*i+45,\ s50*i+46,\ s50*i+47,\ s50*i+48,\ s50*i+49]$

◯ : BITS TO BE REMOVED

: BITS TO BE REMOVED

DECODER, RECEIVING APPARATUS, DECODING METHOD, AND RECEIVING METHOD

CROSS REFERENCE TO RELATED APPLICATIONS

This is a continuation application of application Ser. No. 13/122,942 filed Apr. 6, 2011, which is a 371 application of PCT/JP2009/005286 filed Oct. 9, 2009, which is based on Japanese Application No. 2008-264382 filed Oct. 10, 2008 and Japanese Application No. 2008-290022 filed Nov. 12, 2008, the entire contents of each of which are incorporated by reference herein.

TECHNICAL FIELD

The present invention relates to an encoder, a transmitting apparatus and a coding method that form a coded sequence using a parity generator matrix that partially or regularly includes zero matrixes such as QC-LDPC (Quasi Cyclic Low Density Parity Check) code.

BACKGROUND ART

In recent years, low density parity check (LDPC: Low Density Parity Check) code is becoming popular as error correction code that makes the most of high error correction performance on a feasible circuit scale. The LDPC code is an error correction code defined by a low density parity check matrix H. "Low density" means that the number of "1" elements included in a matrix is considerably smaller than the number of "0" elements. The LDPC code is a block code having the same block length as the number of columns N of parity check matrix H.

Because of its high level error correction performance and ease of mounting, the LDPC code is adopted for a high-speed wireless LAN (Local Area Network) system of IEEE802.11n and an error correction coding scheme such as a digital broadcasting system. Furthermore, an adoption of QC (Quasi Cyclic)-LDPC code on a home network is also under study.

The block code has a feature that the error correction performance improves as the block code length increases. When, for example, symbols such as a header for transmitting control information or the like are wished to be transmitted reliably, receiving quality of the header can be secured using a block code longer than the header.

Furthermore, using the same error correction code as the error correction code used to transmit information and the error correction code used to transmit the header is advantageous from the perspective of the circuit scale. The present application refers to and describes a symbol for transmitting control information or the like as "header," but a symbol for transmitting control information or the like may also be referred to as "control symbol (control channel or control signal)," "preamble," "tail symbol," "pilot symbol (pilot channel or pilot signal)," "training symbol" or the like.

In this case, as shown in FIG. 1, when the number of information bits that need to be transmitted (e.g., header length) is less than the block length of the block code, parity bits are generated by performing coding assuming that information bits in the excess part of the block length are 0's.

As a coded sequence to be actually transmitted, only information bits that need to be transmitted (e.g., header) and parity bits are transmitted as shown, for example, in FIG. 1. That is, the portion of information bits assumed to be 0's is not actually transmitted.

A header of control information, for example, generally has a smaller number of bits than payload data that transmits information such as an image. However, by transmitting the header and parity bits as shown in FIG. 1, the header and payload data can be encoded using the same block code. Furthermore, since the header is encoded using the block code of a greater block length than the header length, receiving quality of the header can be secured. As a result, since the header can be reliably transmitted to the communicating party, the aforementioned communication method is effective in establishing communication.

CITATION LIST

Non-Patent Literature

NPL 1
"Rate Estimation Techniques for Rate-Compatible LDPC Codes," IEICE (Institute of Electronics, Information and Communication Engineers) transactions 2006/12 Vol. J89 A No. 12 p. 1177
NPL 2
M. P. C. Fossorier, "Quasi-cyclic low-density parity-check codes from circulant permutation matrices," IEEE Trans. Inform. Theory, vol. 50, no. 8, pp. 1788-1793, November 2001.
NPL 3
L. Chen, J. Xu, I. Djurdjevic, and S. Lin, "Near-Shannon limit quasi-cyclic low-density parity-check codes," IEEE Trans. Commun., vol. 52, no. 7, pp. 1038-1042, July 2004.
NPL 4
IEEE Unapproved Draft Std P802.11n_D3.00, pp. 274, September 2007
NPL 5
D. J. C. Mackay, "Good error-correcting codes based on very sparse matrices," IEEE Trans. Inform. Theory, vol. 45, no. 2, pp 399-431, March 1999.
NPL 6
M. P. C. Fossorier, M. Mihaljevic, and H. Imai, "Reduced complexity iterative decoding of low density parity check codes based on belief propagation," IEEE Trans. Commun., vol. 47, no. 5, pp. 673-680, May 1999.
NPL 7
J. Chen, A. Dholakia, E. Eleftheriou, M. P. C. Fossorier, and X.-Yu Hu, "Reduced-complexity decoding of LDPC codes," IEEE Trans. Commun., vol. 53, no. 8, pp. 1288-1299, August 2005.

SUMMARY OF INVENTION

Technical Problem

However, when data such as a header having a smaller data length than the block length is encoded, the prior arts can improve receiving quality, but also have to transmit parity bits obtained through coding assuming that information bits are 0's. Thus, when the header length is equivalent to the block length and its length is short, the number of parity bits that need to be transmitted is small. On the contrary, when the block length is greater than the header length, the number of parity bits that need to be transmitted increases, and the prior arts have a problem that data transmission efficiency deteriorates. Therefore, solving the problem of deterioration of data transmission efficiency will provide an advantage of being able to improve data transmission efficiency as well as receiving quality.

It is therefore an object of the present invention to provide an encoder, a transmitting apparatus and a coding method capable of reducing, when using a block code such as QC-LDPC code, the amount of transmission and suppressing deterioration of transmission efficiency while improving receiving quality.

Solution to Problem

An encoder of the present invention includes: a coding section that generates coded sequence s that satisfies equation (14-1), equation (14-2) and equation (14-3) for information bit sequence u; and a setting section that sets a y-th puncturing pattern which corresponds to the number of columns z ranging from z×y+1 columns (y is an integer between 0 and $(n_b-1)$) to z×(y+1) columns, and which has a cycle of divisors of the number of columns z, and, with this encoder, in the coded sequence s made up of z×$n_b$ bits from a first bit to a z×$n_b$-th bit, bits to be removed are determined from a z×y+1-th bit to a z×(y+1)-th bit, based on the y-th puncturing pattern, the bits determined to be removed are removed from the z×$n_b$ bits making up the coded sequence s to form a transmission information bit sequence, and the transmission information bit sequence is outputted.

A transmitting apparatus of the present invention adopts a configuration including a transmission section that is provided with the above described encoder and transmits the transmission information bit sequence.

A coding method of the present invention includes the steps of: generating coded sequence s that satisfies equation (16-1), equation (16-2) and equation (16-3) for information bit sequence u; and setting a y-th puncturing pattern which corresponds to the number of columns z ranging from z×y+1 columns (y is an integer between 0 and $(n_b-1)$) to z×(y+1) columns, and which has a cycle of divisors of the number of columns z, and with this coding method, in the coded sequence s made up of z×$n_b$ bits from a first bit to a z×$n_b$-th bit, bits to be removed are determined from a z×y+1-th bit to a z×(y+1)-th bit, based on the y-th puncturing pattern, the bits determined to be removed are removed from the z×$n_b$ bits making up the coded sequence s to form a transmission information bit sequence and the transmission information bit sequence is outputted.

Advantageous Effects of Invention

According to the communication apparatus and the communication method of the present invention, when using a block code such as QC-LDPC code, it is possible to reduce the amount of transmission and suppress deterioration of transmission efficiency while improving receiving quality.

BRIEF DESCRIPTION OF DRAWINGS

FIG. 3 is a diagram illustrating an example of parity generator matrix g of QC-LDPC code;

FIG. 4 is a diagram illustrating an example of zero matrix;

FIG. 5 is a diagram illustrating another example of zero matrix;

FIG. 13 is a diagram illustrating an example of arrangement of information bits;

FIG. 14 is a diagram illustrating the correspondence between data length α and a method of reducing parity bits to be transmitted;

FIG. 19A is a diagram illustrating an application example puncturing pattern according to Embodiment 5 of the present invention;

FIG. 19B is a diagram illustrating another application example of puncturing pattern according to Embodiment 5;

FIG. 20A is a diagram illustrating a still further application example of puncturing pattern according to Embodiment 5;

FIG. 21 is a diagram illustrating an application example of puncturing pattern according to Embodiment 6 of the present invention;

FIG. 22 is a diagram illustrating another application example of puncturing pattern according to Embodiment 6;

FIG. 26 is a diagram illustrating another example of puncturing pattern according to Embodiment 7.

DESCRIPTION OF EMBODIMENTS

Hereinafter, embodiments of the present invention will be described in detail with reference to the accompanying drawings.

Embodiment 1

Figure 1:
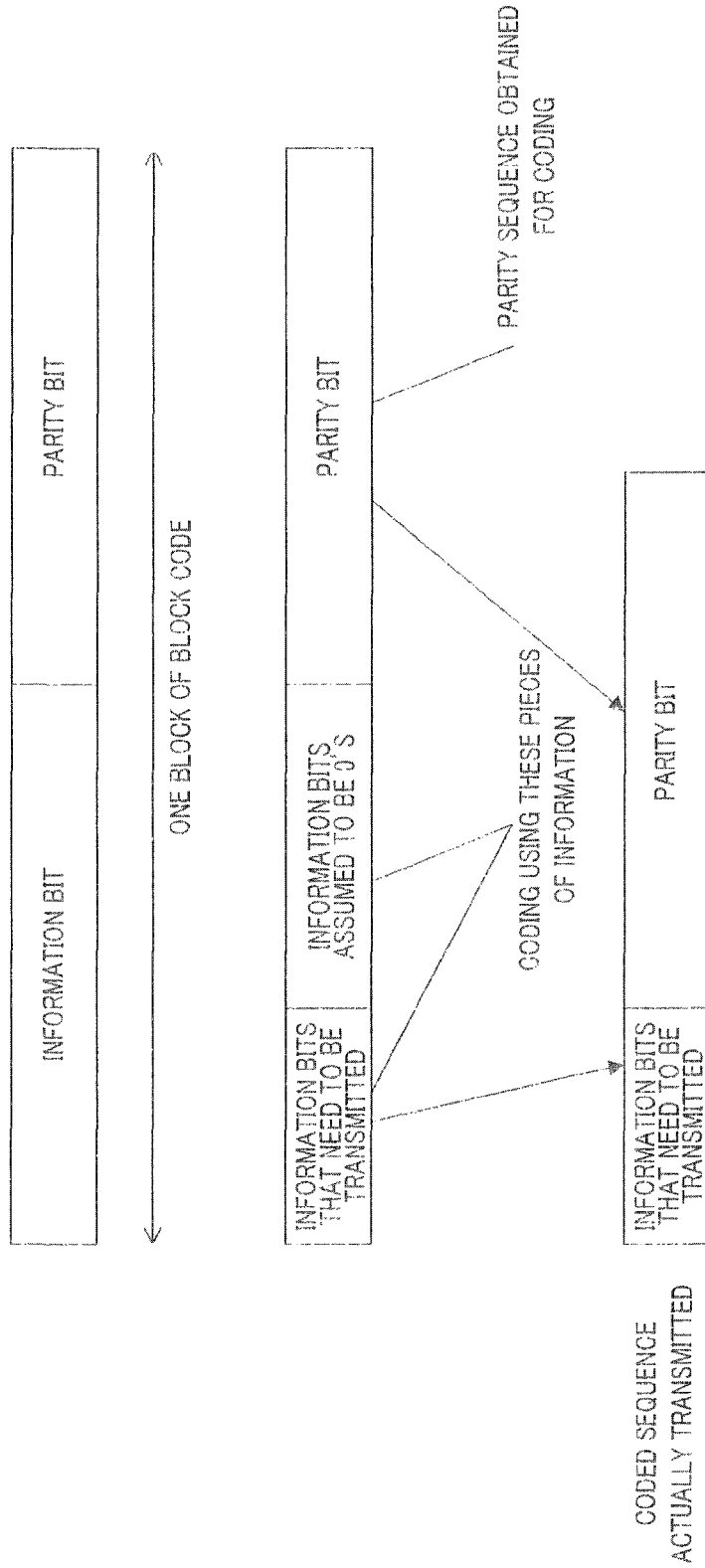
FIG. 1 is a diagram illustrating a block configuration example of block code and a coded sequence that is actually transmitted.
Figure 2:
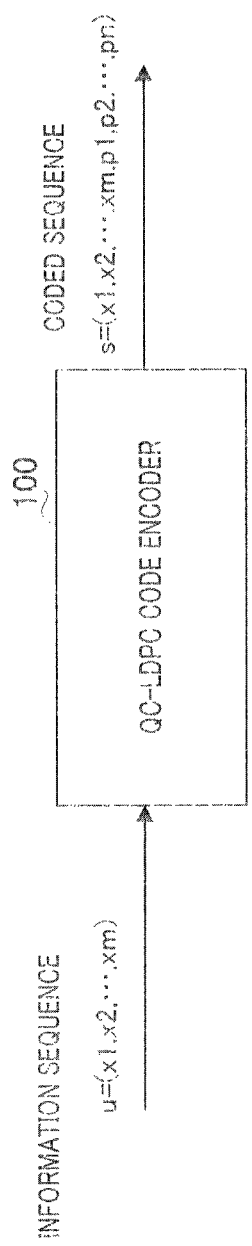
FIG. 2 is a diagram illustrating input and output data of an encoder used for a communication apparatus according to Embodiment 1 of the present invention.

FIG. 2 illustrates input and output data of an encoder used for a communication apparatus of the present invention. Encoder 100 in FIG. 2 forms a QC-LDPC (Quasi Cyclic Low Density Parity Check) code.

In FIG. 2, information sequence u=(x1, x2, . . . , xm) is input data of encoder 100 and coded sequence s=(x1, x2, . . . , xm, p1, p2, . . . , pn) represents output data of the encoder.

Equation 1 represents parity check matrix H of the QC-LDPC code (see Non-Patent Literature 1, Non-Patent Literature 2 and Non-Patent Literature 3).

$$H = \begin{bmatrix} I(p_{0,0}) & I(p_{0,1}) & \ldots & I(p_{0,L-1}) \\ I(p_{1,0}) & I(p_{1,1}) & \ldots & I(p_{1,L-1}) \\ \vdots & \vdots & \ddots & \vdots \\ I(p_{J-1,0}) & I(p_{J-1,1}) & \ldots & I(p_{J-1,L-1}) \end{bmatrix}$$ (Equation 1)

In equation 1, $0 \leq j \leq J-1$, $0 \leq l \leq L-1$ and parity check matrix H has code length $N = p \times L$ (p is a natural number). Furthermore, subblock matrix $I(p_{j,l})$ is a cyclic permutation matrix of q rows and r columns where $(r = (q + p_{j,l}) \mod p (0 \leq q \leq p-1))$ is 1 and "0" otherwise. $p_{j,l}$ is determined to be "0" or "1" by randoms.

Encoder 100 in FIG. 2 generates a coded sequence using generator matrix G. Here, generator matrix G has the relationship of equation 2 with parity check matrix H.

$$GH^T = 0$$ (Equation 2)

Coded sequence s can be represented as $s^T = Gu^T$ using information sequence u and generator matrix G. Since the QC-LDPC code is a systematic code, generator matrix G can be expressed as shown in equation 3.

[3]

$$G = \begin{bmatrix} I \\ g \end{bmatrix}$$ (Equation 3)

Here, I is a unit matrix of $m \times m$. Furthermore, when only parity sequence w is extracted from coded sequence s and defined as w=(p1, p2, . . . , pn), matrix g is a matrix (parity generator matrix) to obtain parity sequence w. Parity generator sequence w satisfies $w^T = gu^T$.

Figure 3:
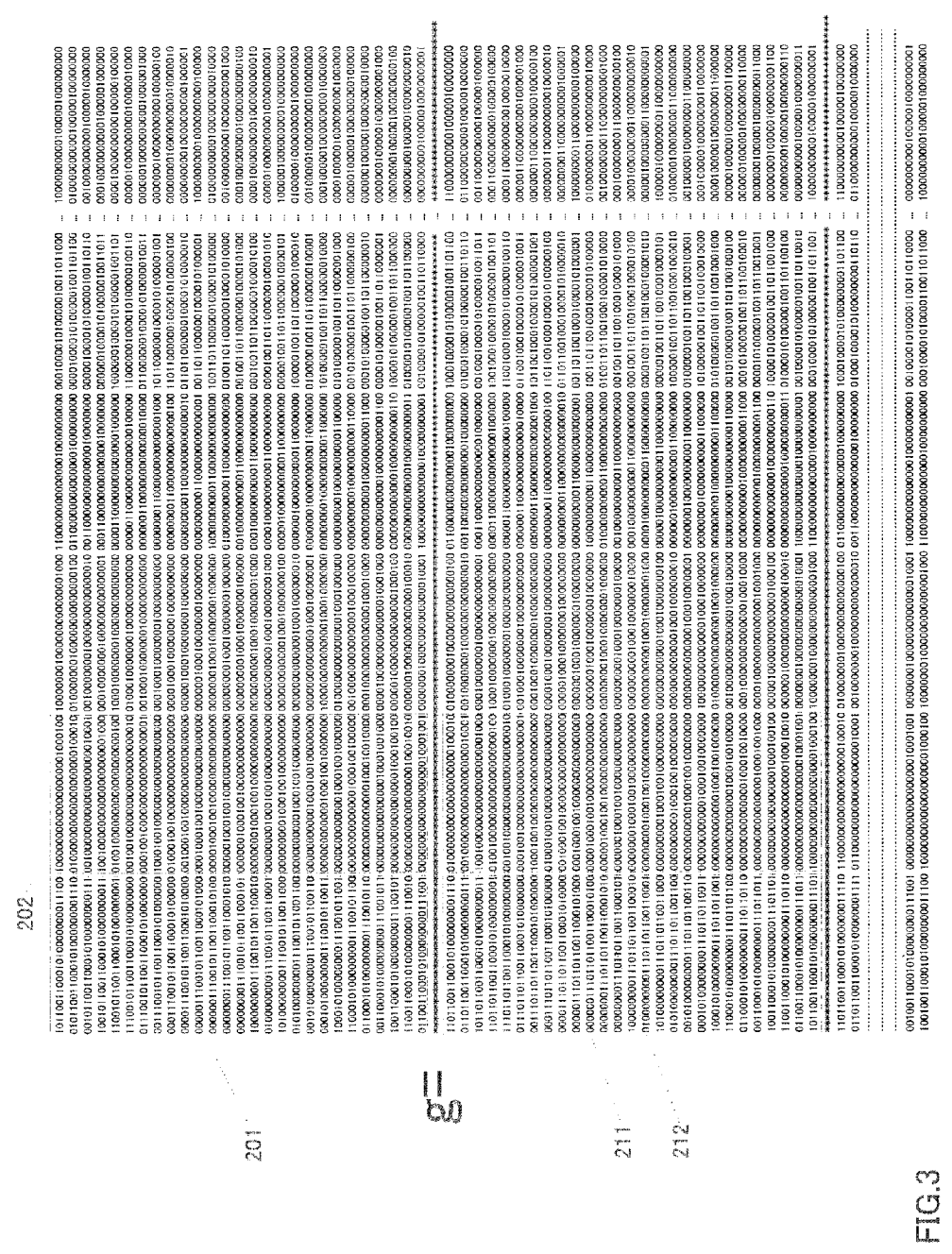

FIG. 3 illustrates an example of parity generator matrix g of the QC-LDPC code. The QC-LDPC code illustrated in FIG. 3 is a QC-LDPC code having a coding rate (R)=½, LDPC code information block length (bits)=648, LDPC codeword block length (bits)=1296 described in Table 20-14 (LDPC parameters) of Non-Patent Literature 4.

Parity generator matrix g illustrated in FIG. 3 is made up of a plurality of subblock matrixes 201, 202, . . . , 211, 212, . . . . For example, in subblock matrix 201 in FIG. 3, each (i+1)-th row element assumes a value shifting each i-th row element (i is a natural number) one bit (one column) to the right. Likewise, in subblock matrix 211 in FIG. 3, each (i+1)-th row element assumes a value shifting each i-th row element (i is a natural number) one bit to the right.

Furthermore, in subblock matrix 202 in FIG. 3, each second row element assumes a value shifting each first row element one bit to the right. Likewise, in subblock matrix 212 in FIG. 3, each second row element assumes a value shifting each first row element one bit to the right.

Thus, subblock matrixes 201, 202, . . . , 211, 212 can be said to be cyclic permutation matrixes. In the example shown in FIG. 3, subblock matrixes 201, 202, . . . , 211, 212 are matrixes of 27 rows and 27 columns.

Furthermore, in parity generator matrix g, subblock matrixes of the same column are related to each other. For example, when subblock matrix 201 is compared with subblock matrix 211 of the same column as that of subblock matrix 201, the i-th row element of subblock matrix 211 is different from the (i+1)-th row element (i is a natural number) of subblock matrix 201 only in the second bit.

Likewise, when subblock matrix 202 is compared with subblock matrix 212 of the same column as that of subblock matrix 202, the i-th row element of subblock matrix 212 is the same as the (i+1)-th row element (i is a natural number) of subblock matrix 201.

In a vertical view of the subblock matrix of 27 rows and 27 columns, for example, in a vertical view of subblock matrix 201 and subblock matrix 211, as described above, although these subblock matrixes are related to each other, the subblock matrixes are not always identical matrixes.

Figure 4:
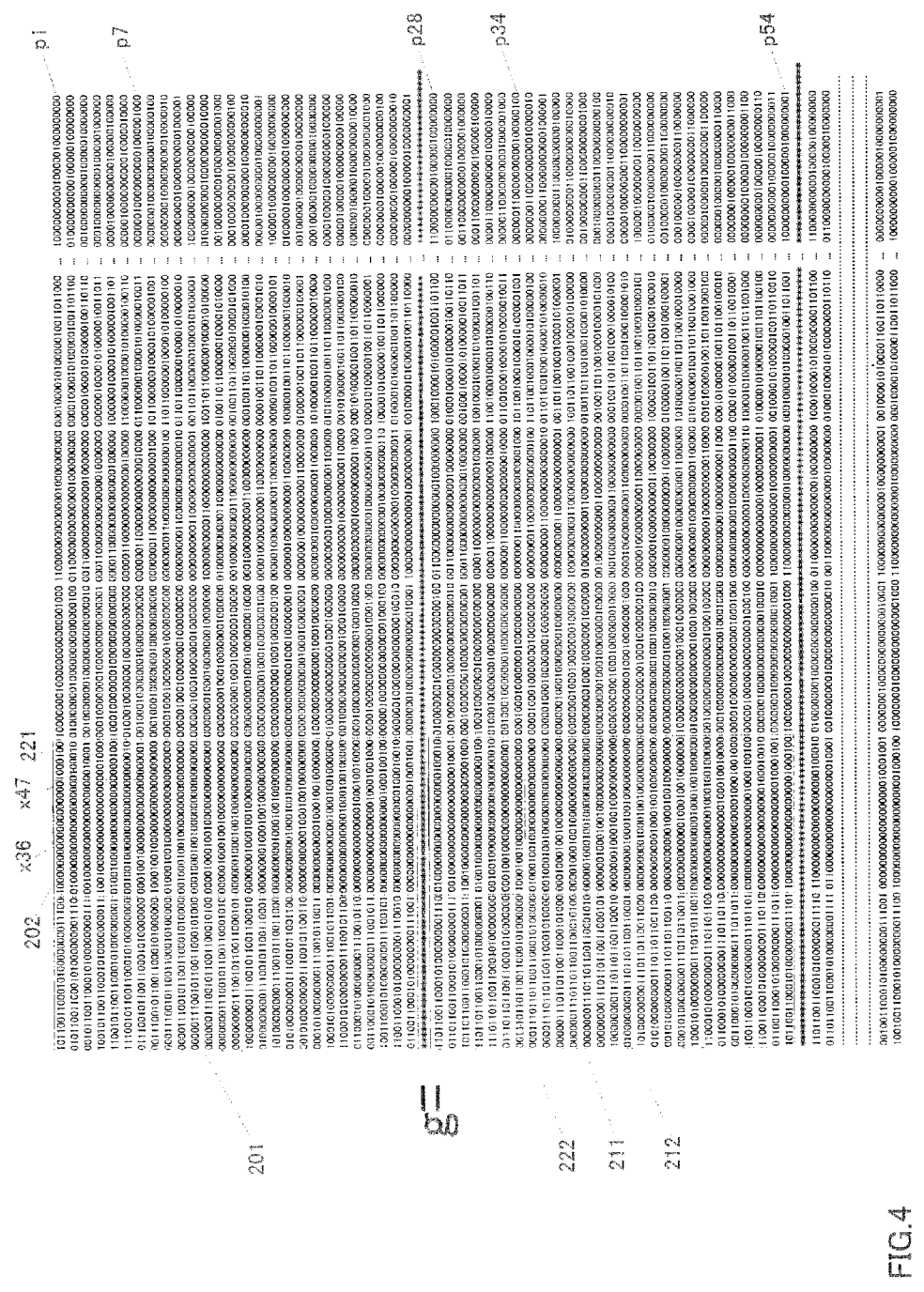

Furthermore, a feature of parity generator matrix g is that 0 elements are arranged consecutively. Thus, as is clear from FIG. 4 illustrating parity generator matrix g identical to that in FIG. 3, it is possible to secure matrix 221 in which the elements to constitute the matrix are all 0's in subblock matrix 202. Hereinafter, a matrix in which the elements to constitute the matrix are all 0's will be referred to as "zero matrix."

Furthermore, it is possible to secure zero matrix 222 which starts from the same column as that of zero matrix 221 and in which the number of columns is the same magnitude as zero matrix 221 in subblock matrix 212. In parity generator matrix g, there are many zero matrixes which start from the same column as that of zero matrix 221 and in which the number of columns is the same magnitude as in zero matrix 221.

Thus, the parity generator matrix of QC-LDPC code includes zero matrixes and has a feature that there are many zero matrixes which start from the same column of the parity generator matrix.

The present inventors have focused on this feature of parity generator matrix g of QC-LDPC code. That is, the present inventors have focused on the fact that when 0's are arranged in columns other than those of zero matrixes of m rows and n columns as information bits, all the m parity bits generated become 0's. Furthermore, the present inventors have focused on the fact that subblock matrixes having the same column are related to each other in the arrangement of elements in parity generator matrix g, and there are many zero matrixes which start from the same column in parity generator matrix g of QC-LDPC code, and therefore by arranging 0's in columns other than those of zero matrixes as information bits, many parity bits which become all 0's are generated.

That is, when the number of information bits that need to be transmitted is less than the block length of the block code and coding is performed assuming that some information bits are 0's, if the information bits that need to be transmitted are arranged in the column of zero matrixes (m rows and n columns) and 0's are arranged outside the zero matrixes (m rows and n columns) as imaginary bits, m parity bits having "0"

values are generated. These parity bits are always 0's regardless of the information bits that need to be transmitted.

Therefore, since the receiving side knows the positions of m parity bits always having "0" values from the positions of the zero matrixes, the receiving side can decode all data even if the transmitting side does not transmit m parity bits always having "0" values. Furthermore, the receiving side can set in parity bits always having "0" values as bits not to transmit by the transmitting apparatus, that is, such bits can be reduced as redundant bits.

This will be described in further detail using FIG. 4 again. Attention will be focused on zero matrix 221 in FIG. 4. Zero matrix 221 in FIG. 4 is a matrix of 7 rows and 12 columns and information bits corresponding to the columns of zero matrix 221 are x36 to x47. Thus, when coding is performed with information bits that need to be transmitted arranged in x36 to x47 and information bits "0" arranged in other than x36 to x47, p1 to p7 are always 0's regardless of the values of x36 to x47.

Likewise, focusing on zero matrix 222 whose column positions in parity generator matrix g are the same as those of zero matrix 221, if coding is performed with information bits "0" arranged in other than x36 to x47, p28 to p34 are always 0's regardless of the values of x36 to x47.

Therefore, of parity bits p1 to p54 generated by parity generator matrix g, p1 to p7 and p28 to p34 always have "0" values. Thus, when the transmitting apparatus does not transmit parity bits p1 to p54 always having "0" values generated by parity generator matrix g, bits to be transmitted by the transmitting apparatus can be reduced to only x36 to x47 and p8 to p27, p35 to p54. Although a case has been described above focusing on p1 to p54 as an example, it is possible to reduce the number of parity bits to be transmitted by the transmitting apparatus from p55 onward as well.

Since zero matrix 221 in FIG. 4 has 7 rows and 12 columns, when information bits that need to be transmitted are 12 bits or less, information bits that need to be transmitted may be arranged in columns of zero matrix 221.

Figure 5:
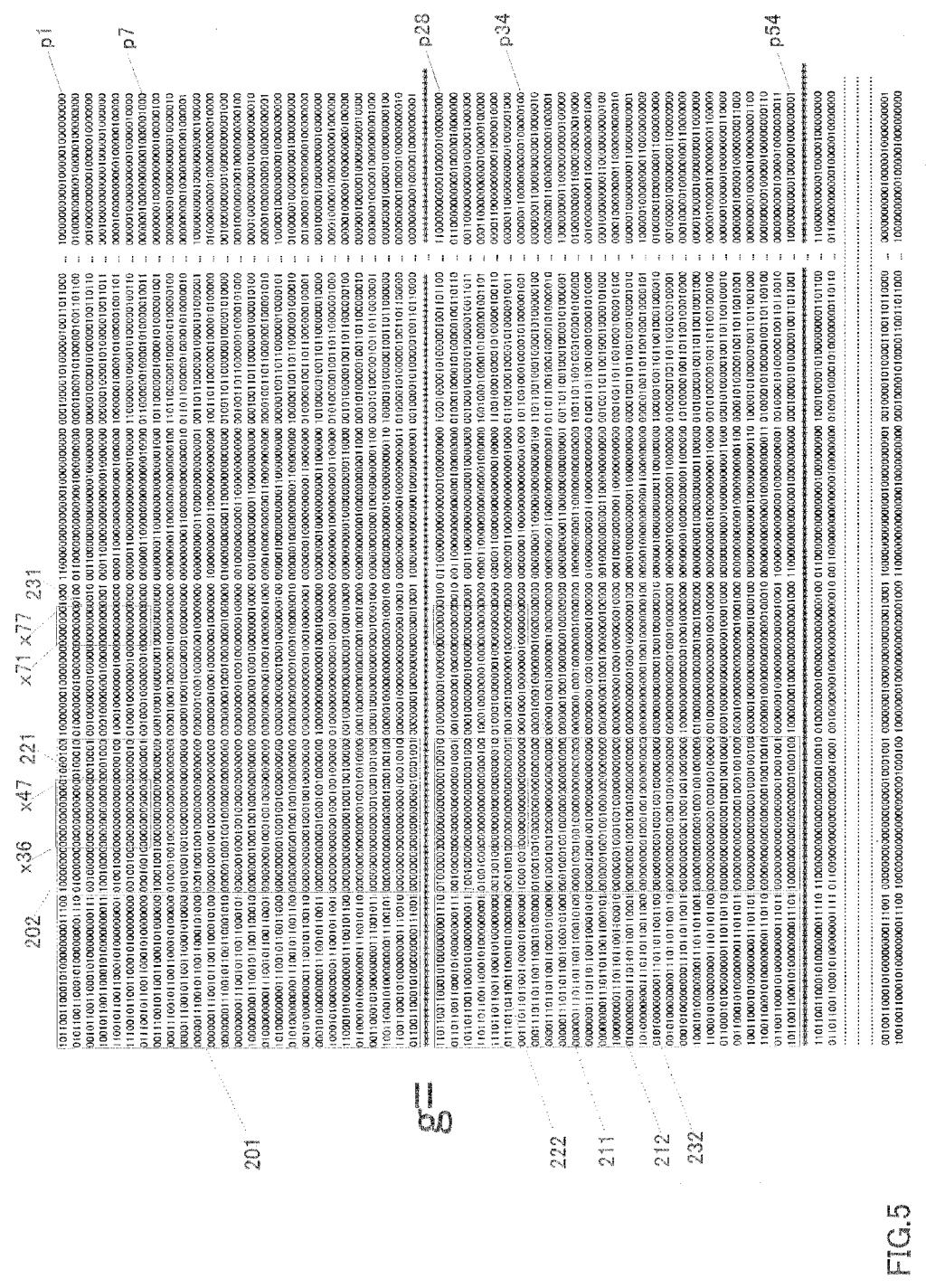

When information bits that need to be transmitted exceed 12 bits, information bits that need to be transmitted may be further arranged in columns of zero matrixes 231 and 232 as shown, for example, in FIG. 5. As a feature of a parity generator matrix of QC-LDPC code, since 0's are arranged consecutively, there are many zero matrixes such as zero matrixes 231 and 232 in parity generator matrix g in addition to zero matrixes 221, 222, . . . , as shown in FIG. 5.

Zero matrixes 231 and 232 are matrixes of 7 rows and 7 columns and even when information bits that need to be transmitted are arranged in x71 to x77, p1 to p7 and p28 to p34 are all 0's. Therefore, the transmitting apparatus need not transmit p1 to p7 and p28 to p34 in the same way as when zero matrixes 221 and 222 are used.

Therefore, when zero matrixes 231 and 232 are used in addition to zero matrixes 221 and 222, the information bits that need to be transmitted may be arranged in x36 to x47 and x71 to x77. By this means, the maximum number of bits becomes 19 (=12+7) bits, and, compared to the case where only zero matrixes 221 and 222 are used, it is possible to increase the maximum number of bits that can be arranged as information bits that need to be transmitted.

Likewise, when the number of information bits that need to be transmitted exceeds 19 bits, zero matrixes included in other partial matrixes may be used. FIG. 5 illustrates part of parity generator matrix g of QC-LDPC code, and there are 24 (=648/27) cyclic permutation matrixes of 27 rows and 27 columns in parity generator matrix g of QC-LDPC in the column direction, and therefore many zero matrixes are also included in areas not shown. For this reason, the transmitting apparatus can increase the maximum number of bits that can be arranged as information bits that need to be transmitted in the portions of zero matrixes using zero matrixes in the same way as that described above.

Thus, focusing on the fact that there are a plurality of zero matrixes that start from the same column of parity generator matrix g and that have the same number of columns in parity generator matrix g of QC-LDPC code, the present embodiment arranges information bits that need to be transmitted in columns of the zero matrixes and arranges 0's in columns other than the zero matrixes as imaginary bits. Thus, parity bits having the same number of "0" values as the number of rows of the zero matrixes are generated.

In this case, if the transmitting apparatus and receiving apparatus share the positions of zero matrixes with respect to parity generator matrix g, even if parity bits corresponding to the rows of the zero matrixes are not actually transmitted, the receiving side performs decoding processing assuming that 0's have been transmitted, and can thereby decode coded data encoded by parity generator matrix g. Thus, the transmitting apparatus can reduce the number of parity bits that need to be transmitted and improve transmission efficiency.

A zero matrix may also have 1 row and 1 column. That is, when there are a plurality of zero matrixes of 1 row and 1 column in the same row and there is a row having "0" elements in the same column as in the plurality of zero matrixes, the same number of parity bits always having "0" as rows having "0" elements in the same column are generated.

That is, when the transmitting apparatus inserts 0's in information bits and generates parity bits using information bits and 0's and matrix calculation with the parity generator matrix of QC-LDPC code, the transmitting apparatus removes parity bits always having "0" values of the parity bits based on the positions in which information bits are arranged and the parity generator matrix, outputs a parity sequence after the removal, transmits the parity sequence after the removal, and can thereby reduce the number of parity bits that need to be transmitted and improve transmission efficiency.

Of the zero matrixes (including zero matrixes of 1 row and 1 column) that start from the same column of parity generator matrix g and that have the same number of columns, the transmitting apparatus assumes a matrix having a maximum number of rows to be the zero matrix to be set, arranges 0's outside columns of the set zero matrix so as to generate the same number of parity bits having "0" values as rows of the set zero matrix.

Therefore, the transmitting apparatus punctures the parity bits having "0" values as bits not to transmit, and can thereby improve transmission efficiency. In this case, of the zero matrixes that start from the same column of parity generator matrix g and that have the same number of columns, the transmitting apparatus sets partial matrixes that are included more in parity generator matrix g as the zero matrixes, and can thereby reduce more parity bits.

In this case, the transmitting apparatus assumes the maximum number of bits that can be arranged as information bits that need to be transmitted to be the number of columns of the zero matrixes. For example, for the transmitting apparatus, when zero matrix 221, 222, . . . , are set as zero matrixes, the maximum number of bits in which information bits that need to be transmitted can be arranged is 12 bits.

Furthermore, for the transmitting apparatus, when zero matrixes 231 and 232 are set in addition to zero matrixes 221 and 222 as zero matrixes, the maximum number of bits in which information bits that need to be transmitted can be arranged is 19 bits. Conversely, the transmitting apparatus needs only to set zero matrixes according to the data length (number of bits) of information bits that need to be transmitted. As described above, a zero matrix may have 1 row and 1 column and may not necessarily be consecutive.

Figure 6:
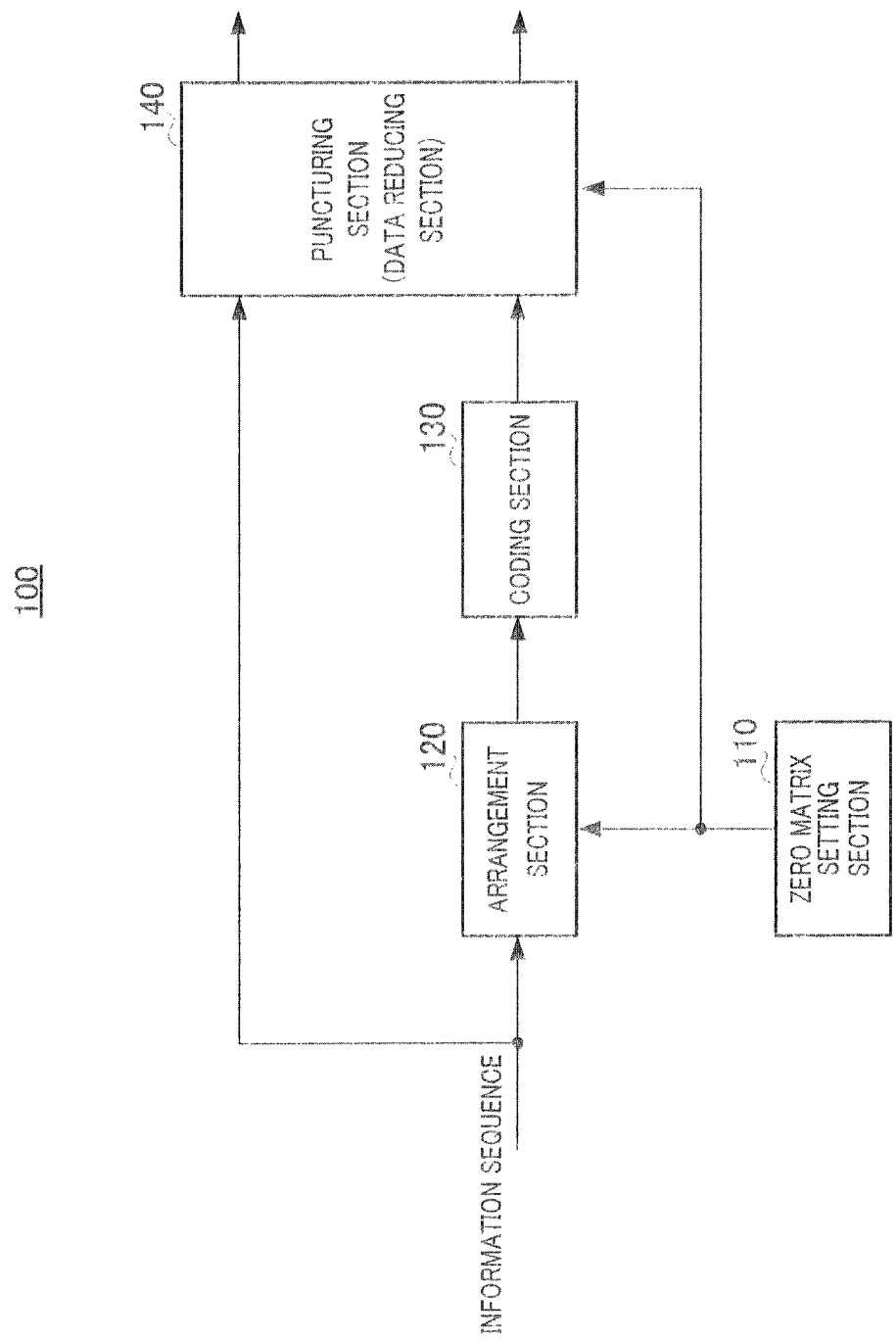
FIG. 6 is a diagram illustrating a configuration example of the encoder according to Embodiment 1.

FIG. 6 illustrates a configuration example of the encoder that performs coding using above described parity generator matrix g. Encoder 100 in FIG. 6 includes zero matrix setting section 110, arrangement section 120, coding section 130 and puncturing section (data reducing section) 140. Hereinafter, a case will be described where an information sequence having a fixed data length such as header is inputted to encoder 100 as an example.

Zero matrix setting section 110 sets a zero matrix which is a partial matrix of parity generator matrix g of QC-LDPC in which all constituent elements are 0's. As for the method of setting a zero matrix, when the data length of an information sequence is uniquely defined like a header, a zero matrix having a number of columns equal to or more than the header length is set. Hereinafter, a case will be described where zero matrixes 221, 222, . . . , in FIG. 4 are set as zero matrixes as an example. Zero matrix setting section 110 outputs information about the positions of zero matrixes in parity generator matrix g to arrangement section 120 and puncturing section (data reducing section) 140.

Arrangement section 120 receives an information sequence such as a header as input, arranges information bits (input bits) in columns of zero matrixes based on information about the positions of zero matrixes reported from zero matrix setting section 110 and arranges 0's in columns outside zero matrixes as imaginary bits.

When, for example, the positions of zero matrixes 221 and 222 are reported from zero matrix setting section 110, arrangement section 120 arranges information bits (input bits) in columns $x36$ to $x47$ of zero matrix 221 and arranges 0's outside $x36$ to $x47$. Arrangement section 120 outputs the arranged bits to coding section 130.

Coding section 130 codes the bits outputted from arrangement section 120 using parity generator matrix g and acquires coded sequence (information bits and parity bits). Coding section 130 outputs the coded sequence to puncturing section (data reducing section) 140.

Puncturing section (data reducing section) 140 punctures (removes) 0's arranged outside $x36$ to $x47$ from the coded sequence as bits not to transmit, based on the information about the positions of zero matrixes 221 and 222 reported from zero matrix setting section 110.

Furthermore, puncturing section (data reducing section) 140 punctures (removes) parity bits $p1$ to $p7$, $p28$ to $p34$, . . . corresponding to rows of zero matrixes 221 and 222 as bits not to transmit from the coded sequence based on the information about the positions of zero matrixes 221 and 222 reported from zero matrix setting section 110.

Puncturing section (data reducing section) 140 outputs the coded sequence other than the punctured (reduced) bits as bits not to transmit from the coded sequence, as bits that need to be transmitted.

Figure 7:
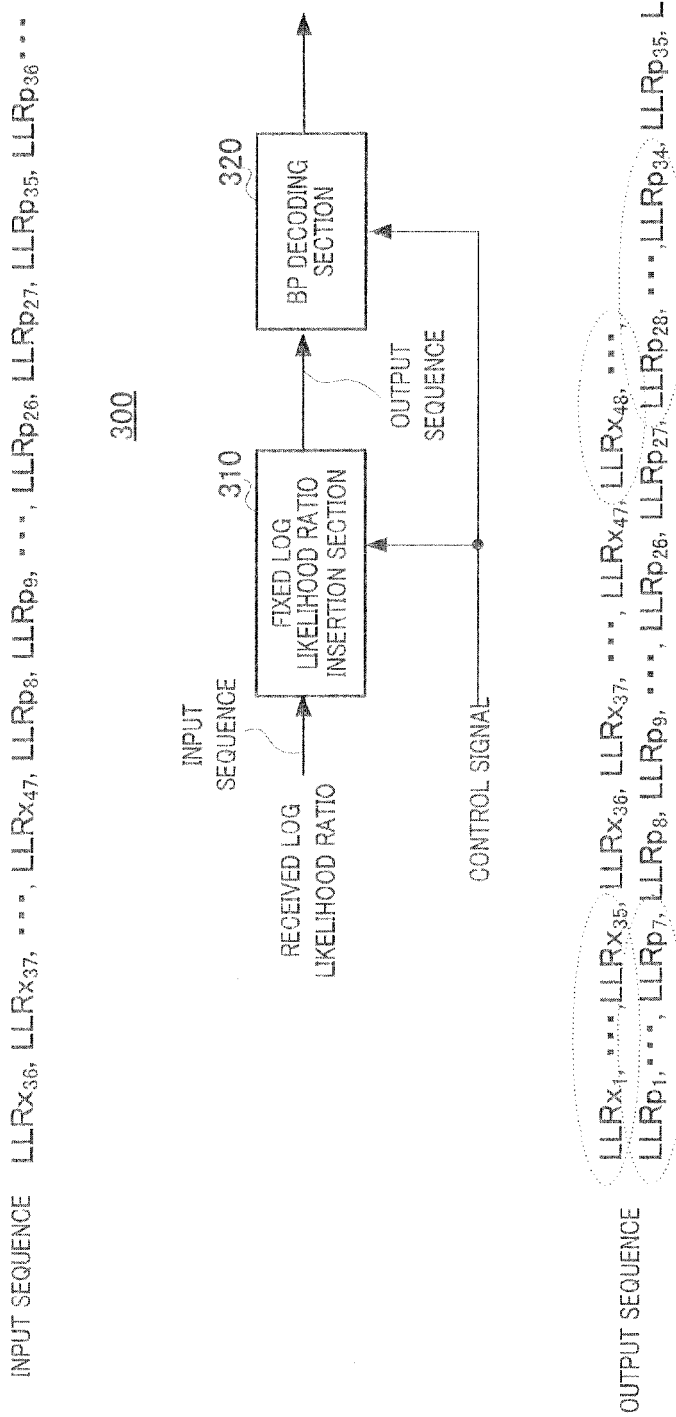
FIG. 7 is a diagram illustrating a configuration example of a decoder according to Embodiment 1.

FIG. 7 illustrates a configuration example of a decoder that decodes a signal transmitted from the above described encoder.

Decoder 300 includes fixed log likelihood ratio insertion section 310 and BP (Belief Propagation) decoding section 320.

Fixed log likelihood ratio insertion section 310 receives a received log likelihood ratio calculated by a log likelihood ratio calculation section (not shown) and a control signal indicating information about the positions of zero matrixes as input and inserts a known log likelihood ratio in the received log likelihood ratio according to the positions of zero matrixes.

When, for example, zero matrixes 221 and 222, . . . , are used on the coding side, received log likelihood ratios $LLR_{x36}$ to $LLR_{x47}$, $LLR_{p8}$ to $LLR_{p27}$, $LLR_{p35}$ and onward corresponding to $x36$ to $x47$ and $p8$ to $p27$, $p35$ and onward are inputted to fixed log likelihood ratio insertion section 310. Thus, fixed log likelihood ratio insertion section 310 inserts received log likelihood ratios $LLR_{x1}$ to $LLR_{x35}$, $LLR_{x48}$ . . . , $LLR_{p1}$ to $LLR_{p7}$, $LLR_{p28}$ to $LLR_{p34}$ corresponding to $x1$ to $x35$, $x48$, . . . .

To be more specific, when zero matrixes 221 and 222, . . . are used on the coding side, since this corresponds to 0's being transmitted as $x1$ to $x35$, $x48$, . . . , $p1$ to $p7$, $p28$ to $p34$, . . . , fixed log likelihood ratio insertion section 310 inserts fixed log likelihood ratios corresponding to known bits "0" as log likelihood ratios $LLR_{x1}$ to $LLR_{x35}$, $LLR_{x48}$ . . . , $LLR_{p1}$ to $LLR_{p7}$, $LLR_{p28}$ to $LLR_{p34}$ . . . of $x1$ to $x35$, $x48$ . . . . In FIG. 7, the received log likelihood ratios encircled by broken line circles represent the received log likelihood ratios inserted by fixed log likelihood ratio insertion section 310.

Fixed log likelihood ratio insertion section 310 outputs the inserted log likelihood ratios to BP decoding section 320.

BP decoding section 320 performs decoding using, for example, sum-product decoding, min-sum decoding, Normalized BP decoding and offset BP decoding described in Non-Patent Literature 5 to Non-Patent Literature 7.

Hereinafter, the configuration of communication apparatus #1 having the encoder configured as described above and the configuration of communication apparatus #2 that has the decoder configured as described above and receives a signal transmitted from communication apparatus #1 will be described.

Figure 8:
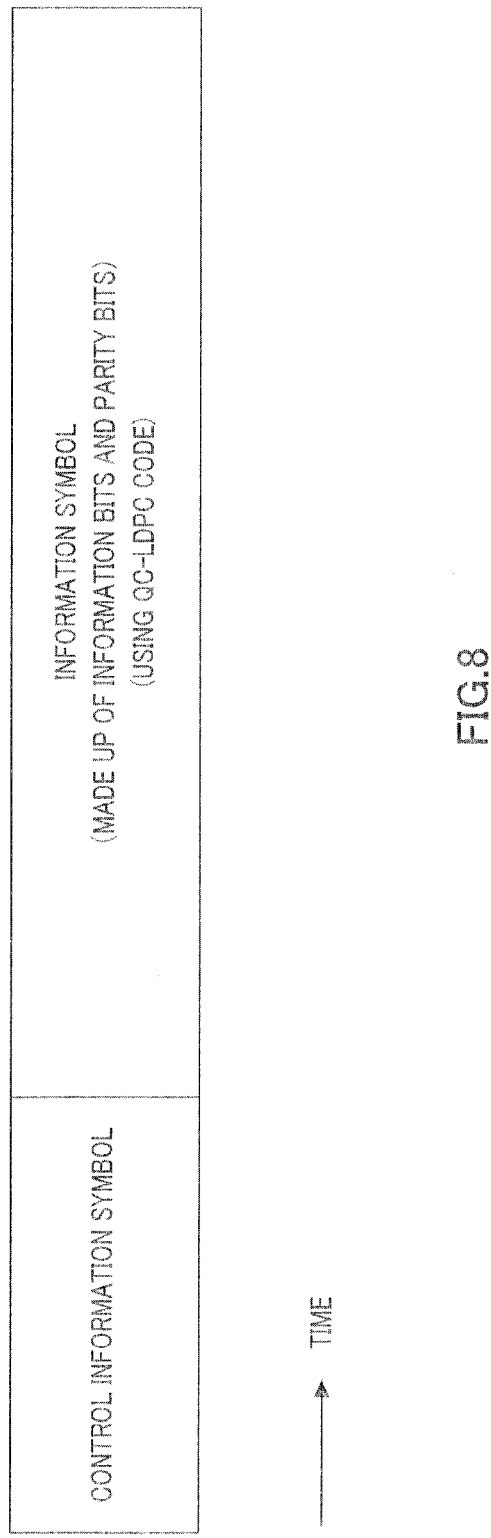
FIG. 8 is a diagram illustrating a frame configuration example of a modulated signal transmitted by communication apparatus #1.

FIG. 8 illustrates a frame configuration example of a modulated signal transmitted by communication apparatus #1. A control information symbol is a symbol for transmitting control information about a modulation scheme, error correction code used, coding rate, transmission method, data length or the like to the communicating party (communication apparatus #2). An information symbol is a symbol for transmitting information bits and parity bits obtained through QC-LDPC coding.

Figure 9:
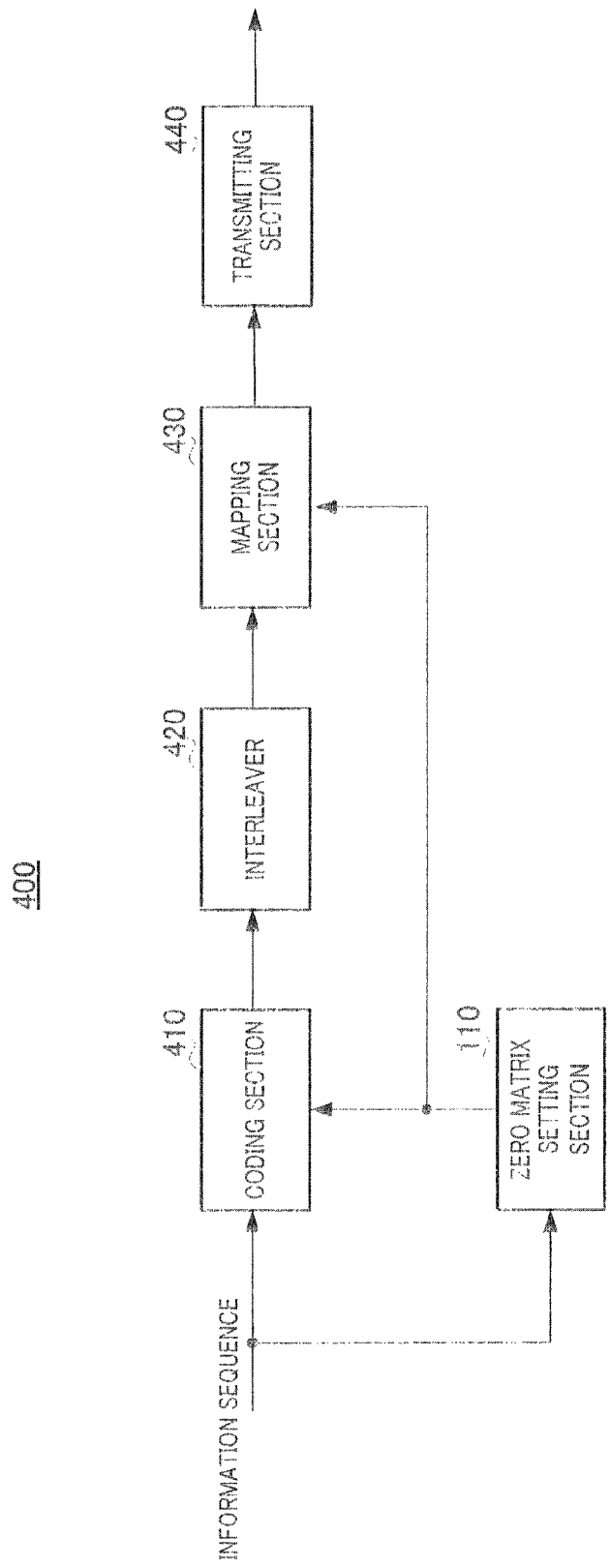
FIG. 9 is a diagram illustrating a configuration example of communication apparatus #1 having the encoder according to Embodiment 1.

FIG. 9 illustrates a configuration example of communication apparatus #1. In communication apparatus 400 in FIG. 9, coding section 410 receives an information sequence as input and outputs a coded sequence to interleaver 420. Coding section 410 is made up of encoder 100 in FIG. 6.

Interleaver 420 receives the coded sequence as input, performs interleaving and thereby obtains interleaved data. Interleaver 420 may not always be provided depending on the type of code.

Mapping section 430 receives the interleaved data as input, performs modulation such as QPSK (Quadrature Phase Shift Keying), 16QAM (Quadrature Amplitude Modulation) and thereby obtains a baseband signal.

Transmitting section 440 receives the baseband signal as input, applies predetermined signal processing such as quadrature modulation, frequency conversion, thereby obtains a modulated signal and transmits the modulated signal.

Figure 10:
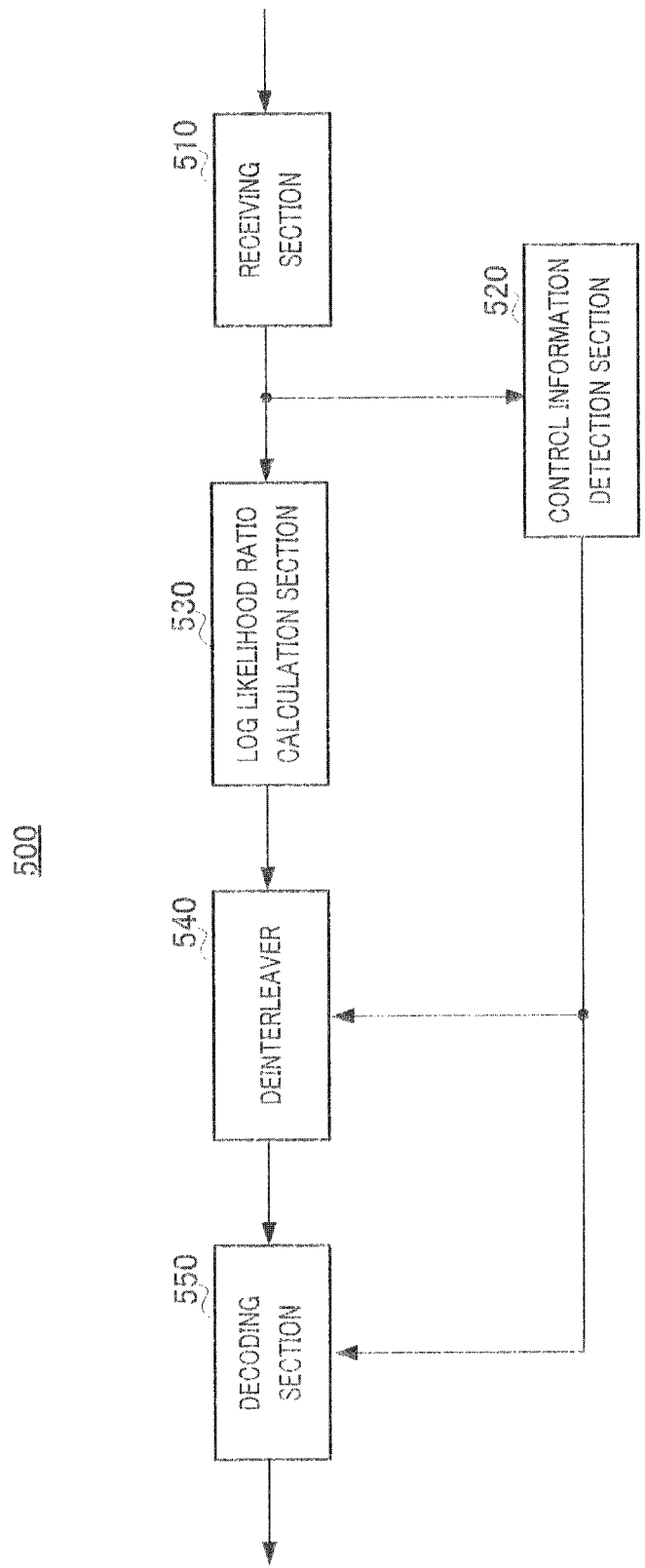
FIG. 10 is a diagram illustrating a configuration example of communication apparatus #2 having the decoder according to Embodiment 1.

FIG. 10 illustrates a configuration example of communication apparatus #2. In communication apparatus 500 in FIG. 10, receiving section 510 receives a received signal as input, applies predetermined radio processing such as frequency conversion and thereby obtains a baseband signal. Receiving section 510 outputs the baseband signal to control information detection section 520 and log likelihood ratio calculation section 530.

Control information detection section 520 detects information about zero matrixes, information about interleaving patterns and information about the coding rate or the like from the baseband signal. Control information detection section 520 then outputs the information about the interleaving pattern to deinterleaver 540 and outputs the information about zero matrixes and information about the coding rate to decoding section 550.

Log likelihood ratio calculation section 530 receives the baseband signal as input, calculates a log likelihood ratio using, for example, the method shown in Non-Patent Literature 5 and obtains a log likelihood ratio per bit. Log likelihood ratio calculation section 530 outputs the log likelihood ratio per bit to deinterleaver 540.

Deinterleaver 540 receives the log likelihood ratio per hit as input, applies corresponding processing of deinterleaving to interleaver 420 and thereby obtains deinterleaved log Likelihood ratios. When performing BP decoding, even when deinterleaver 540 is not provided, decoding section 550 can perform decoding by providing a parity check matrix with deinterleaving taken into account.

Decoding section 550 is made up of decoder 300 in FIG. 7. Decoding section 550 receives the deinterleaved log likelihood ratios as input, performs decoding corresponding to coding section 410 and thereby obtains received data.

As described above, in the present embodiment, zero matrix setting section 110 sets zero matrixes which are partial matrixes of parity generator matrix g and in which all elements are 0's. Arrangement section 120 arranges input hits in columns of zero matrixes and arranges 0's in columns outside the zero matrixes. Coding section 130 acquires parity bits through coding using parity generator matrix g. Puncturing section (data reducing section) 140 punctures (removes) 0's arranged in columns outside zero matrixes as bits not to transmit, based on information about the positions of zero matrixes reported from zero matrix setting section 110, and further punctures (removes) parity bits corresponding to rows of zero matrixes of the parity bits obtained as bits not to transmit.

Thus, when inputting information bits and generating parity bits through matrix calculation between the information bits and a parity generator matrix, encoder 100 arranges the information bits at positions corresponding to columns of partial matrixes in which all elements are 0's of the parity generator matrix, arranges 0's at positions corresponding to columns outside the partial matrixes in which all elements are 0's and performs matrix calculation between the arranged information hits, 0's and the parity generator matrix. Thus, encoder 100 generates a parity sequence, removes parity bits always having "0" values of the parity sequence and outputs the parity sequence after the removal.

In other words, encoder 100 inserts 0's in information bits, generates parity bits through matrix calculation between the information bits, 0's and the parity generator matrix of QC-LDPC code, removes parity bits always having "0" values of the parity bits based on the positions in which 0's are inserted and the parity generator matrix and outputs the parity sequence after the removal.

Therefore, in transmitting apparatus 400 having encoder 100, transmitting section 440 transmits input bits and parity bits other than the parity bits corresponding to rows of zero matrixes, and therefore without the necessity for transmitting parity bits corresponding to rows of the zero matrixes to the receiving side, the receiving side inserts known fixed log likelihood ratios as log likelihood ratios of parity bits corresponding to rows of zero matrixes and can perform decoding, and it is thereby possible to reduce the number of parity bits to transmit and improve transmission efficiency.

The information bits that need to be transmitted are not limited to a header including control information or the like, but may also be payload data (symbols for information transmission) or the like. In short, the present invention is applicable if the number of information bits that need to be transmitted is smaller than the number of columns of zero matrixes included in the QC-LDPC code. When the information bits that need to be transmitted are a header and the header length is fixed, zero matrix setting section 110 can set an optimum zero matrix according to the header length beforehand.

On the other hand, when the information bits that need to be transmitted are payload data, the data length varies depending on the magnitude of content information or the like. The present invention is also applicable to a case where the data length of information bits that need to be transmitted varies as in the case of payload data. Following Embodiment 2 will describe a case where the data length of information bits that need to be transmitted varies.

Embodiment 2

The present embodiment will describe a mode in which the present invention is applied to a case where the data length of information bits that need to be transmitted varies.

Figure 11:
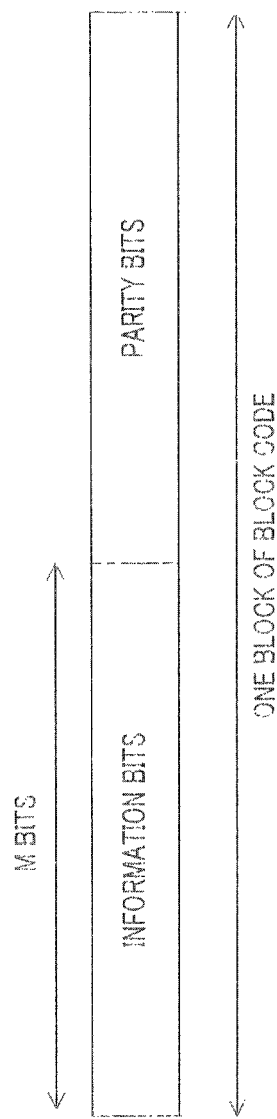
FIG. 11 is a diagram illustrating a configuration example of one block of QC-LDPC code.

FIG. 11 illustrates a configuration example of one block in the case where QC-LDPC code is used. The QC-LDPC code is a block code, and as shown in FIG. 11, one block is made up of information bits and parity bits. Here, suppose the number of bits of the information bits in one block is M bits.

Figure 12:
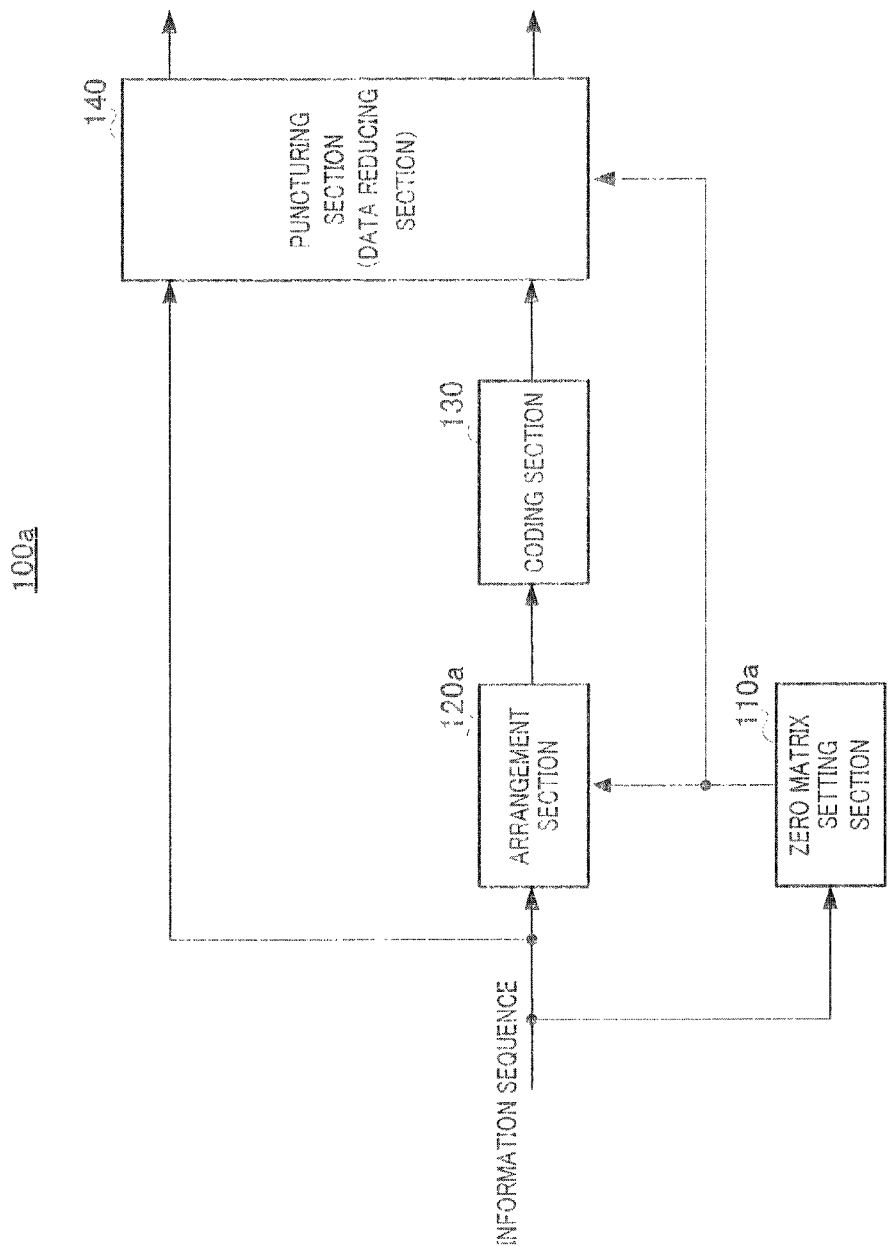
FIG. 12 is a diagram illustrating a configuration example of an encoder according to Embodiment 2 of the present invention.

FIG. 12 illustrates a configuration example of an encoder according to the present embodiment. In the encoder according to the present embodiment in FIG. 12, the same components as those in FIG. 6 will be assigned the same reference numerals as those in FIG. 6 and descriptions thereof will be omitted. Encoder 100a in FIG. 12 includes zero matrix setting section 110a and arrangement section 120a instead of zero matrix setting section 110 and arrangement section 120 of encoder 100 in FIG. 6. Hereinafter, a case will be described where an N-bit information sequence is inputted to encoder 100a.

Zero matrix setting section 110a sets a zero matrix according to data length N of information bits (input bits) inputted as an information sequence. To be more specific, zero matrix setting section 110a counts data length N of the information bits (input bits) first. Zero matrix setting section 110a divides data length N by information bit length M per block of time QC-LDPC code and calculates quotient $\beta$ and remainder $\alpha$.

As a result of the division, if N=kM (k is an integer) holds, arrangement section 120a needs to arrange information bits inputted (input bits), as shown in FIG. 13, in an area of information bits of all k blocks as an information sequence. That is, in k blocks, each information hit (input bit) needs to be arranged in all columns of parity generator matrix g of the QC-LDPC code. Thus, when N=kM (k is a natural number) holds, zero matrix setting section 110a does not set any zero matrix but outputs a command signal to arrangement section 120a so as to arrange information bits (input bits) in all columns of parity generator matrix g.

Thus, when, as a result of the division, N≠kM=$\beta$M+$\alpha$ (k is an integer, $\alpha$ and $\beta$ are natural numbers) holds, arrangement section 120a needs to arrange information bits (input bits) in areas of information bits of $\beta$ blocks as shown in FIG. 13 and arrange a information bits (input bits) in an area of information bits of one block (special block). That is, arrangement section 120a needs to arrange information bits in all columns of parity generator matrix g of QC-LDPC code in β blocks and arrange information bits (input bits) in columns of zero matrixes in the special block as described in Embodiment 1.

Thus, when N≠kM=βM+α (k, α and β are natural numbers) holds, zero matrix setting section 110a sets zero matrixes according to data length a of information bits (input bits) that need to be transmitted in the special block. In this case, zero matrix setting section 110a switches between zero matrixes to be set according to the value of data length α. To be more specific, zero matrix setting section 110a switches between zero matrixes to be set according to the comparison result between remainder α and a predetermined threshold. As described above, in encoder 100a, the maximum value of the number of bits that can be arranged as information bits that need to be transmitted varies depending on zero matrixes.

In FIG. 13, the special block is arranged temporally at the last, but the arrangement position is not limited to this.

Hereinafter, an operation of setting zero matrixes according to the data length will be described using FIG. 14. FIG. 14 is an example of the case where zero matrix setting section 110a has two thresholds a1 and a2 and switches between zero matrixes according to the comparison result between data length α and the two thresholds. Since the number of parity bits that can be punctured (reduced) as bits not to transmit is the same as the number of rows of a zero matrix, switching between zero matrixes namely means switching between methods of reducing parity bits to transmit.

When $0<\alpha \leq a1$, parity bits to transmit are reduced by zero matrix #1 (reduction method #1). When, for example, $0<\alpha \leq a1$ (=12), zero matrix setting section 110a sets zero matrixes 221 and 222 ..., as zero matrixes.

When α=10, arrangement section 120a adds two "0" bits to 10-bit information of to obtain 12-bit information. Arrangement section 120a then assigns 12 bits to x36 to x47 and assigns 0's to x1 to x35 and x48 and onward. As a result, parity bits p1 to p7, p28 to p34, ... of the parity bits obtained from coding section 130 are always 0's regardless of the values of x36 to x47.

Therefore, when puncturing section (data reducing section) 140 punctures parity bits p1 to p7, p28 to p34 that are always 0's as bits not to transmit, and can thereby improve transmission efficiency without deteriorating decoding performances.

Furthermore, since known bits "0" are assigned to bits (x1 to x35, x48 and onward) other than x36 to x47, puncturing section (data reducing section) 140 also punctures (sets as bits not to transmit) bits other than x36 to x47. In addition, in the case of α=10, puncturing section (data reducing section) 140 punctures (sets as bits not to transmit) the two "0" bits assigned to x36 to x47 as bits not to transmit. This makes it possible to further improve transmission efficiency.

When, for example, arrangement section 120a assigns 0's to x46 and x47, puncturing section (data reducing section) 140 punctures x46 and x47, and the transmission sequence thereby becomes x36 to x45 with parity p8 to p27, p35 to p54, ..., and it is thereby possible to further improve transmission efficiency.

In the case of $a1<\alpha \leq a2$, zero matrix #2 (reduction method #2) reduces parity bits to transmit. For example, in the case of a1=12 and a2=19, zero matrix setting section 110a sets zero matrixes 231, 232, ... as zero matrixes in addition to zero matrixes 221 and 222, ....

In the case of α=15, arrangement section 120a adds four "0" bits to 15-bit information to obtain 19-bit information. Arrangement section 120a then assigns these 19 bits to x36 to x47 and x71 to x77 and assigns 0's to x1 to x35, x48 to x71, x78 and onward. As a result, parity bits p1 to p7, p28 to p34, ... of the parity bits obtained by coding section 130 are always 0's regardless of the values of x36 to x47.

Therefore, puncturing section (data reducing section) 140 punctures parity bits p1 to p7, p28 to p34 which are always 0's as bits not to transmit, and can thereby improve transmission efficiency without deteriorating decoding performances.

Furthermore, since known bits "0" are assigned to bits (x1 to x35, x48 to x71, x78 and onward) other than x36 to x47, x71 to x77, puncturing section (data reducing section) 140 sets bits other than x36 to x47, x71 to x77 as bits to be punctured (bits not to transmit). In addition, in the case of α=15, puncturing section (data reducing section) 140 punctures four "0" bits assigned to x36 to x47, x71 to x77 as bits not to transmit (sets them as bits not to transmit).

This allows the transmitting apparatus to further improve transmission efficiency. When, for example, arrangement section 120a assigns 0's to x74 to x77, puncturing section (data reducing section) 140 punctures x74 to x77, the transmission sequence thereby becomes x36 to x45, x71 to x73, p8 to p27, p35 to p54, ... and the transmitting apparatus can thereby further improve transmission efficiency.

In the example shown in FIG. 14, in the case of $a2<\alpha \leq M-1$, no zero matrix is set and parity bits are not reduced. That is, when remainder a resulting from dividing data length N of information bits (input bits) by block length M is equal to or above a predetermined threshold, α information bits (input bits) and (M−α) 0's as imaginary bits are arranged in columns of parity generator matrix g.

By this means, zero matrix setting section 110a sets zero matrixes according to data length α of information bits (input bits) that need to be transmitted in a special block. Zero matrix setting section 110a then reports information about the positions of zero matrixes in parity generator matrix g to arrangement section 120a and puncturing section (data reducing section) 140.

In the case of $a2<\alpha \leq M-1$, zero matrix setting section 110a sets no zero matrixes and reduces no parity bits. Thus, in the case of $a2<\alpha \leq M-1$, zero matrix setting section 110a reports puncturing section (data reducing section) 140 not to puncture parity bits.

As described above, in the present embodiment, zero matrix setting section 110a sets zero matrixes which are partial matrixes of parity generator matrix g and in which all elements are 0's according to data length N of information bits (input bits). By so doing, the transmitting apparatus can reduce the number of parity bits that need to be transmitted and reliably transmit information bits (input bits).

FIG. 14 illustrates an example where the method of reducing parity bits is categorized under one of three cases according to the value of remainder α but the number of cases is not limited to 3. For example, zero matrix setting section 110a may be provided with further thresholds so that the method is categorized into Z cases.

Furthermore, when implementing the present embodiment, the receiving apparatus provided with the decoder need to know the value of remainder α. A simple method of realizing this may be to cause the transmitting apparatus provided with the encoder to report information about the number of bits of data to transmit to the receiving apparatus first. In this case, the receiving apparatus needs to be provided with a calculation section to calculate α.

Embodiment 3

The present embodiment will describe a puncturing method of a QC-LDPC code.

Figure 15:
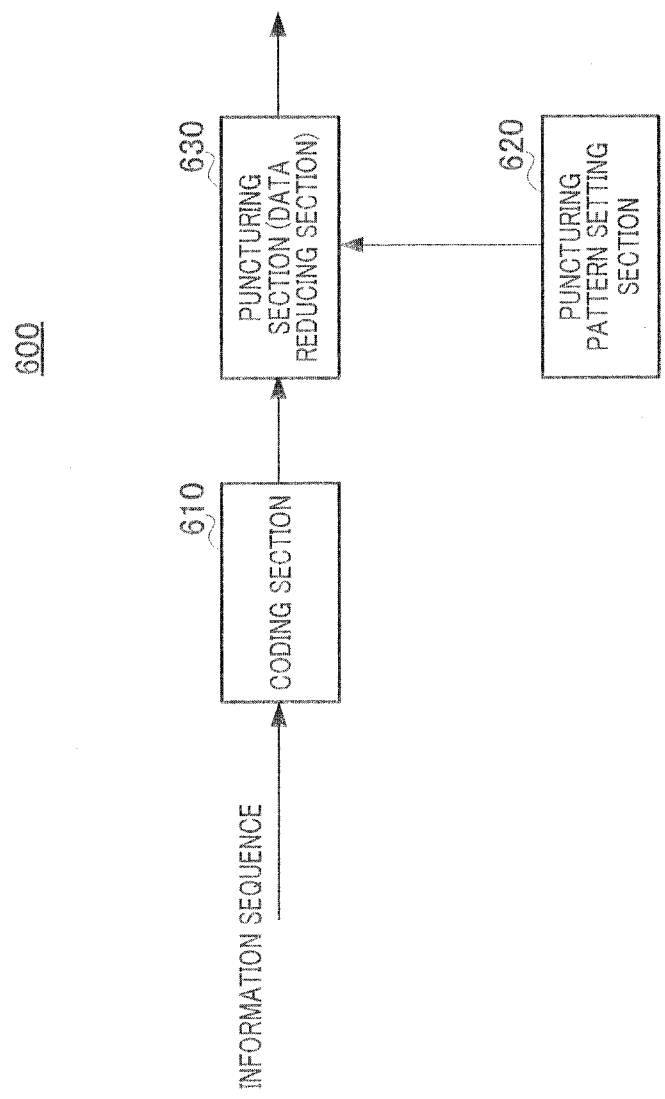
FIG. 15 is a diagram illustrating a configuration example of an encoder according to Embodiment 3 of the present invention.

FIG. 15 illustrates a configuration example of an encoder according to the present embodiment. Encoder 600 in FIG. 15 is provided with coding section 610, puncturing pattern setting section 620 and puncturing section (data reducing section) 630.

Coding section 610 performs coding on an information sequence using parity generator matrix g of QC-LDPC code.

Puncturing pattern setting section 620 searches and sets a puncturing pattern taking advantage of the fact that parity check matrix H of QC-LDPC code is configured using a subblock matrix as a basic unit. The method of searching a puncturing pattern will be described later. Puncturing pattern setting section 620 outputs the information of the set puncturing pattern to puncturing section (data reducing section) 630.

Puncturing section (data reducing section) 630 punctures (sets as bits not to transmit) information bits or parity bits as bits not to transmit of the coded sequence outputted from coding section 610 according to the puncturing pattern reported from puncturing pattern setting section 620.

Next, the method of searching a puncturing pattern set by puncturing pattern setting section 620 will be described. A puncturing pattern is searched taking advantage of the fact that parity check matrix H of QC-LDPC code is configured using a subblock matrix as a basic unit.

When searching a puncturing pattern, puncturing pattern setting section 620 determines the cycle of the puncturing pattern first. When, for example, K bits from the 20th bit are selected as bits not to transmit (puncture bits), the cycle of the puncturing pattern, is 20 bits. In this case, suppose the number of bits not to transmit (puncture bits) included in 20 bits of the cycle of the puncturing pattern is K and always constant.

The present invention assumes that the cycle of the puncturing pattern is an integer multiple of the number of columns L or a divisor of the number of columns L of subblock matrix $I(p_{j,1})$ (cyclic permutation matrix of q rows and r columns in which $(r=(q+p_{j,i}) \mod p (0 \leq q \leq p-1)$ is 1 and "0" otherwise) which is a basic unit of the parity check matrix of QC-LDPC code (see equation 1).

For example, since the subblock matrix in the parity check matrix of QC-LDPC code shown in FIG. 3 is a matrix of 27 rows and 27 columns (L=27), it is proposed to set an integer multiple of 27 or a divisor of 27 as the cycle of the puncturing pattern and set K bits not to transmit (puncture bits).

Generally, the larger the block length, the better reception performances are obtained with a block code. However, when the block length is large, it is difficult to search a best puncturing pattern in block length units. Thus, when the block length is large, a scheme of randomly selecting a puncture bit may be adopted. However, in this case, there is a possibility that receiving quality may significantly deteriorate during puncturing.

By contrast, focusing on the regularity with the subblock matrix making up parity check matrix H of QC-LDPC code, when puncturing pattern setting section 620 searches puncturing patterns every integer multiple of the number of columns or every divisor of the number of columns of the subblock matrixes, it is possible to reliably find out a puncturing pattern in which performances become better in a relatively short time.

As a more specific method of searching a puncturing pattern, for example, a predetermined SNR (Signal-to-Noise power Ratio) may be set, an error rate may be calculated for every puncturing pattern and a puncturing pattern in which the error rate decreases may be determined.

The transmitting apparatus punctures a coded sequence using the puncturing pattern searched in this way, and can thereby improve transmission efficiency while maintaining good receiving quality. That is, what is important in the configuration in FIG. 15 is that puncturing section (data reducing section) 630 punctures a coded sequence using an integer multiple of the number of columns or a divisor of the number of columns of subblock matrixes making up parity check matrix H of QC-LDPC code as a unit.

A case will be described as an example where puncturing section (data reducing section) 630 assumes the cycle of the puncturing pattern as the number of columns L of the subblock matrix and sets the number of bits not to transmit (puncture bits) to constant number K for every number of columns L of the subblock matrix. In this case, puncturing section (data reducing section) 630 switches between puncturing patterns every integer multiple of the number of columns of a subblock matrix making up parity check matrix H of QC-LDPC code.

The method of switching between puncturing patterns will be described more specifically using FIG. 16A to FIG. 16C.

Figure 16A:
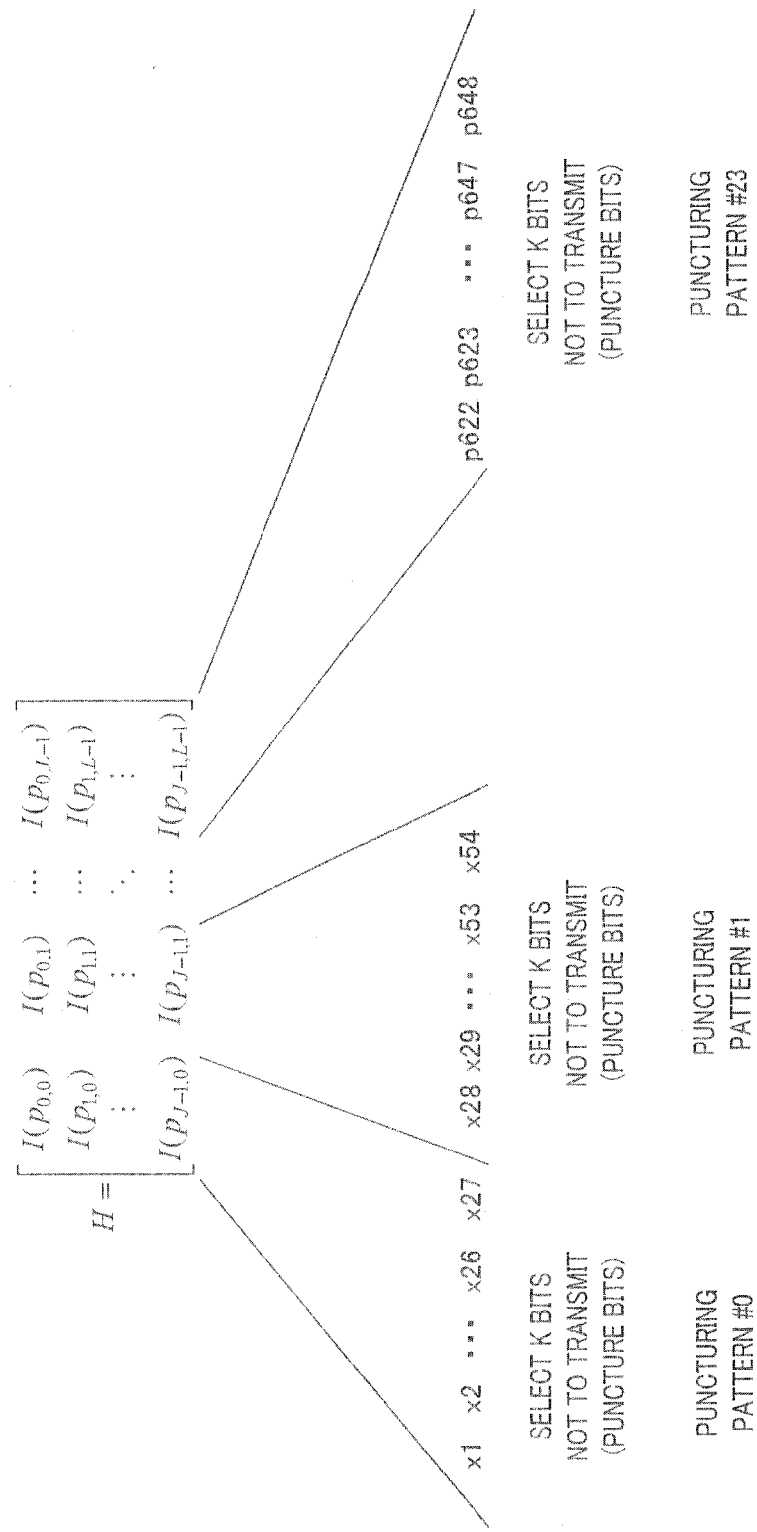
FIG. 16A is a diagram illustrating a method of switching between puncturing patterns.

FIG. 16A illustrates a situation in which a puncturing pattern is switched every number of columns (one time of the number of columns) of a subblock matrix for parity check matrix H in FIG. 3. Since parity check matrix H in FIG. 3 is made up of subblock matrixes of 27 columns, puncturing section (data reducing section) 630 selects K bits not to transmit (puncture bits) using puncturing pattern #0 for x1 to x27. Furthermore, puncturing section (data reducing section) 630 selects K bits not to transmit (puncture bits) using puncturing pattern #1 for x28 to x54. Furthermore, puncturing section (data reducing section) 630 selects K bits not to transmit (puncture bits) using puncturing pattern #23 for p622 to p648.

Figure 16B:
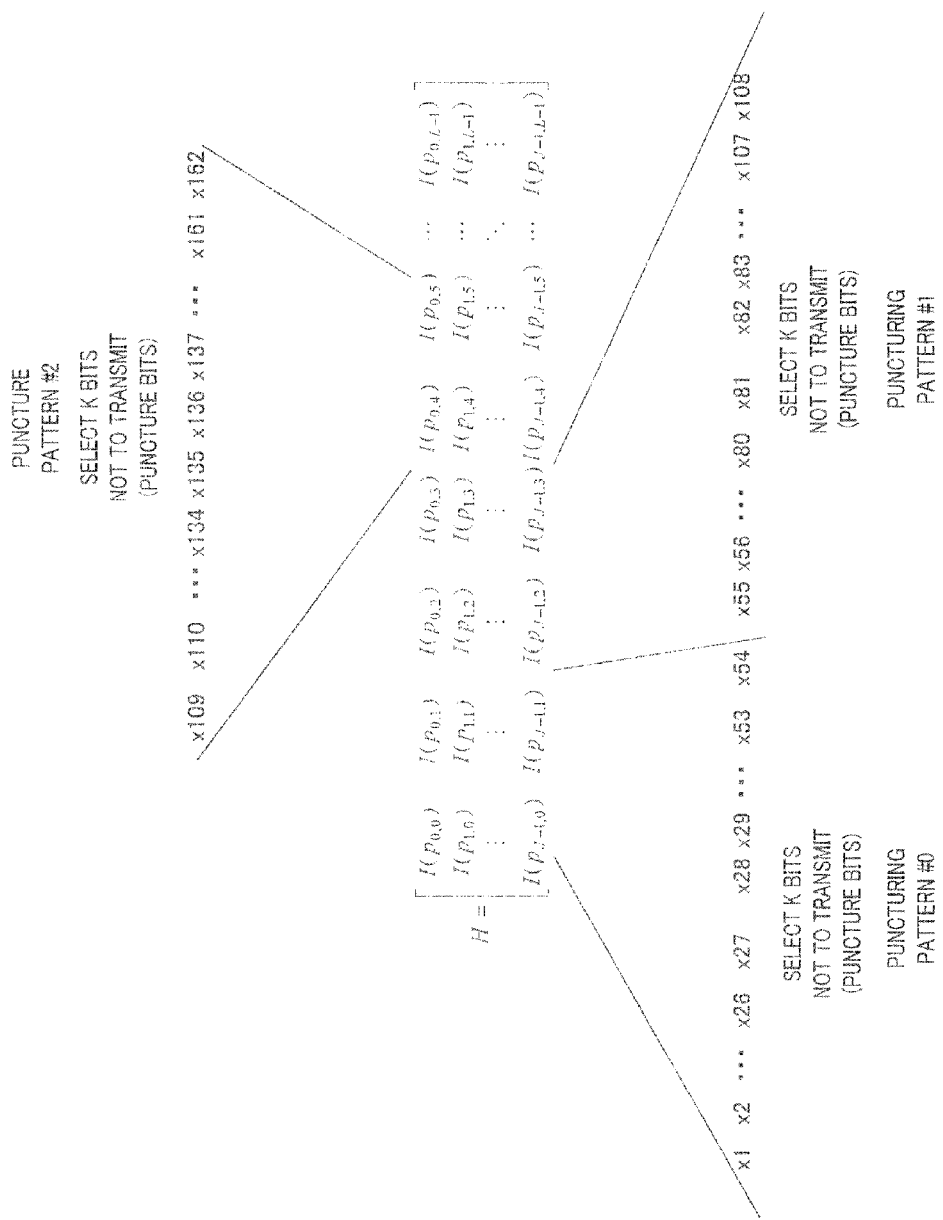
FIG. 16B is another diagram illustrating a method of switching between puncturing patterns.

FIG. 16B illustrates a situation in which a puncturing pattern is switched every two times the number of columns of subblock matrix for parity check matrix H in FIG. 3. Since parity check matrix H in FIG. 3 is made up of a subblock matrix of 27 columns, puncturing section (data reducing section) 630 selects K bits not to transmit (puncture bits) using puncturing pattern #0 for x1 to x27, x28 to x54.

Furthermore, puncturing section (data reducing section) 630 selects K bits not to transmit (puncture bits) using puncturing pattern #1 for x55 to x81, x82 to x108. Furthermore, puncturing section (data reducing section) 630 selects K bits not to transmit (puncture bits) using puncturing pattern #2 for x109 to x135, x136 to x162.

Figure 16C:
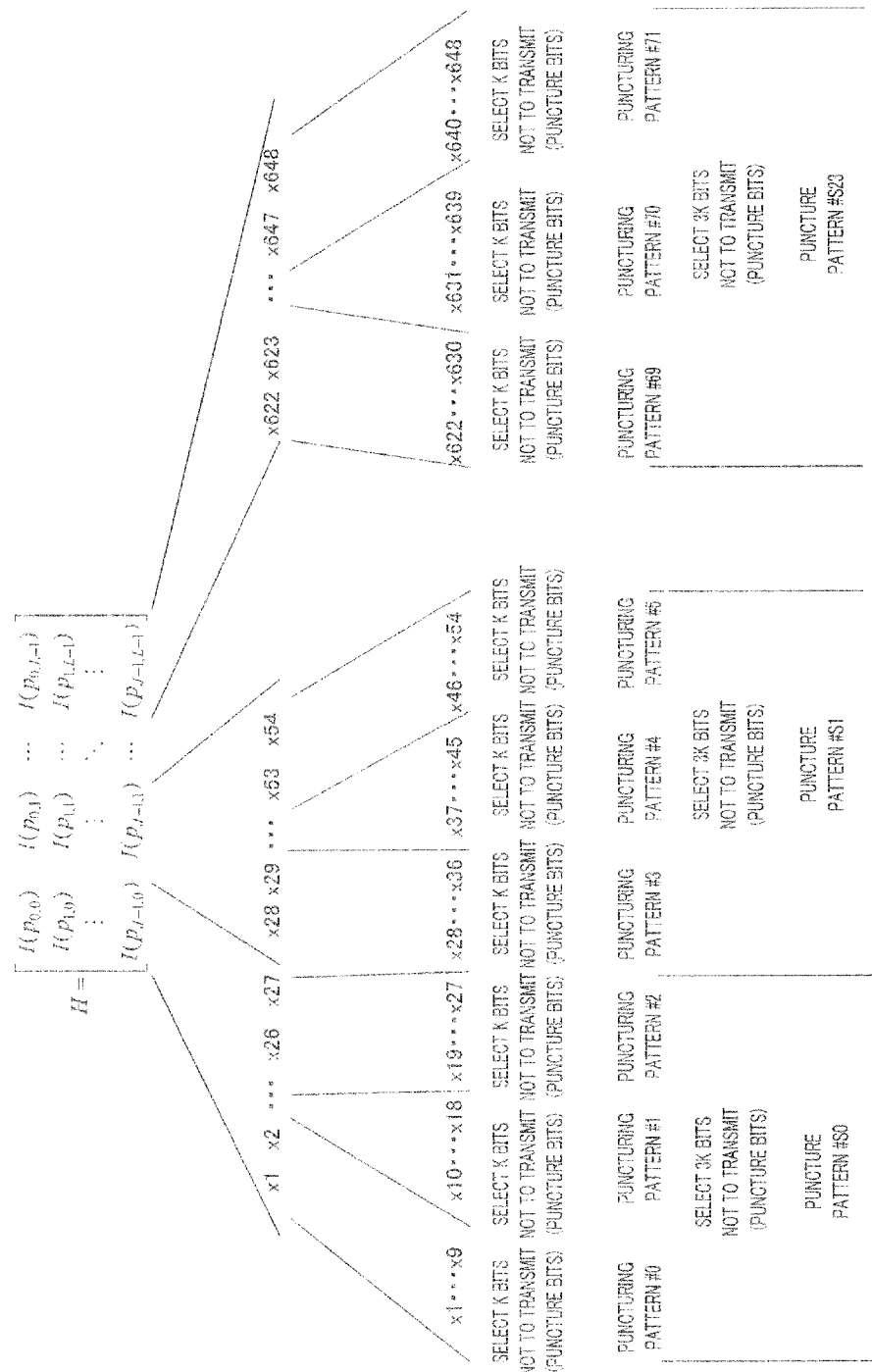
FIG. 16C is a further diagram illustrating a method of switching between puncturing patterns.

FIG. 16C illustrates a situation in which a puncturing pattern is switched for every 9 columns based on a base cycle of 9 columns, which is a divisor of the number of columns of the subblock matrix for parity check matrix H in FIG. 3. To be more specific, puncturing section (data reducing section) 630 selects K bits not to transmit (puncture bits) using puncturing pattern #0 for x1 to x9.

Puncturing section (data reducing section) 630 selects K bits not to transmit (puncture bits) using puncturing pattern #1 for x10 to x18. Puncturing section (data reducing section) 630 selects K bits not to transmit (puncture bits) using puncturing pattern #2 for x19 to x27.

Likewise, puncturing section (data reducing section) 630 selects K bits not to transmit (puncture bits) using puncturing pattern #3 for x28 to x36. Puncturing section (data reducing section) 630 selects K bits not to transmit (puncture bits) using puncturing pattern #4 for x37 to x45. Puncturing section (data reducing section) 630 selects K bits not to transmit (puncture bits) using puncturing pattern #5 for x46 to x54.

Likewise, puncturing section (data reducing section) 630 selects K bits not to transmit (puncture bits) using puncturing pattern #69 for x622 to x630. Puncturing section (data reducing section) 630 selects K bits not to transmit (puncture bits)

using puncturing pattern #70 for x631 to x639. Puncturing section (data reducing section) 630 selects K bits not to transmit (puncture bits) using puncturing pattern #71 for x640 to x648.

Puncturing section (data reducing section) 630 defines puncturing pattern #S0 made up of puncturing patterns #0 to #2 selects 3K bits not to transmit (puncture bits) using puncturing pattern #S0 for x1 to x27. Likewise, puncturing section (data reducing section) 630 may also define puncturing pattern #S1 made up of puncturing patterns #3 to #5 and select 3K bits not to transmit (puncture bits) using puncturing pattern #S1 for x28 to x54.

Likewise, puncturing section (data reducing section) 630 may also define puncturing pattern #S23 made up of puncturing patterns #69 to #71 and select 3K bits not to transmit (puncture bits) using puncturing pattern #S23 for x622 to x648.

That is, performing puncturing by using a divisor of the number of columns of the subblock matrix as the base cycle is equivalent to performing puncturing using the number of columns of the subblock matrix making up parity check matrix H of QC-LDPC code as a unit (cycle).

As described so far, in the present embodiment, puncturing pattern setting section 620 searches a puncturing pattern for every integer multiple of the number of columns or every divisor of the number of columns of subblock matrixes making up parity check matrix H of QC-LDPC code and puncturing section (data reducing section) 630 switches between puncturing patterns for every integer multiple of the number of columns or every divisor of the number of columns of subblock matrixes making up the parity check matrix of QC-LDPC code. This makes it possible to search a puncturing pattern whereby good receiving quality is obtained in a relatively short time and reliably, and improve transmission efficiency while maintaining good receiving quality.

A case has been described above where a puncturing pattern is switched every integer multiple of the number of columns or every divisor of the number of columns of subblock matrixes making up a parity check matrix of QC-LDPC code, but the puncturing pattern need not always be switched.

For example, in FIG. 16A, "puncturing pattern #0," "puncturing pattern #1," . . . , "puncturing pattern #23" may be identical puncturing patterns. Furthermore, in FIG. 16B, "puncturing pattern #0," "puncturing pattern #1," "puncturing pattern #2," . . . , may be identical puncturing patterns.

Furthermore, in FIG. 16C, "puncturing pattern #0," "puncturing pattern #1," . . . , "puncturing pattern #71" may be identical puncturing patterns. In short, the unit of puncturing patterns needs only to be an integer multiple of the number of columns or a divisor of the number of columns of subblock matrixes making up a parity check matrix of QC-LDPC code.

Embodiment 4

The present embodiment will describe an example of coding method when the coding method described in Embodiment 1 and Embodiment 2 is used for control information.

Hereinafter, a case will be described where 200-bit control information is coded using a QC-LDPC code of coding rate (R)=½, LDPC code information block length (bits)=168, LDPC codeword block length (bits)=336 as an example.

Figure 17:
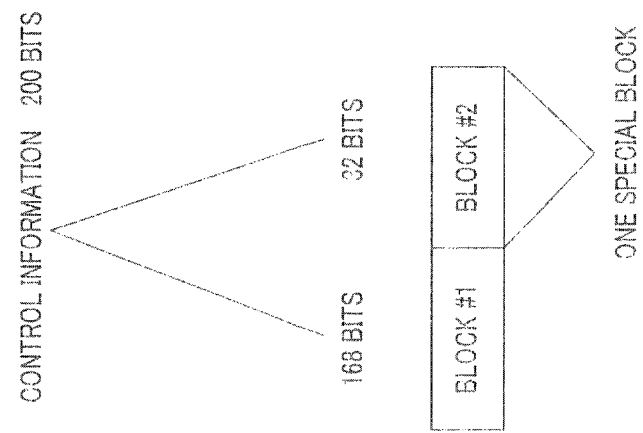
FIG. 17 is a diagram illustrating an example of arrangement of control information.

FIG. 17 illustrates a case where 200-bit control information is divided into 168 bits and 32 bits, 168 bits are arranged in block #1 and 32 bits are arranged in block #2. In FIG. 17, only 32 bits of control information are arranged in block #2 in contrast to the block length of 168 bits.

Hereinafter, a block such as block #2, bits of which need to be transmitted, is shorter than the block length is the special block described in Embodiment 2. Thus, as with Embodiment 2, in block #2, 0's are arranged and coded as information bits as imaginary bits. As a result, there is a variation in receiving quality between block #1 and block. #2 and receiving quality of 200-bit control information eventually depends on blocks having poor receiving quality.

Figure 18:
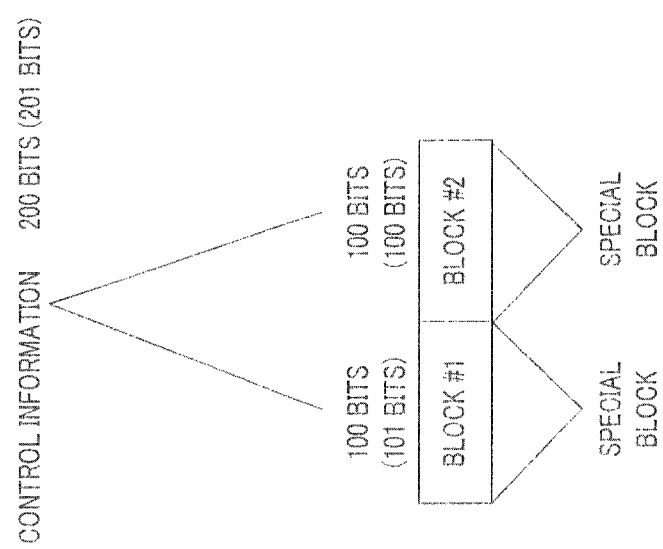
FIG. 18 is a diagram illustrating an example of arrangement of control information according to Embodiment 4 of the present invention.

Thus, as shown in FIG. 18, the present embodiment arranges 200-bit control information in two blocks #1 and #2 as uniformly as possible and performs the coding described in Embodiment 1 on each block. To be more specific, when the control information has 200 bits, control information is arranged in both block #1 and block #2, 100 bits each.

This causes both block #1 and block #2 to become special blocks, and therefore 0's are arranged in both block #1 and block #2 as information bits as imaginary bits and coded using the coding method according to Embodiment 1. This makes receiving quality uniform in block #1 and block #2 and allows signals to be transmitted correctly to the communicating party.

When control information has 201 bits, 101 bits of control information are arranged in block #1 and 100 bits of control information are arranged in block #2. In this case, the difference between the number of bits of control information in block #1 and the number of bits of control information in block #2 is one bit at most. Thus, the transmitting apparatus arranges information that needs to be transmitted in two blocks as uniformly as possible, and can thereby make receiving quality uniform between the blocks, and can thereby reliably transmit control information to the communicating party.

As described so far, the present embodiment arranges control information in a plurality of blocks as uniformly as possible. Thus, the transmitting apparatus applies the coding method described in Embodiment 1 to each block after the arrangement, and can thereby reliably transmit information necessary to establish communication such as control information to the communicating party.

The method of generating a special block according to the present embodiment is the same as the method of generating a special block described in Embodiment 2. That is, the transmitting apparatus sets (sets as puncture bits) both information bits and parity bits that need not be transmitted as bits not to transmit.

Embodiment 5

The present embodiment will show an example of QC-LDPC code and describe an optimum puncturing pattern for the QC-LDPC code.

Parity check matrix H of QC-LDPC code is defined as shown in equation 4.

$$H = \begin{bmatrix} P_{0,0} & P_{0,1} & P_{0,2} & \cdots & P_{0,n_b-2} & P_{0,n_b-1} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & \ddots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix}$$

$$= P^{H_b}$$

(Equation 4)

Parity check matrix H in equation 4 is a matrix of in rows and n columns. Here, n denotes a code length and m denotes the number of parity bits. Therefore, the number of systematic bits k is k=n−m. Furthermore, $P_{i,j}$ in equation 4 is a cyclic permutation matrix of z rows and z columns or a zero matrix of z rows and z columns.

Here, parity check matrix H in equation 4 is expanded with matrix $H_b$ of $n_b$ rows and $m_b$ columns. Here, the relationships $m=z \times m_b$ and $n=z \times n_b$ hold. Furthermore, suppose each element of matrix $H_b$ is "1" when each element of $P_{i,j}$ is "1" and "0" when each element of $P_{i,j}$ is "0."

Here, as a cyclic permutation matrix, $P_{i,j}$ is a unit matrix of z rows and z columns or a set of matrixes cyclically shifting a unit matrix of z rows and z columns. Since the cyclic permutation matrix is a unit matrix or a set of matrixes cyclically shifting a unit matrix, when matrix $H_b$ is divided into matrix $H_{bm}$ having the same magnitude as matrix $H_b$, matrix $H_{bm}$ is represented by zero matrixes or matrixes cyclically shifting a unit matrix.

Hereinafter, a zero matrix in matrix $H_{bm}$ will be represented as "−1." Furthermore, suppose the unit matrix is represented as "0." Furthermore, the cyclic permutation matrix of the unit matrix is represented as "p(i,j)" using an amount of cyclic shift thereof p(i,j) (>0). Matrix $H_b$ can be represented as a set of such compactly represented matrixes $H_{bm}$.

Here, as shown in equation 5, matrix $H_b$ can be divided into two submatrixes $H_{b1}$ and $H_{b2}$. Submatrix $H_{b1}$ is a partial matrix related to information bits and submatrix $H_{b2}$ is a partial matrix related to parity bits.

$$H_b = [(H_{b1})_{mb \times kb} | (H_{b2})_{mb \times mb}] = 0 \quad \text{(Equation 5)}$$

As shown in equation 6, submatrix $H_{b2}$ is further divided into vector $h_b$ and submatrix $H'_{b2}$.

$$H_{b2} = [h_b | H'_{b2}] = \begin{bmatrix} h_b(0) & |1 & & & & \\ h_b(1) & |1 & 1 & & 0 & \\ \ldots & |\ & 1 & \ddots & & \\ \ldots & |\ & & \ddots & 1 & \\ \ldots & |\ & 0 & & 1 & 1 \\ h_b(m_b-1) & |\ & & & & 1 \end{bmatrix} \quad \text{(Equation 6)}$$

In equation 6, submatrix $H'_{b2}$ is a matrix in which portions of the i-th row and j-th column (i=j and i=j+1) are "1" and the other portions are "0." In submatrix $H'_{b2}$, portions represented as "1" indicate that the amount of shift of unit matrixes is 0. That is, submatrix $H'_{b2}$ is replaced by unit matrixes of z rows and z columns when expanded to matrix $H_b$.

Furthermore, suppose the same amount of cyclic shift is assigned to the top ($h_b(0)$) and bottom ($h_b(m_b-1)$) of vector $h_b$.

Hereinafter, matrix $H_b$ defined by equation 7 will be considered. Parity check matrix H defined by equation 7 can correspond to a maximum code length at each coding rate.

$$p(f, i, j) = \begin{cases} p(i, j), & p(i, j) \leq 0 \\ \left\lfloor p(i, j) \cdot \frac{z_f}{96} \right\rfloor, & p(i, j) > 0 \end{cases} \quad \text{(Equation 7)}$$

where $$\left\lfloor p(i, j) \cdot \frac{z_f}{96} \right\rfloor$$

represents the integer portion of $$p(i, j) \cdot \frac{z_f}{96}.$$

In equation 7, p(f,i,j) denotes the amount of cyclic shift of the unit matrix, f denotes an index of code length corresponding to each coding rate. Furthermore, $z_f$ is called "expansion factor" and has the relationship of $z_f$=k/n.

Equation 8 expresses matrix $H_b$ of coding rate ½(=k/n) based on equation 7.

$$\begin{matrix}
-1 & 94 & 73 & -1 & -1 & -1 & -1 & -1 & 55 & 83 & -1 & -1 & 7 & 0 & -1 & -1 & -1 & -1 & -1 & -1 & -1 & -1 & -1 & -1 \\
-1 & 27 & -1 & -1 & -1 & 22 & 79 & 9 & -1 & -1 & -1 & 12 & -1 & 0 & 0 & -1 & -1 & -1 & -1 & -1 & -1 & -1 & -1 & -1 \\
-1 & -1 & -1 & 24 & 22 & 81 & -1 & 33 & -1 & -1 & -1 & 0 & -1 & -1 & 0 & 0 & -1 & -1 & -1 & -1 & -1 & -1 & -1 & -1 \\
61 & -1 & 47 & -1 & -1 & -1 & -1 & -1 & 65 & 25 & -1 & -1 & -1 & -1 & -1 & 0 & 0 & -1 & -1 & -1 & -1 & -1 & -1 & -1 \\
-1 & -1 & 39 & -1 & -1 & -1 & 84 & -1 & -1 & 41 & 72 & -1 & -1 & -1 & -1 & -1 & 0 & 0 & -1 & -1 & -1 & -1 & -1 & -1 \\
-1 & -1 & -1 & -1 & 46 & 40 & -1 & 82 & -1 & -1 & -1 & 79 & 0 & -1 & -1 & -1 & -1 & 0 & 0 & -1 & -1 & -1 & -1 & -1 \\
-1 & -1 & 95 & 53 & -1 & -1 & -1 & -1 & -1 & 14 & 18 & -1 & -1 & -1 & -1 & -1 & -1 & -1 & 0 & 0 & -1 & -1 & -1 & -1 \\
-1 & 11 & 73 & -1 & -1 & -1 & 2 & -1 & -1 & 47 & -1 & -1 & -1 & -1 & -1 & -1 & -1 & -1 & -1 & 0 & 0 & -1 & -1 & -1 \\
12 & -1 & -1 & -1 & 83 & 24 & -1 & 43 & -1 & -1 & -1 & 51 & -1 & -1 & -1 & -1 & -1 & -1 & -1 & -1 & 0 & 0 & -1 & -1 \\
-1 & -1 & -1 & -1 & -1 & 94 & -1 & 59 & -1 & -1 & 70 & 72 & -1 & -1 & -1 & -1 & -1 & -1 & -1 & -1 & -1 & 0 & 0 & -1 \\
-1 & -1 & 7 & 65 & -1 & -1 & -1 & -1 & 39 & 49 & -1 & -1 & -1 & -1 & -1 & -1 & -1 & -1 & -1 & -1 & -1 & -1 & 0 & 0 \\
43 & -1 & -1 & -1 & -1 & 66 & -1 & 41 & -1 & -1 & -1 & 26 & 7 & -1 & -1 & -1 & -1 & -1 & -1 & -1 & -1 & -1 & -1 & 0
\end{matrix} \quad \text{(Equation 8)}$$

In equation 8, "0" represents a unit matrix. On the other hand, "−1" represents a zero matrix. Furthermore, "94" on the first row and the second column represents a matrix cyclically shifting the unit matrix by 94. Likewise, "61" on the fourth row and the first column represents a matrix cyclically shifting the unit matrix by 61.

Furthermore, equation 9 expresses matrix $H_b$ of coding rate $\frac{5}{6}(=k/n)$ based on equation 7.

$$\begin{matrix} 1 & 25 & 55 & -1 & 47 & 4 & -1 & 91 & 84 & 8 & 86 & 52 & 82 & 33 & 5 & 0 & 36 & 20 & 4 & 77 & 80 & 0 & -1 & -1 \\ -1 & 6 & -1 & 36 & 40 & 47 & 12 & 79 & 47 & -1 & 41 & 21 & 12 & 71 & 14 & 72 & 0 & 44 & 49 & 0 & 0 & 0 & 0 & -1 \\ 51 & 81 & 83 & 4 & 67 & -1 & 21 & -1 & 31 & 24 & 91 & 61 & 81 & 9 & 86 & 78 & 60 & 88 & 67 & 15 & -1 & -1 & 0 & 0 \\ 50 & -1 & 50 & 15 & -1 & 36 & 13 & 10 & 11 & 20 & 53 & 90 & 29 & 92 & 57 & 30 & 84 & 92 & 11 & 66 & 80 & -1 & -1 & 0 \end{matrix}$$ (Equation 9)

An example of matrix $H_b$ of QC-LDPC code of coding rates ½ and ⅚ has been shown above. Hereinafter, a puncturing pattern applicable to matrix $H_b$ of QC-LDPC code will be described.

Figure 19A:
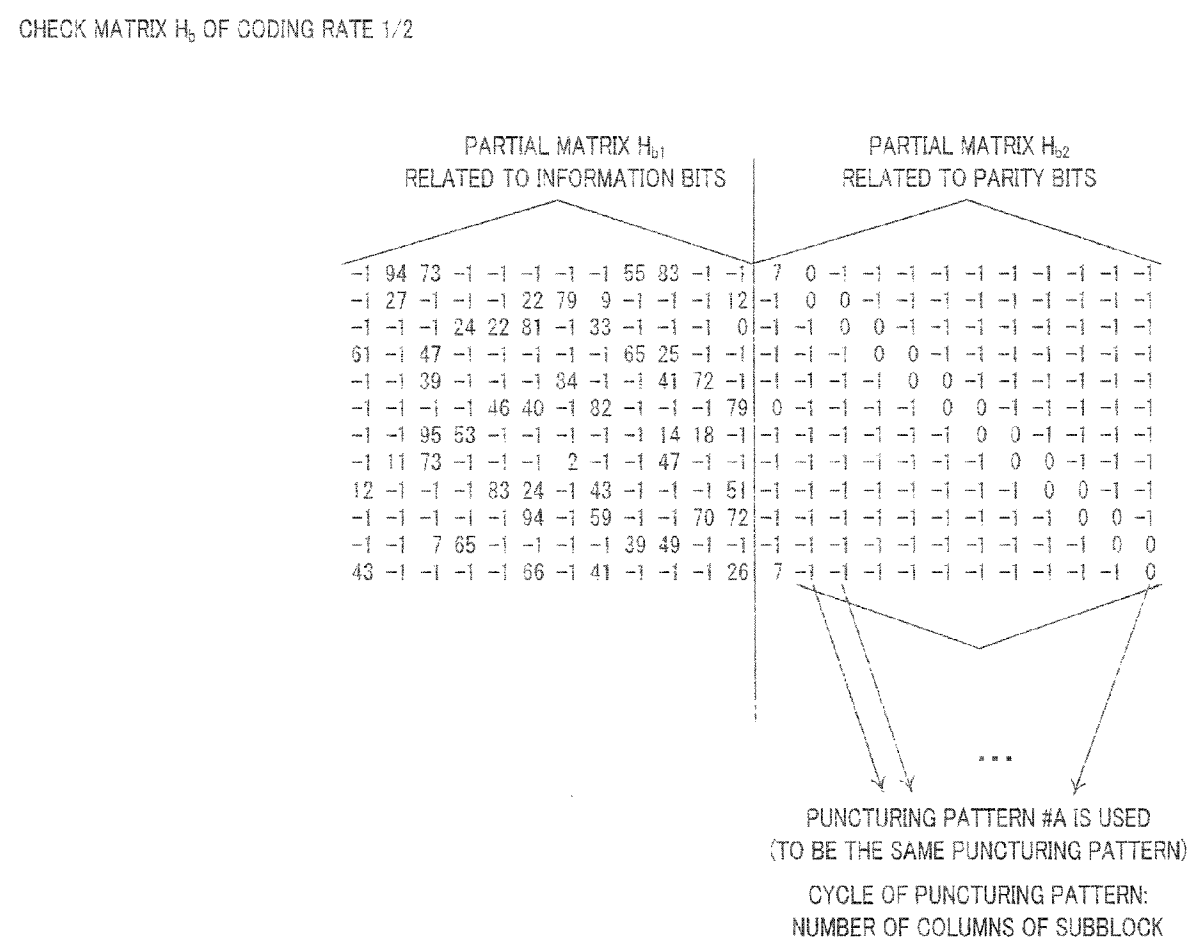

FIG. 19A illustrates matrix $H_b$ of QC-LDPC code of coding rate ½ shown in equation 8. As shown in FIG. 19A, in matrix $H_b$ of coding rate ½, since partial matrix $H_{b1}$ related to information bits has 12 rows, partial matrix $H_{b2}$ related to parity bits has 12 columns.

Partial matrix $H_{b2}$ related to parity bits in FIG. 19A is made up of "−1" and "0" except for the first row, first column and 12th row, first column and has a regular arrangement. As described above, "−1" represents a zero matrix and "0" represents a unit matrix. Furthermore, "7" on the first row, first column and 12th row, first column is a cyclic permutation matrix cyclically shifting the unit matrix by 7.

In this case, portions made up of unit matrixes and zero matrixes in columns of partial matrix $H_{b2}$ related to parity bits have a small effect on receiving quality even if the same puncturing pattern is used. Therefore, it is possible to obtain good reception characteristics from the portions made up of unit matrixes and zero matrixes even if the same puncturing pattern #A is used (see FIG. 19A). Suppose different puncturing patterns are set for portions not corresponding to the portions made up of unit matrixes and zero matrixes. However, some or all puncturing patterns may be the same puncturing pattern.

Figure 19B:
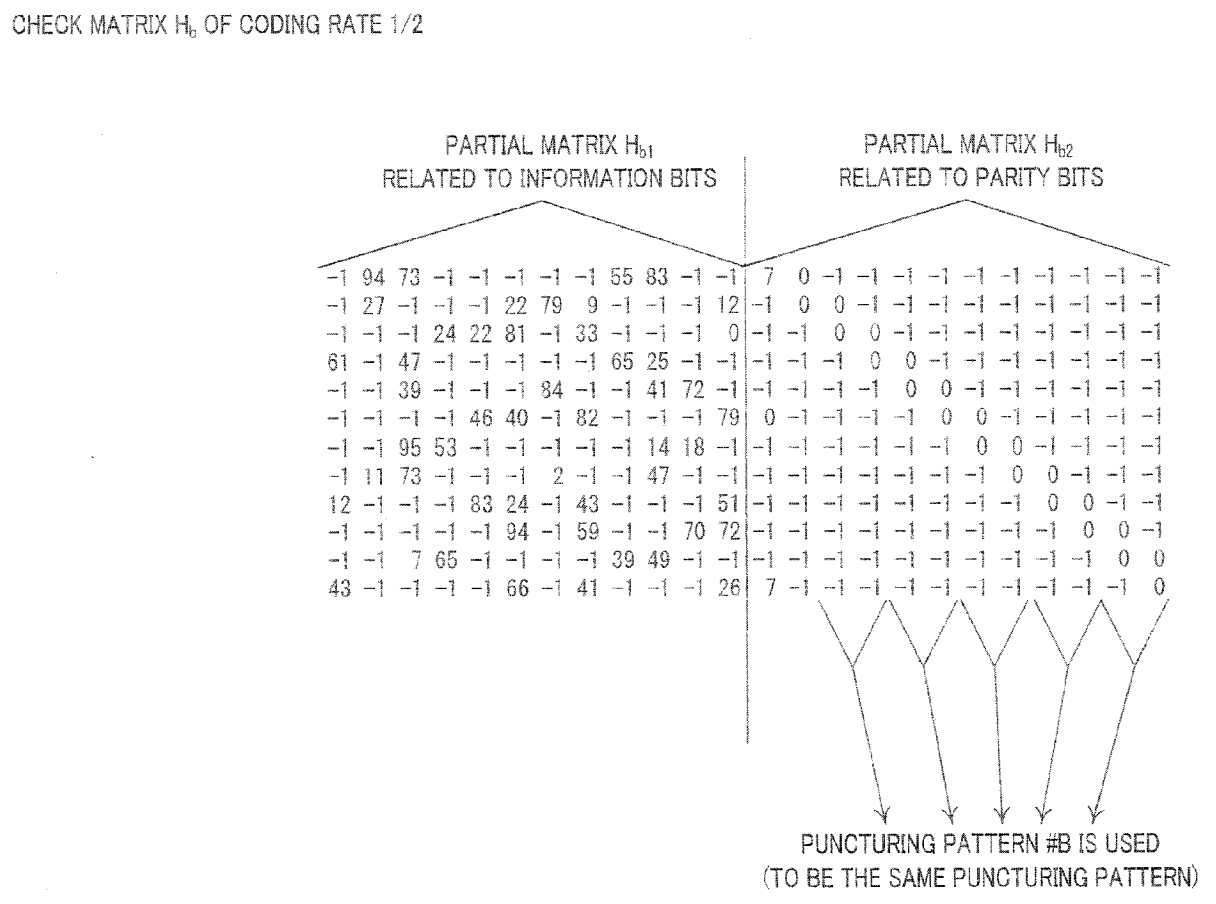
Figure 19C:
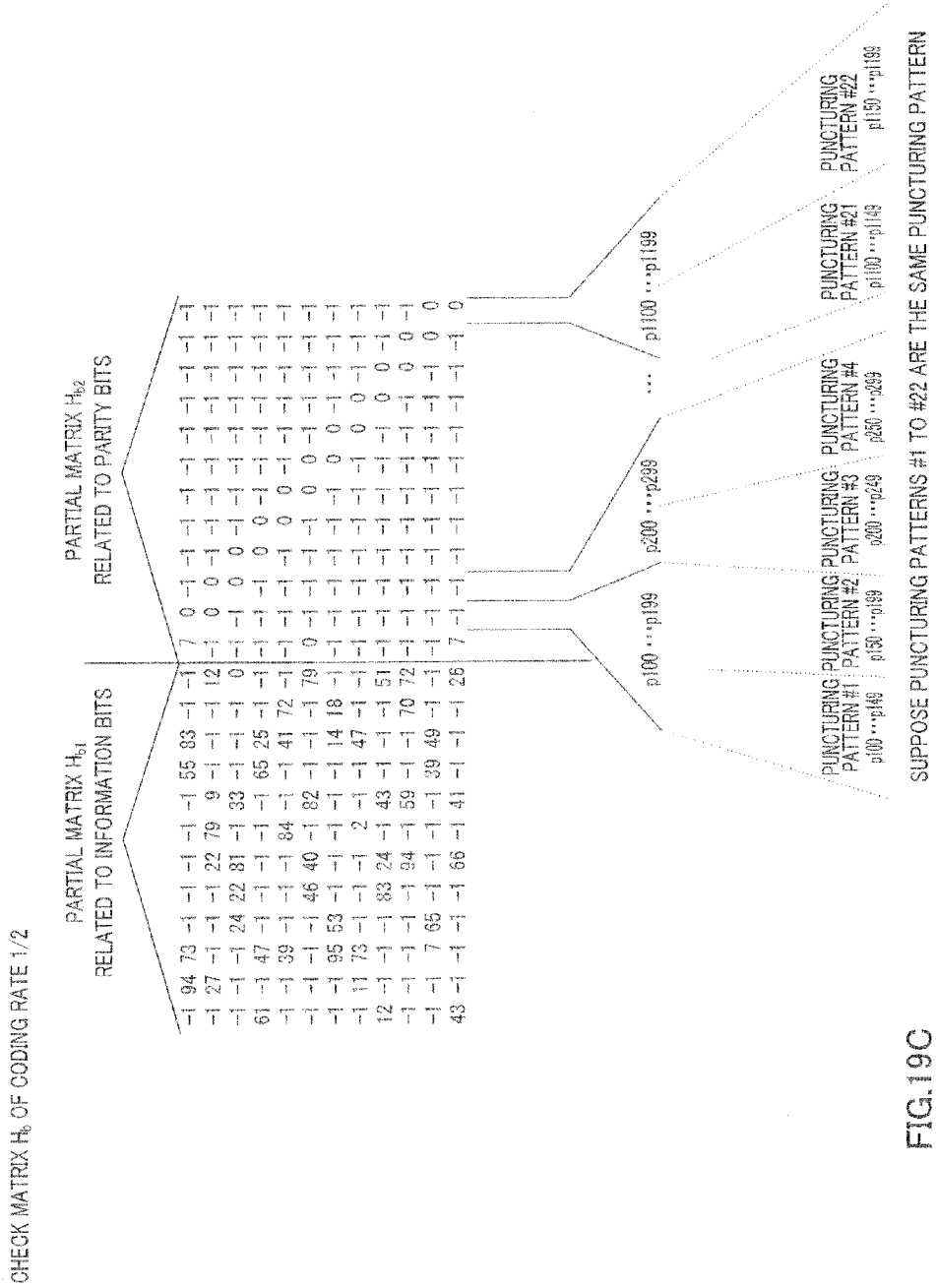
FIG. 19C is a diagram illustrating a further application example of puncturing pattern according to Embodiment 5.

Furthermore, the coded sequence may also be combined with the puncturing method described in Embodiment 3. That is, it is further effective if the coded sequence is punctured using an integer multiple of the number of columns or a divisor of the number of columns of subblock matrixes making up parity check matrix H of QC-LDPC code as a unit. FIG. 19B and FIG. 19C illustrate examples where partial matrix $H_{b2}$ related to parity bits is punctured using an integer multiple of the number of columns or a divisor of the number of columns of subblock matrixes making up parity check matrix H of QC-LDPC code as the unit.

FIG. 19B illustrates another application example of matrix $H_b$ of QC-LDPC code of coding rate ½ shown in equation 8 and puncturing patterns. FIG. 19B is an example of the case where the cycle of puncture pattern is set to an integer multiple (two times) of the number of columns of subblock matrixes making up the parity check matrix of QC-LDPC code. FIG. 19B is an example where the same puncturing pattern #B is used for portions made up of unit matrixes and zero matrixes.

Furthermore, FIG. 19C illustrates a further application example of matrix $H_b$ of QC-LDPC code of coding rate ½ shown in equation 8 and puncturing patterns. FIG. 19C is an example where a puncturing pattern is generated for every ½ of the number of columns of subblock matrixes making up the parity check matrix of QC-LDPC code. FIG. 19C is an example of the case where the same puncturing pattern is used for portions made up of unit matrixes and zero matrixes.

To be more specific, FIG. 19C illustrates a situation in which a puncturing pattern is switched for every 50 columns for parity check matrix H made up of subblock matrixes of 100 rows and 100 columns based on a base cycle of 50 columns, which is a divisor half the number of columns of the subblock matrix.

To be more specific, puncturing section (data reducing section) 630 selects bits not to transmit (puncture bits) for p100 to p149 using puncturing pattern #1. Puncturing section (data reducing section) 630 selects bits not to transmit (puncture bits) for p150 to p199 using puncturing pattern #2. Puncturing section (data reducing section) 630 selects bits not to transmit (puncture bits) for p200 to p249 using puncturing pattern #3.

Puncturing section (data reducing section) 630 selects bits not to transmit (puncture bits) for p250 to p299 using puncturing pattern #4. Puncturing section (data reducing section) 630 selects bits not to transmit (puncture bits) for p1100 to p1149 using puncturing pattern #21. Puncturing section (data reducing section) 630 selects bits not to transmit (puncture bits) for p1150 to p1199 using puncturing pattern #22.

FIG. 20A illustrates matrix $H_b$ of QC-LDPC code of coding rate ⅚ shown in equation 9. As shown in FIG. 20A, since parity check matrix $H_b$ of coding rate ⅚ has partial matrix $H_{b1}$ of 4 rows related to information bits, partial matrix $H_{b2}$ related to parity bits have 4 columns.

Partial matrix $H_{b2}$ related to parity bits in FIG. 20A is made up of "−1" and "0" except for the first row, first column and the fourth row, first column, and has a regular arrangement. Furthermore, "80" on the first row, first column and the fourth row, first column is a cyclic permutation matrix cyclically shifting the unit matrix by 80.

Thus, in the case of coding rate ⅚, even when the same puncturing pattern is used for portions made up of unit matrixes and zero matrixes in the columns of partial matrix $H_{b2}$ related to parity bits, influences on receiving quality are small. Thus, the receiving apparatus can obtain good reception characteristics for columns of the portions made up of unit matrixes and zero matrixes using also the same puncturing pattern #A (see FIG. 20A). The columns not related to the portions made up of unit matrixes and zero matrixes may be set to different puncturing patterns, but may also be set to partially identical puncturing patterns.

Figure 20B:
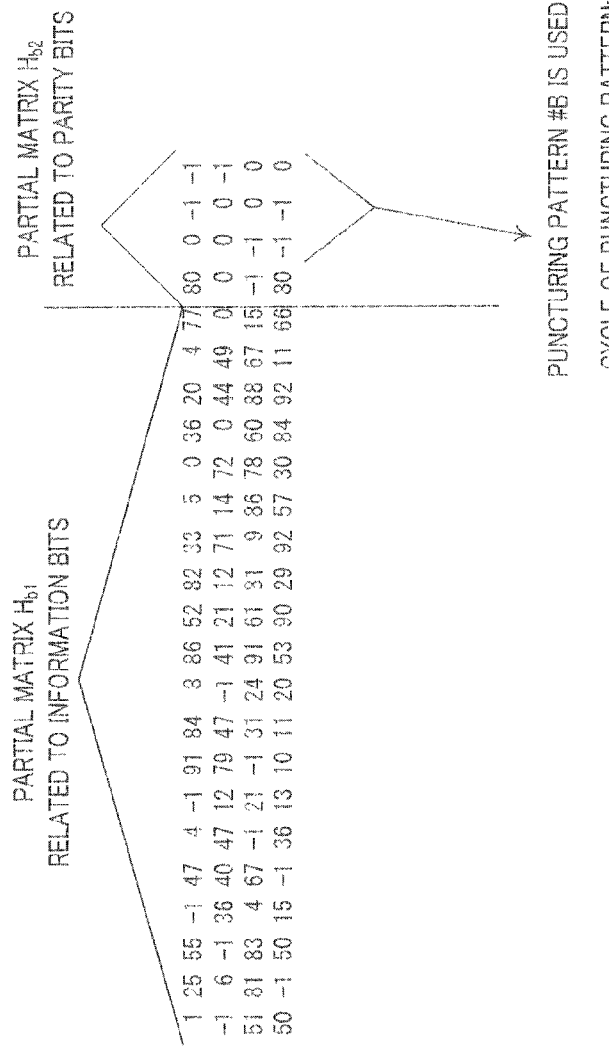
FIG. 20B is a diagram illustrating a still further application example of puncturing pattern according to Embodiment 5.

FIG. 20B illustrates another application example of matrix $H_b$ of QC-LDPC of coding rate ⅚ shown in equation 9 and puncturing patterns. FIG. 20B is an example where the cycle of puncturing pattern is set to an integer multiple (3 times) of the number of columns of subblock matrixes making up the parity check matrix of QC-LDPC code.

Figure 20C:
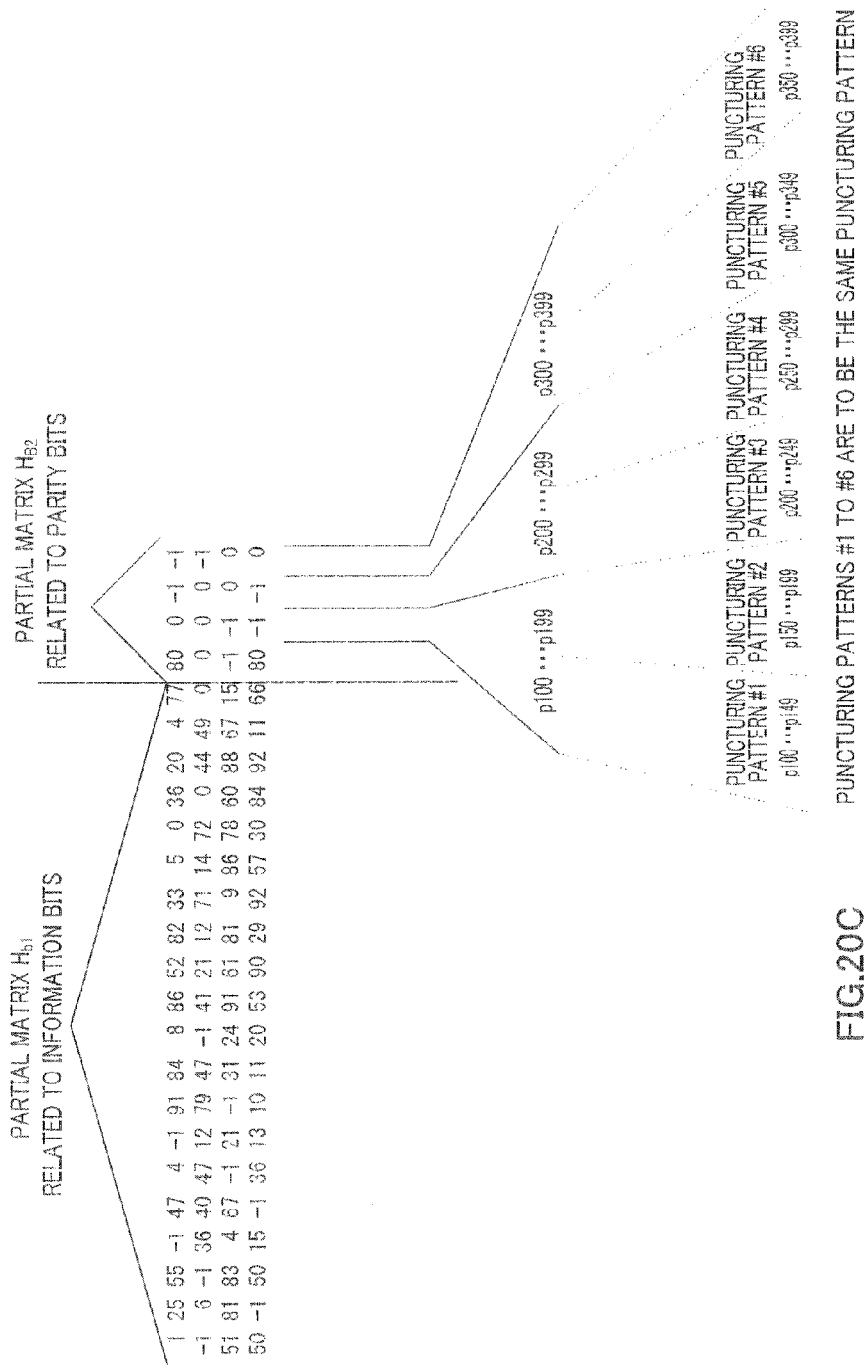
FIG. 20C is a diagram illustrating a still further application example of puncturing pattern according to Embodiment 5.

Furthermore, FIG. 20C illustrates a further application example of matrix $H_b$ of QC-LDPC code of coding rate ⅚ shown in equation 9 and puncturing patterns. FIG. 20C is an example of the case where a puncturing pattern is generated for every ½ of the number of columns of subblock matrixes making up the parity check matrix of QC-LDPC code. As with FIG. 20B, FIG. 20C is an example where the same puncturing pattern is used for portions made up of unit matrixes and zero matrixes.

To be more specific, FIG. 20C illustrates a situation in which a puncturing pattern is switched for every 50 columns for parity check matrix H made up of subblock matrixes of 100 rows and 100 columns based on a base cycle of 50 columns, which is a divisor half the number of columns of the subblock matrix.

To be more specific, puncturing section (data reducing section) 630 selects bits not to transmit (puncture bits) for p100 to p149 using puncturing pattern #1. Puncturing section (data reducing section) 630 selects bits not to transmit (puncture bits) for p150 to p199 using puncturing pattern #2. Puncturing section (data reducing section) 630 selects bits not to transmit (puncture bits) for p200 to p249 using puncturing pattern #3.

Puncturing section (data reducing section) 630 selects bits not to transmit (puncture hits) for p250 to p299 using puncturing pattern #4. Puncturing section (data reducing section) 630 selects bits not to transmit (puncture bits) for p300 to p349 using puncturing pattern #5. Puncturing section (data reducing section) 630 selects bits not to transmit (puncture bits) for p350 to p399 using puncturing pattern #6.

Thus, the portions made up of unit matrixes and zero matrixes of the columns in partial matrix $H_{b2}$ related to parity bits are set to the same puncturing pattern and the columns not related to the portions made up of unit matrixes and zero matrixes are set to different puncturing patterns.

A puncturing pattern may also be switched for the columns not related to the portions made up of unit matrixes and zero matrixes for every integer multiple of the number of columns or every divisor of the number of columns of subblock matrixes making up the parity check matrix of QC-LDPC code as described, for example, in Embodiment 3.

Furthermore, the same puncturing pattern whose pattern length corresponds to every integer multiple of the number of columns or every divisor of the number of columns of subblock matrixes making up the parity check matrix of QC-LDPC code may be applied to the columns not related to the portions made up of unit matrixes and zero matrixes.

Embodiment 6

An example will be described where the QC-LDPC code described in Embodiment 5 is used, puncturing is performed using an integer multiple of the number of columns or a divisor of the number of columns of subblock matrixes making up the parity check matrix of QC-LDPC code described in Embodiment 4 as a unit and the same puncturing pattern is used for all.

Embodiment 6 will describe a puncturing pattern for realizing a coding rate of approximately 0.65 through puncturing from a QC-LDPC code having the parity check matrix of equation 8 of coding rate ½. However, suppose the size of subblock matrixes making up the parity check matrix of QC-LDPC code is 350 rows and 350 columns. Therefore, the information block length (bits) of QC-LDPC code is 4200 and the LDPC codeword block length (bits) is 8400.

In this case, a codeword of the LDPC code is expressed as follows:

$$v=[x0,x1,\ldots,x4198,x4199,p0,p1,\ldots,p4198,p4199]$$

$$=[s0,s1,s2,\ldots,s8397,s8398,s8399]$$

$$=[v0,v1,v2,\ldots,v167]$$

where v denotes a codeword, x denotes information and p denotes parity.

v0, v1, . . . , vi . . . , v167 can be expressed as follows:

$$v0=[s0,s1,\ldots,s48,s49],$$

$$v1=[s50,s51,\ldots,s98,s99],\ldots,$$

$$vi=[s50*i,s50*i+1,\ldots,s50*i+48,s50*i+49],\ldots,$$

$$v167=[s8350,s8351,\ldots,s8398,s8399]$$

As a result of searching a puncturing pattern, the present inventors have confirmed that good receiving quality is provided if 50 which is the divisor of the number of columns of subblock matrixes making up the parity check matrix of QC-LDPC code is assumed to be the cycle of the puncturing pattern.

The puncturing pattern that provides good receiving quality is as follows:

(1, 8, 19, 20, 25, 28, 29, 31, 38, 40, 41)

As another expression, puncture table w can be expressed as:

$$w=[1011111101\ 1111111110\ 0111101100\ 1011111101\ 0011111111]$$

In this case, 0's included in w denote bits not to transmit. That is, puncture table w determines bits not to transmit as shown in FIG. 21 with respect to vi. Therefore, data bit vi' to be transmitted except for bits not to transmit with respect to v=[s50*i, s50*i+1, . . . , s50*i+48, s50*i+49] is represented by:

$$vi'=[s50*i,s50*i+2,s50*i+3,s50*i+4,s50*i+5,s50*i+6,\\ s50*i+7,s50*i+9,s50*i+10,s50*i+11,s50*i+12,\\ s50*i+13,s50*i+14,s50*i+15,s50*i+16,s50*i+17,\\ s50*i+18,s50*i+21,s50*i+22,s50*i+23,s50*i+24,\\ s50*i+26,s50*i+27,s50*i+30,s50*i+32,s50*i+33,\\ s50*i+34,s50*i+35,s50*i+36,s50*i+37,s50*i+39,\\ s50*i+42,s50*i+43,s50*i+44,s50*i+45,s50*i+46,\\ s50*i+47,s50*i+48,s50*i+49]$$

A puncturing pattern for realizing a coding rate of approximately 0.95 through puncturing from QC-LDPC code having the parity check matrix in equation 9 of coding rate ⅚ will be described. Here, suppose the size of subblock matrixes making up the parity check matrix of QC-LDPC code is 210 rows and 210 columns. Therefore, in the QC-LDPC code, the information block length (bits) is 4200 and the LDPC codeword block length (bits) is 5040.

In this case, a codeword of the LDPC code is expressed as follows:

$$v=[x0,x1,\ldots,x4198,x4199,p0,p1,\ldots,p838,p839]$$

$$=[s0,s1,s2,\ldots,s5037,s5038,s5039]$$

$$=[v0,v1,v2,\ldots,v79]$$

where v denotes a codeword, x denotes information and p denotes parity.

v0, v1, . . . , vi . . . , v79 can be expressed as follows:

$$v0=[s0,s1,\ldots,s61,s62],$$

$$v1=[s63,s64,\ldots,s124,s125],\ldots,$$

$vi=[s63*i, s63*i+1, \ldots, s63*i+61, s63*i+62], \ldots,$ $v79=[s4977, s4978, \ldots, s5038, s5039]$ As a result of searching a puncturing pattern, the present inventors have confirmed that good receiving quality is provided if 63 is assumed to be the cycle of the puncturing pattern.

The puncturing pattern that provides good receiving quality is as follows:
(3, 18, 20, 27, 39, 50, 60)

As another expression, puncture table w can be expressed as:

$w=[1110111111\ 1111111101\ 0111111011$
$1111111110\ 111111111\ 0111111111\ 011]$

In this case, 0's included in w means bits not to transmit. That is, with respect to vi, puncture table w determines bits not to transmit as shown in FIG. 22. Therefore, with respect to vi=[s63*i, s63*i+1, ..., s63*i+61, s63*i+62], data bits vi' to be transmitted, not including bits not to be transmitted, can be expressed as:

$vi'=[s63*i, s63*i+1, 63*i+2, s63*i+4, s63*i+5, s63*i+6,$
$s63*i+7, s63*i+8, 63*i+9, s63*i+10, s63*i+11,$
$s63*i+12, s63*i+13, s63*i+14, s63*i+15, s63*i+16,$
$s63*i+17, s63*i+19, s63*i+21, s63*i+22, s63*i+23,$
$s63*i+24, s63*i+25, s63*i+26, s63*i+28, s63*i+29,$
$s63*i+30, s63*i+31, s63*i+32, s63*i+33, s63*i+34,$
$s63*i+35, s63*i+36, s63*i+37, s63*i+38, s63*i+40,$
$s63*i+41, s63*i+42, s63*i+43, s63*i+44, s63*i+45,$
$s63*i+46, s63*i+47, s63*i+48, s63*i+49, s63*i+51,$
$s63*i+52, s63*i+53, s63*i+54, s63*i+55, s63*i+56,$
$s63*i+57, s63*i+58, s63*i+59, s63*i+61, s63*i+62]$

In this case, if the cycle of the puncturing pattern is assumed to be on the order of 20 to 90, data quality when received is improved. The "cycle of a puncturing pattern" refers to the minimum cycle of the puncturing pattern. For example, the puncturing pattern cycle of puncture table w1=[001] is 3. Furthermore, puncture table w2=[001001] has a configuration with cycle 6 and is made up of two puncture tables w1=[001], and since the puncturing pattern cycle of puncture table w1 is 3, the (minimum) puncturing pattern cycle of puncture table w2 is 3 as with puncture table w1. That is, the cycle of a puncturing pattern refers to the pattern length of a minimum one of patterns making up the puncturing pattern. Furthermore, though puncture table w3=[010] is identical to one cyclically shifting w1, when the above described relationship between w, vi and vi' is taken into account, w3 and w1 can be said to be different puncturing patterns. That is, when puncture table wx and puncture table wy are given, even if wx is cyclically shifted (not including 0-bit cyclic shifting) and becomes identical to wy, wx and wy are still different puncturing patterns.

When the cycle of a puncturing pattern is too long, irregularity occurs in the arrangement of bits not to transmit (puncture bits), which becomes similar to a model in which a random error has occurred in a binary erasure channel, causing data quality to become poor during reception. On the other hand, when the cycle of a puncturing pattern is too short, the arrangement of bits not to transmit (puncture bits) is unbalanced, the puncturing pattern is less likely to be adequate and data quality becomes poor during reception. For this reason, it is important to set the cycle of the puncturing pattern to the order of 20 to 90.

Furthermore, when the cycle of a puncturing pattern is set to the order of 20 to 90, if three or more 0's are included in puncture table w, the data quality during reception becomes good (it is more likely to be able to generate a puncturing pattern whereby high data quality can be obtained during reception (decoding)). When three or more 0's are included in puncture table w, the arrangement of bits not to transmit (puncture bits) is no longer regular and randomness increases, and, consequently, data quality during reception becomes good.

Moreover, if the cycle of the puncturing pattern is set to the order of 20 to 90, three or more 0's are included in puncture table w and an integer multiple of the number of columns or a divisor of the number of columns of subblock matrixes making up the parity check matrix of QC-LDPC code is set as the cycle of the puncturing pattern, it is more likely to be able to generate a puncturing pattern whereby high data quality can be obtained during reception (decoding).

Other puncturing patterns include the following:

Assuming the size of subblock matrixes making up the parity check matrix of QC-LDPC code is 80 rows and 80 columns, puncturing patterns for realizing coding rates of approximately 0.65 and 0.75 through puncturing from QC-LDPC code (information block length (bits)=960, LDPC codeword block length (bits)=1920) having the parity check matrix of equation 8 of coding rate ½ are as follows:

When coding rate is approximately 0.65: w=[1111110110 0100111111]

When coding rate is approximately 0.75: w=[1100111111 1101111110 0111110001 1110000111]

Assuming the size of subblock matrixes making up the parity check matrix of QC-LDPC code is 48 rows and 48 columns, a puncturing pattern for realizing a coding rate of approximately 0.95 through puncturing from QC-LDPC code (information block length (bits)=960, LDPC codeword block length (bits)=1152) having the parity check matrix of equation 9 of coding rate ⅚ is as follows:

$w=[1111111110\ 1111111111\ 0111101111$
$1111001111\ 11101111]$

Assuming the size of subblock matrixes making up the parity check matrix of QC-LDPC code is 180 rows and 180 columns, puncturing patterns for realizing coding rates of approximately 0.65 and 0.75 through puncturing from QC-LDPC code (information block length (bits)=2160, LDPC codeword block length (bits)=4320) having the parity check matrix of equation 8 of coding rate ½ are as follows:

When coding rate is approximately 0.65: w=[1011111100 0011111101 1111100111 011111]

When coding rate is approximately 0.75: w=[1111110100 0001101001 1111111110]

Assuming the size of subblock matrixes making up the parity check matrix of QC-LDPC code is 108 rows and 108 columns, a puncturing pattern for realizing a coding rate of approximately 0.95 through puncturing from QC-LDPC code (information block length (bits)=2160, LDPC codeword block length (hits)=2592) having the parity check matrix of equation 9 of coding rate ⅚ is as follows:

$w=[10111111111\ 1111011111\ 1110111]$

Embodiment 7

Embodiment 5 has described the case where different puncturing patterns are used in parity check matrix $H_b$, between submatrix $H'_{b2}$ (see equation 6) made up of unit matrixes and zero matrixes and submatrixes other than submatrix $H'_{b2}$ (hereinafter represented as "$H'_{b1}(=H_{b1}+h_b)$"), see equations 5 and 6). As an example thereof, as shown in FIG. 19A to FIG. 19C, FIG. 20A to FIG. 20C, Embodiment 5 has described a case where identical puncturing patterns are used for submatrix H'$_{b2}$ made up of unit matrixes and zero matrixes using an integer multiple of the number of columns or a divisor of the number of columns of subblock matrixes as a unit.

Figure 23:
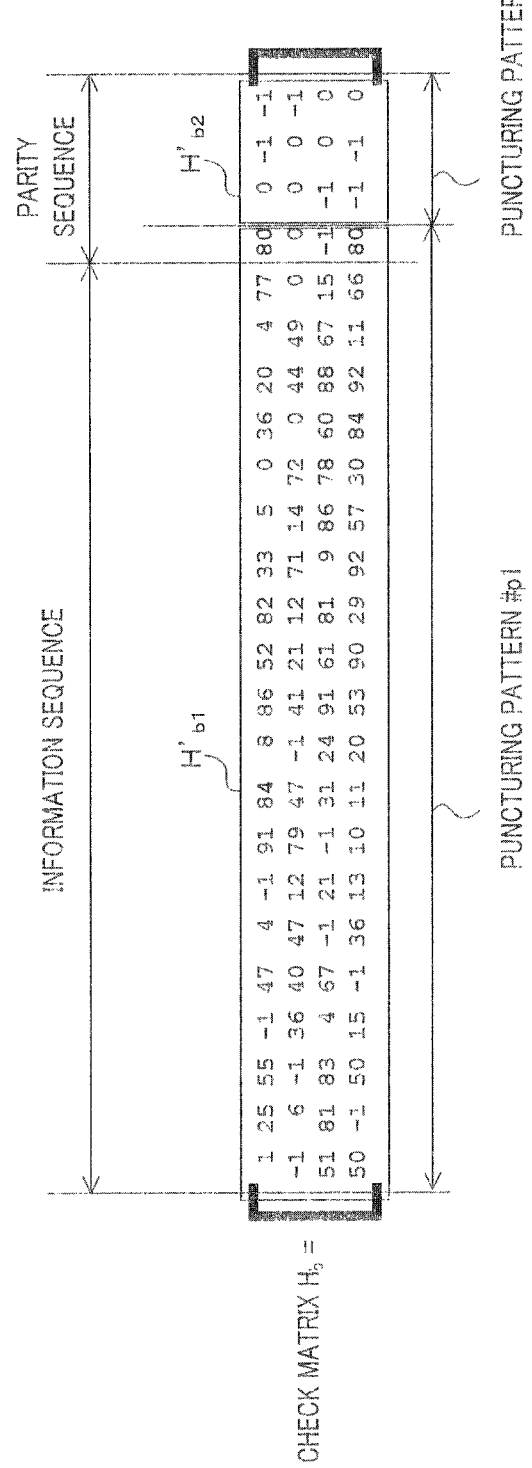
FIG. 23 is a diagram illustrating a puncturing pattern according to Embodiment 7 of the present invention.

As with Embodiment 5, the present embodiment will describe a case where different puncturing patterns will be used for submatrix H'$_{b2}$ made up of unit matrixes and zero matrixes, and submatrix H'$_{b1}$ in parity check matrix H$_b$. To be more specific, as shown in FIG. 23 which corresponds to FIG. 20B, a case will be described where a coding rate of 20/21 is realized using puncturing pattern #p1 whose puncture cycle is the number of columns of submatrix H'$_{b1}$ for submatrix H'$_{b1}$ and using puncturing pattern #p2 whose puncture cycle is the number of columns of submatrix H'$_{b2}$ for submatrix H'$_{b2}$.

Hereinafter, a puncturing pattern for realizing coding rate 20/21 through puncturing from a QC-LDPC code having a parity check matrix of equation 9 of coding rate 5/6 will be described as an example.

Figure 24:
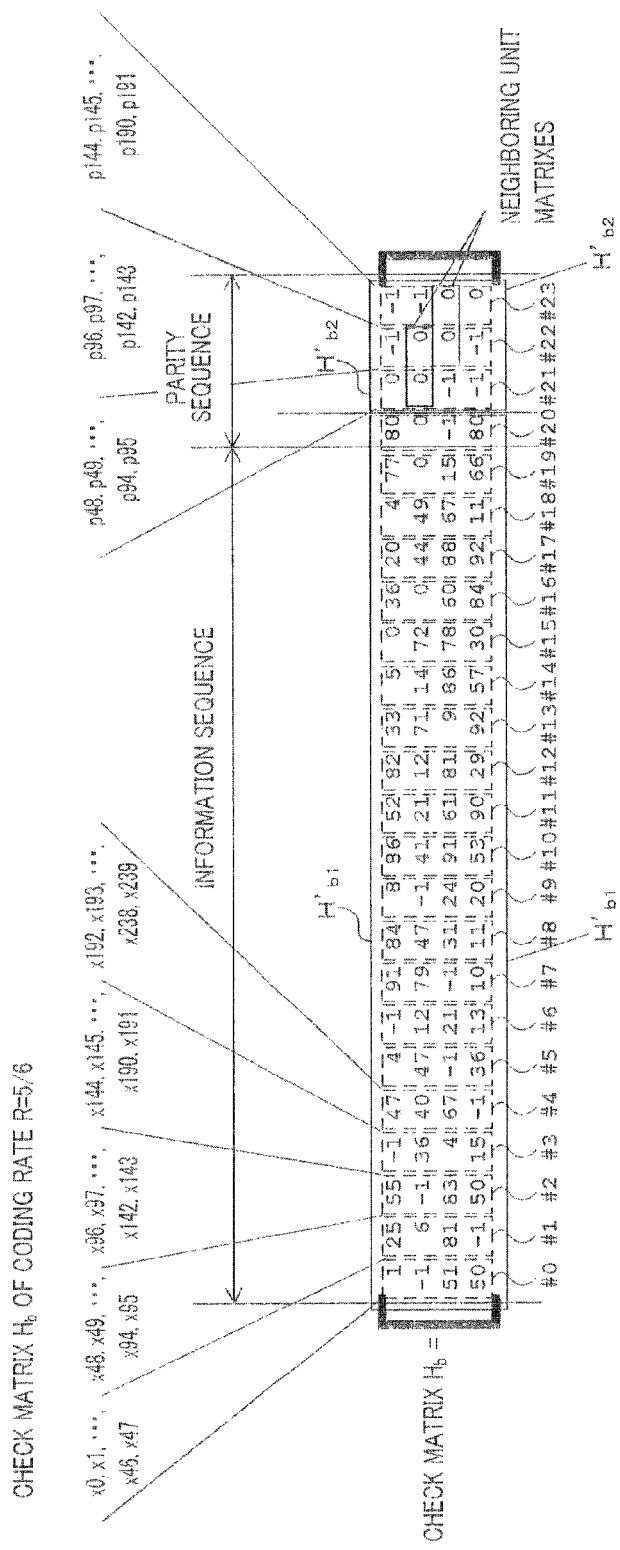
FIG. 24 is a diagram illustrating parity check matrix $H_b$ of QC-LDPC code having coding rate ⅚.

Parity check matrix H$_b$ in FIG. 24 is parity check matrix H$_b$ of QC-LDPC of coding rate 5/6 shown in equation 9. Parity check matrix H$_b$ in equation 9 is made up of a subblock matrix of 4 rows and 24 columns. Hereinafter, suppose the size of subblock matrixes making up the parity check matrix of QC-LDPC code is 48 rows and 48 columns. Therefore, in the QC-LDPC code, the information block length (bits) is 960 and the LDPC codeword block length (bits) is 1152.

In this case, a codeword of the LDPC code is expressed as follows:

$$v=[x0,x1,\ldots,x958,x959,p0,p1,\ldots,p190,p191]$$

$$=[s0,s1,s2,\ldots,s1149,s1150,s1151]$$

$$=[v0,v1,v2,\ldots,v24]$$

where v denotes a codeword, x denotes information and p denotes parity.

v0, v1, ..., vi ..., v23 can be expressed as follows:

$$v0=[s0,s1,\ldots,s46,s47],$$

$$v1=[s48,s48,\ldots,s94,s95],\ldots,$$

$$vi=[s48*i,s48*i+1,\ldots,s48*i+46,s48*i+47],\ldots,$$

$$v23=[s1104,s1105,\ldots,s1150,s1151]$$

In FIG. 24, #0 represents a partial matrix corresponding to x0, x1, ..., x47 and #1 represents a partial matrix corresponding to x48, x49, ..., x95. Furthermore, #21 represents a partial matrix corresponding to p48, p49, ..., p95, #22 represents a partial matrix corresponding to p96, p97, ..., p143 and #23 represents a partial matrix corresponding to p144, p145, ..., p191.

In FIG. 24, submatrix H'$_{b1}$ is made up of #0 to 20 and submatrix H'$_{b2}$ is made up of #21, #22 and #23. #21, #22 and #23 are made up of unit matrixes ("0") and zero matrixes ("−1"). Thus, parity check matrix H$_b$ of the QC-LDPC code expressed in equation 9 includes submatrix H'$_{b2}$ made up of unit matrixes and zero matrixes.

The present embodiment determines preferred puncturing patterns with features of submatrix H'$_{b2}$ and BP decoding taken into account.

BP decoding obtains a log likelihood ratio of each bit by repeating row calculations and column calculations.

The row calculation of BP decoding updates the log likelihood ratio. In this case, (puncture) hits that have not been transmitted are handled as erasure bits during decoding and since no initial log likelihood ratio exists for the erasure bits, the log likelihood ratio is set to 0. When two or more erasure bits for which no initial log likelihood ratio exists are included in the same row, the log likelihood ratio is not updated in the rows through the row calculation alone until the log likelihood ratios of the erasure bits are updated through column calculations. Therefore, the erasure bits in the same row are preferably less than 2 bits.

A column calculation of BP decoding updates an extrinsic value. The extrinsic value of an erasure bit is updated based on the addition result of log likelihood ratios of "1" except for itself on the same column. Therefore, when the column weight is large, the extrinsic value of the erasure bit is updated based on the addition result of log likelihood ratios of a plurality of 1's except for itself on the same column, and therefore the absolute values of the log likelihood ratios in the extrinsic value increase and this causes the log likelihood ratios to be more likely to converge. On the other hand, when the column weight is small, the number of log likelihood ratios to be added is small, and therefore the absolute values of the log likelihood ratios in the extrinsic value are less likely to increase and this provides the nature that the log likelihood ratios are less likely to converge.

Especially when the column weight is 2, the extrinsic value is simply replaced for two 1's corresponding to column weight 2 in the parity check matrix, the absolute values of log likelihood ratios are less likely to increase, and reliability is not propagated even if iterative processing is performed repeatedly, which may cause the receiving quality to degrade. Therefore, to appropriately update the magnitude of the extrinsic value, the column weight of the erasure bit is preferably 3 or more.

Thus, when the feature of BP decoding is taken into account, from the perspective of row calculations, 1) the erasure bits in the same row are preferably less than 2 bits and from the perspective of the column calculation, 2) the column weight of the erasure bits is preferably 3 or more.

The present embodiment will set puncturing patterns with 1) and 2) above taken into account. Hereinafter, a case will be described where a coded sequence is punctured using the number of columns of subblock matrix as a unit as an example.

When parity check matrix H$_b$ of equation 9 is represented using the subblock matrix as one unit, in submatrix H'$_{b2}$, a relationship that unit matrixes ("0") are arranged in the i-th row and (i+1)-th row of the j-th column, zero matrixes ("−1") are arranged in rows other than the i-th row and (i+1)-th row of the j-th column, unit matrixes ("0") are arranged in the (i+1)-th row and (i+2)-th row of the (j+1)-th column, and zero matrixes ("−1") are arranged in rows other than the (i+1)-th row and (i+2)-th row of the (j+1)-th column holds with j=q, q+1, q+2, ..., q+s−1, q+s (where s is an integer equal to or greater than 1).

To be more specific, as is clear from FIG. 24, unit matrixes ("0") are arranged in the first row and second row of the 22nd column, zero matrixes ("−1") are arranged in rows other than the first and second rows of the 22nd column (third row and fourth row), unit matrixes ("0") are arranged in the second and third rows of the 23rd column, zero matrixes ("−1") are arranged in rows other than the second and third rows of the 23rd column (first and fourth rows), unit matrixes ("0") are arranged in the third and fourth rows of the 24th column and zero matrixes ("−1") are arranged in rows other than the third and fourth rows of the 24th column (first and second rows). Thus, as shown in the area enclosed by a rectangular frame in submatrix H'$_{b2}$ in FIG. 24, unit matrixes ("0") are arranged neighboring each other in the same row.

In a unit matrix, only diagonal elements of the matrix are 1's and the other elements are 0's. Thus, if bits corresponding to columns of a unit matrix are assumed to be bits not to transmit (puncture bits), there is only one erasure bit in each row of the unit matrix. However, when unit matrixes are arranged neighboring each other in the same row, if bits corresponding to columns including the unit matrixes are assumed to be bits not to transmit (puncture bits), there are two erasure bits in each row.

To be more specific, when unit matrixes are arranged neighboring each other in the same row as the unit matrixes ("0") in the second row of the 22nd column and 23rd column in FIG. 24, if bits corresponding to columns including the two unit matrixes are assumed to be bits not to transmit (puncture bits), there is one erasure bit in each row of the unit matrix ("0") in the second row of the 23rd column, there is one erasure bit in each row in a view of each unit matrix, but since these unit matrixes are arranged neighboring each other in the same row, there are two erasure bits in a view of the same row in which unit matrixes are arranged.

As described in 1) above, erasure bits are preferably less than 2 bits. Therefore, to avoid 2 bit erasures, such a puncturing pattern will be used that bits corresponding to columns #21 and #23 in which no unit matrixes are arranged neighboring each other in the same row are assumed to be bits not to transmit (puncture bits). That is, when bits corresponding to column #21 are assumed to be bits not to transmit (puncture bits), bits corresponding to column #23 separated apart by the number of columns of 1 subblock matrix or more are assumed to be bits not to transmit (puncture bits). Thus, when the coded sequence is punctured using the number of columns of the subblock matrix as a unit, by setting the puncturing interval to one unit or more (the number of columns of 1 subblock matrix), bits erased by puncturing in submatrix $H'_{b2}$ made up of unit matrixes or zero matrixes are only one bit in each row and it is possible to avoid 2 bit erasures and thereby prevent degradation of receiving quality.

On the other hand, when such a puncturing pattern is used that bits corresponding to columns #21 and #22 or columns #22 and #23 are assumed to be bits not to transmit (puncture bits), bits corresponding to columns of unit matrixes neighboring each other in the same row are assumed to be bits not to transmit (puncture bits), and 2 bit erasures occur and the reception characteristics deteriorate.

Moreover, when 2) above is taken into account, the column weight of submatrix $H'_{b1}$ of parity check matrix $H_b$ is 3 or more, and therefore by assuming bits corresponding to columns of submatrix $H'_{b1}$ to be bits not to transmit (puncture bits), the log likelihood ratios of the extrinsic values are updated through column calculations so that the absolute values thereof increases, the log likelihood ratios of erasure bits are more likely to converge and the reception characteristics improve.

Figure 25:
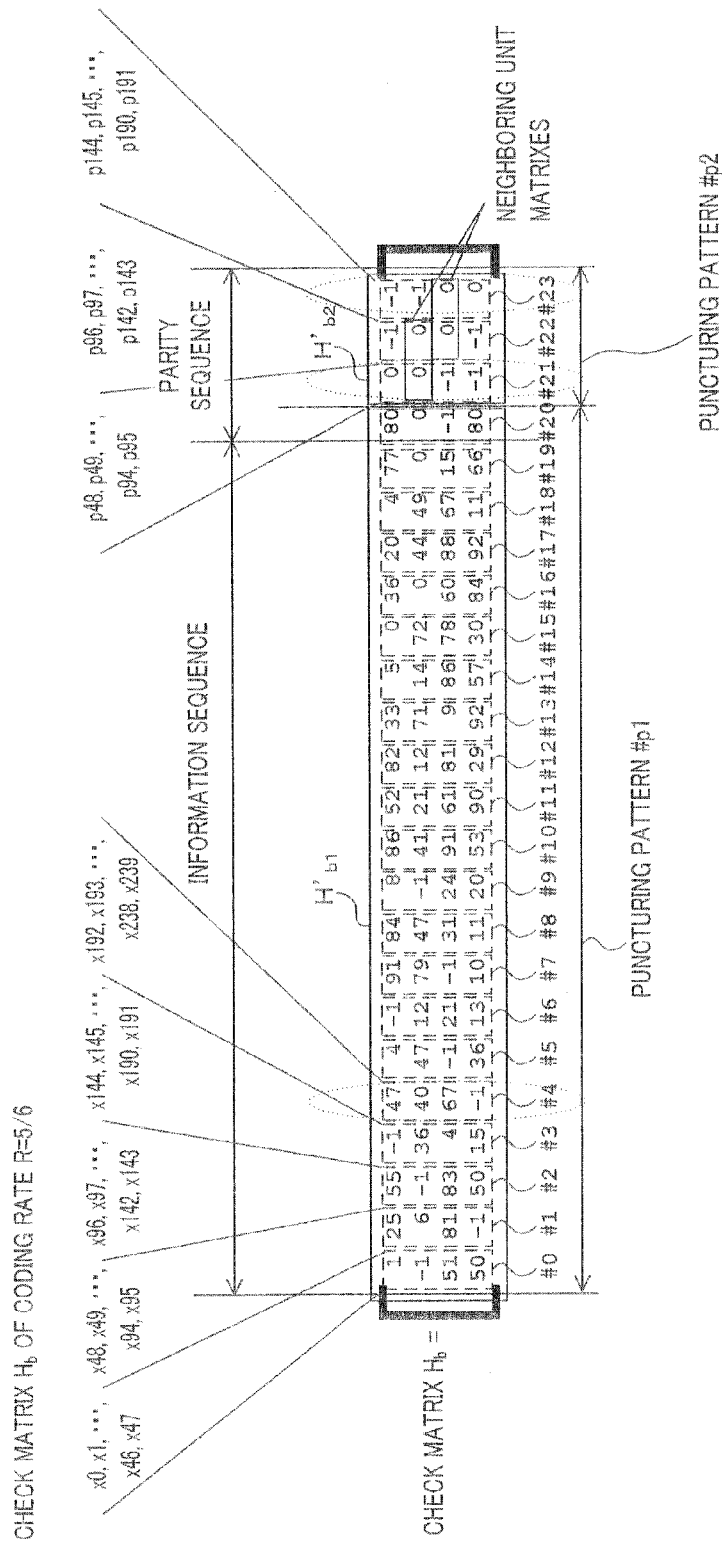
FIG. 25 is a diagram illustrating an example of puncturing pattern according to Embodiment 7.

FIG. 25 illustrates an example where bits corresponding to column #4 in addition to columns #21 and #23 are assumed to be bits not to transmit (puncture bits). Since zero matrixes ("−1") are arranged in the row of #23 in which unit matrixes ("0") are arranged, if bits corresponding to columns #4, #21 and #23 are assumed to be bits not to transmit (puncture bits), the erasure bits of the row are kept to 1 bit in #4, and it is thereby possible to suppress degradation of receiving quality.

Puncture table (puncturing pattern) w when bits corresponding to columns #4, #21 and #23 are assumed to be bits not to transmit (puncture bits) is expressed as shown in equation 10.

$$w = [\underbrace{1\ 1\ \ldots\ 1}_{192}\ \underbrace{0\ 0\ \ldots\ 0}_{48}\ \underbrace{1\ 1\ \ldots\ 1}_{768} \quad \text{(Equation 10)}$$
$$\underbrace{0\ 0\ \ldots\ 0}_{48}\ \underbrace{1\ 1\ \ldots\ 1}_{48}\ \underbrace{0\ 0\ \ldots\ 0}_{48}]$$

0's included in puncture table w in equation 10 means bits not to transmit (puncture bits). That is, in the example shown in FIG. 25, bits corresponding to columns #4, #21 and #23, that is, x192, x193, ..., x238, x239, p48, p49, ..., p94, p95, p144, p145, ..., p190, p191 are punctured.

As described so far, when parity check matrix $H_b$ is represented assuming a subblock matrix as one unit, the present embodiment assumes bits not to transmit (puncture bits) at an interval of one unit or more (the number of columns of subblock matrixes) when selecting bits not to transmit (puncture bits) using the number of columns of subblock matrixes as a unit for submatrix $H'_{b2}$ in which a relationship that unit matrixes ("0") are arranged in the i-th row and (i+1)-th row of the j-th column, zero matrixes ("−1") are arranged in rows other than the i-th row and (i+1)-th row of the j-th column, unit matrixes ("0") are arranged in the (i+1), th row and (i+2)-th row of the (j+1)-th column and zero matrixes ("−1") are arranged in rows other than the (i+1)-th row and (i+2)-th row of the (j+1)-th column holds with j=q, q+1, q+2, ..., q+s−1, q+s (where s is an integer equal to or greater than 1).

Furthermore, by assuming bits corresponding to columns whose column weight is 3 or more as bits not to transmit (puncture bits) in submatrix $H'_{b1}$ other than submatrix $H'_{b2}$ above of parity check matrix $H_b$, the log likelihood ratios of the extrinsic values in column calculations are updated so that the absolute values thereof increase, and it is thereby possible to suppress degradation of receiving quality.

When bits corresponding to columns whose column weight is 3 or more are assumed to be bits not to transmit (puncture bits), if bits corresponding to columns #21 and #23 are assumed to be bits not to transmit (puncture bits) in submatrix $H'_{b2}$, bits corresponding to columns of zero matrixes such as #4 arranged in one row of unit matrixes included in #21 or #23 are assumed to be bits not to transmit (puncture bits). By this means, when bits corresponding to columns #4, #21 and #23 are assumed to be bits not to transmit (puncture bits), it is possible to suppress erasure bits of rows in which zero matrixes are arranged in #4 and thereby suppress degradation of receiving quality.

A preferred puncturing pattern for realizing coding rate 20/21 through puncturing from a QC-LDPC code having the parity check matrix of equation 9 of coding rate 5/6 has been described. Furthermore, preferred puncture table (puncturing pattern) w can be represented as, for example, in equation 11-1 to equation 11-3 suitable for realizing coding rate 20/21 through puncturing from subblock matrix 216×216 having the parity check matrix in equation 9 of coding rate 5/6, that is, QC-LDPC code of information size=4320 bits.

$$w = [\underbrace{0\ 0\ \ldots\ 0}_{216}\ \underbrace{1\ 1\ \ldots\ 1}_{4320}\ \underbrace{0\ 0\ \ldots\ 0}_{216} \quad \text{(Equation 11-1)}$$
$$\underbrace{1\ 1\ \ldots\ 1}_{216}\ \underbrace{0\ 0\ \ldots\ 0}_{216}]$$

$$w = [\underbrace{1\ 1\ \ldots\ 1}_{432}\ \underbrace{0\ 0\ \ldots\ 0}_{216}\ \underbrace{1\ 1\ \ldots\ 1}_{3888}$$
$$\underbrace{0\ 0\ \ldots\ 0}_{216}\ \underbrace{1\ 1\ \ldots\ 1\ 0\ 0\ \ldots\ 0}_{216}\ \underbrace{0\ 0\ \ldots\ 0}_{216}]$$ (Equation 11-2)

$$w = [\underbrace{1\ 1\ \ldots\ 1}_{864}\ \underbrace{0\ 0\ \ldots\ 0}_{216}\ \underbrace{1\ 1\ \ldots\ 1}_{3456}$$
$$\underbrace{0\ 0\ \ldots\ 0}_{216}\ \underbrace{1\ 1\ \ldots\ 1\ 0\ 0\ \ldots\ 0}_{216}\ \underbrace{0\ 0\ \ldots\ 0}_{216}]$$ (Equation 11-3)

A case has been described above where a coded sequence is punctured using the number of columns of subblock matrixes as a unit, but it may also be possible to set candidates for bits not to transmit (puncture bits) using the number of columns of subblock matrixes as a unit at an interval of one unit or more (the number of columns of subblock matrixes) and determine bits not to transmit (puncture bits) from the candidates. In this case, suppose the candidates for bits not to transmit (puncture bits) are set using the number of columns of subblock matrixes as a unit and are assumed to be bits corresponding to columns not including unit matrixes neighboring each other in the same row as described above.

Figure 26:
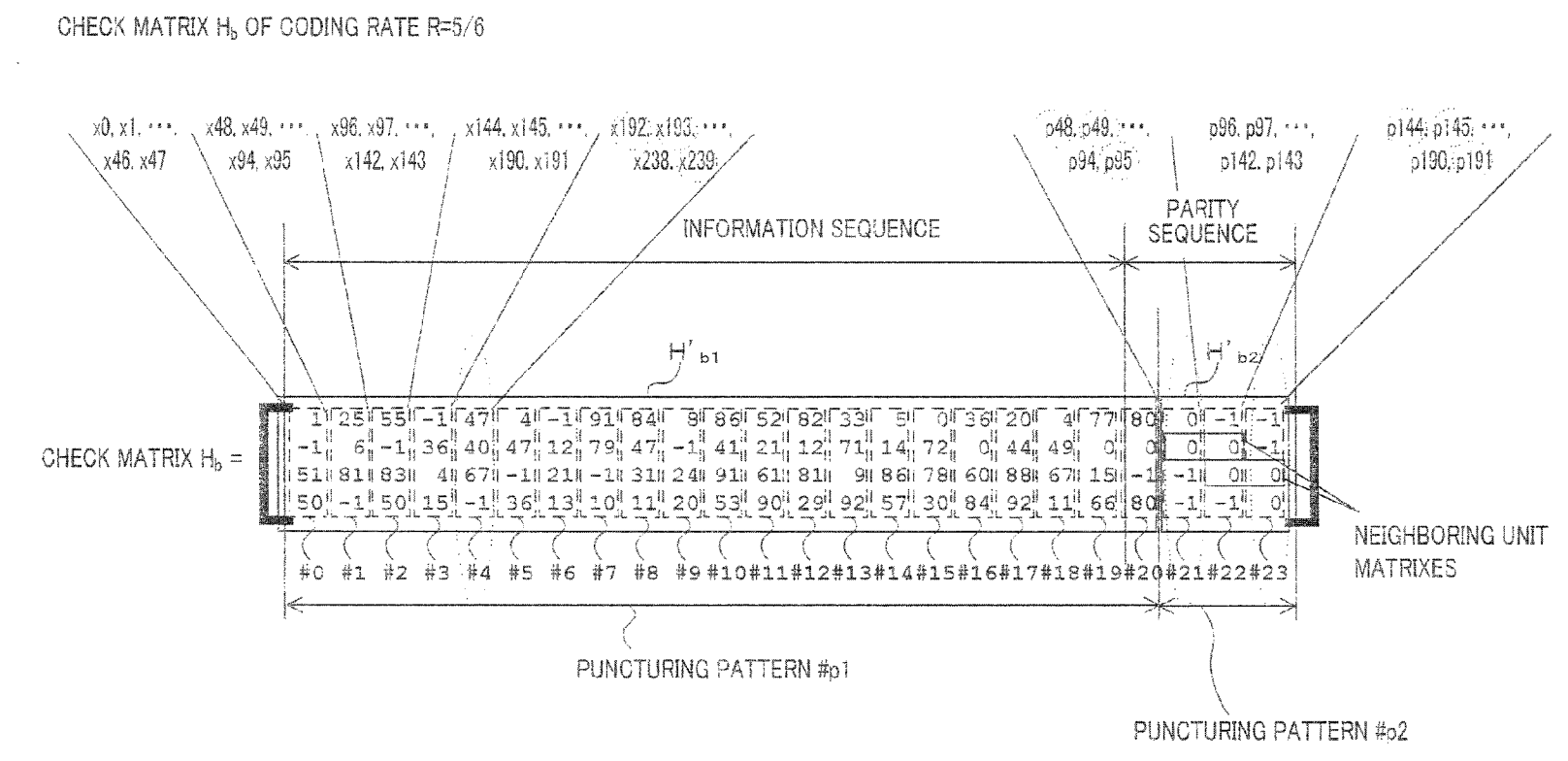

For example, as shown in FIG. 26, bits corresponding to columns #4, #21 and #23 may be assumed to be candidates for bits not to transmit (puncture bits) and some bits encircled by broken line circles of x192, x193, . . . , x238, x239, p48, p49, . . . , p94, p95, p144, p145, . . . , p190, p191 corresponding to columns #4, #21 and #23 may be determined as bits not to transmit (puncture bits).

Using this method, puncture table (puncturing pattern) w suitable for realizing coding rate $^{16}/_{18}$ through puncturing from a QC-LDPC code having the parity check matrix in equation 9 of coding rate $^{5}/_{6}$ and subblock matrix 48×48, that is, information size=960 bits is expressed as shown in equation 12.

$$w = [\underbrace{1\ 1\ \ldots\ 1}_{720}\ \underbrace{0\ 0\ \ldots\ 0}_{24}\ \underbrace{1\ 1\ \ldots\ 1}_{288}$$
$$\underbrace{0\ 0\ \ldots\ 0}_{24}\ \underbrace{1\ 1\ \ldots\ 1\ 0\ 0\ \ldots\ 0}_{72}\ \underbrace{0\ 0\ \ldots\ 0}_{24}]$$ (Equation 12)

Furthermore, as another example, puncture table (puncturing pattern) w suitable for realizing coding rate $^{16}/_{18}$ through puncturing from a QC-LDPC code having the parity check matrix in equation 9 of coding rate $^{5}/_{6}$ and subblock matrix 216×216, that is, information size=4320 bits is represented as shown in equation 13.

$$w = [\underbrace{1\ 1\ \ldots\ 1}_{2808}\ \underbrace{0\ 0\ \ldots\ 0}_{108}\ \underbrace{1\ 1\ \ldots\ 1}_{1620}$$
$$\underbrace{0\ 0\ \ldots\ 0}_{108}\ \underbrace{1\ 1\ \ldots\ 1\ 0\ 0\ \ldots\ 0}_{432}\ \underbrace{0\ 0\ \ldots\ 0}_{108}]$$ (Equation 13)

In these cases, it is also possible to prevent two erasure bits from occurring in each row, thereby obtain good receiving quality and flexibly set a coding rate after the puncturing.

Furthermore, although a case has been described above where codeword v of LDDC, code is represented as v=[x0, x1, . . . , x958, x959, p0, p1, . . . , p190, p191], the order of the information sequence or parity sequence is not limited to this (e.g., the order may also be v=[p0, p1, . . . , p190, p191, x0, x1, . . . , x958, x959] and the order of information or parity is not uniquely determined), but bits not to transmit (parity bits) may be determined from the correspondence of $H_b v=0$, in other words, the correspondence between the puncturing pattern corresponding to parity check matrix $H_b$ and codeword v.

When, for example, bits corresponding to columns #4, #21 and #23 are assumed to be bits not to transmit (puncture bits), if codeword v is represented as v=[p144, p145, . . . , p190, p191, x0, x1, . . . , x958, x959, p0, p1, . . . , p46, p47], x144, x145, . . . , x190, x191, p0, p1, . . . , p46, p47, p96, p97, . . . , p142, p143 may be assumed to be bits not to transmit (puncture bits).

A case has been described in the above described example where a relationship that unit matrixes ("0") are arranged in the i-th row and (i+1)-th row of the j-th column, zero matrixes ("−1") are arranged in rows other than the i-th row and (i+1)-th row of the j-th column, unit matrixes ("0") are arranged in the (i+1)-th row and (i+2)-th row of the (j+1)-th column and zero matrixes ("−1") are arranged in rows other than the (i+1)-th row and (i+2)-th row of the (j+1)-th column in submatrix holds for j=q, q+1, q+2, . . . , q+s−1, q+s (where s is an integer equal to or greater than 1), but it is also possible to obtain a preferred puncturing pattern using the above method of generating a puncturing pattern when cyclic shift matrixes of unit matrixes, instead of unit matrixes, are arranged neighboring each other in the same row. However, when cyclic shift matrixes of unit matrixes are arranged neighboring each other in the same row in submatrix H'$_{b2}$, the configuration of the encoder may be complicated.

A preferred puncturing pattern may also be set for the QC-LDPC code of coding rate ½ in equation 8 using a similar method. A case with coding rate ½ will be described using FIG. 27.

As is the case with coding rate ⅚, for parity check matrix $H_b$ of the QC-LDPC code of coding rate ½ in equation 8, puncturing pattern #p1 whose puncture cycle is the number of columns of submatrix H'$_{b1}$ is used for submatrix H'$_{b1}$ and puncturing pattern #p2 whose puncture cycle is the number of columns of submatrix is used for submatrix H'$_{b2}$.

Figure 27:
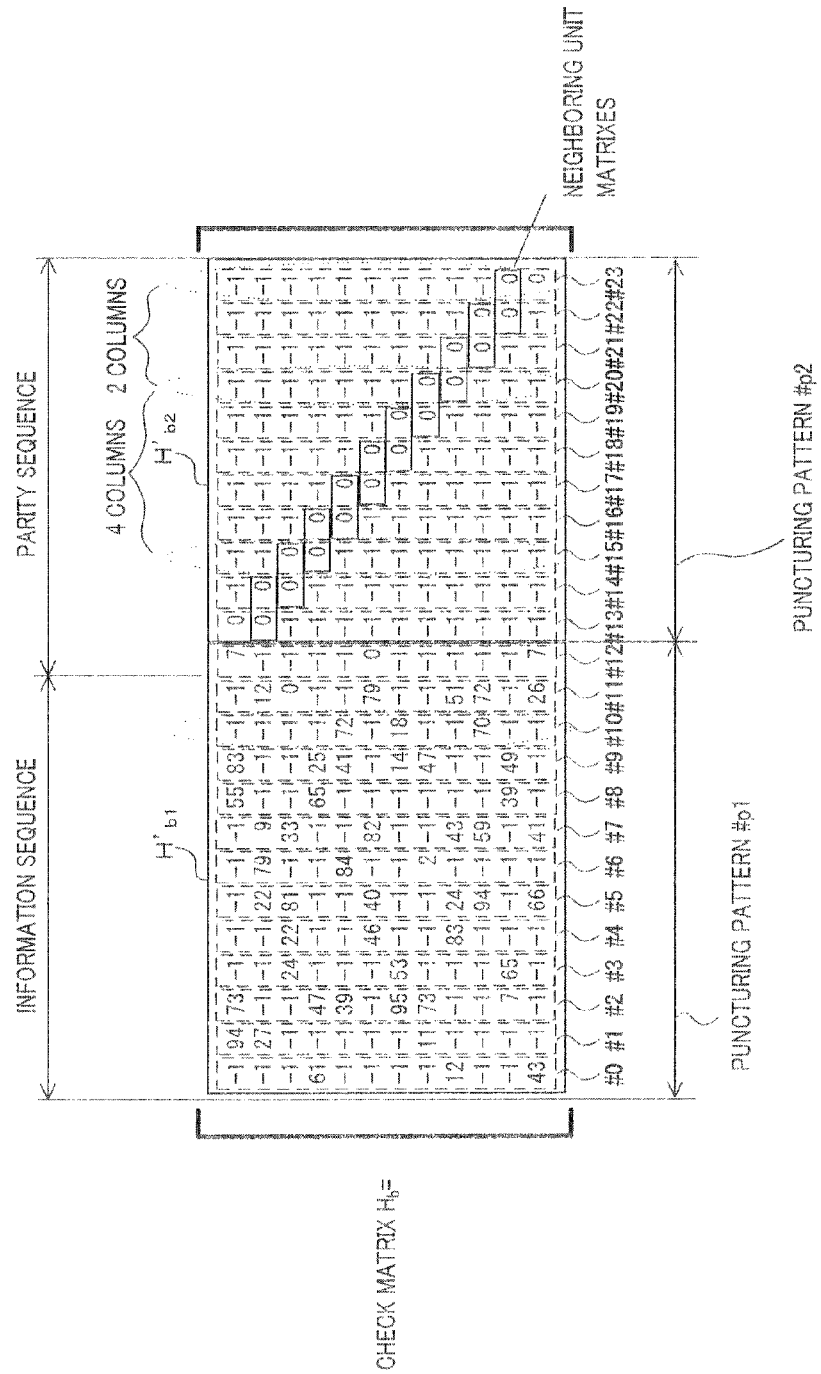
FIG. 27 is a diagram illustrating an example of parity check matrix $H_b$ of QC-LDPC code having coding rate ½ and puncturing pattern.

FIG. 27 is parity check matrix $H_b$ of the QC-LDPC code of coding rate ½ in equation 8. Parity check matrix $H_b$ in equation 8 is made up of a subblock matrix of 12 rows and 24 columns. In FIG. 27, submatrix H'$_{b2}$ is made up of unit matrixes and zero matrixes and submatrix H'$_{b1}$ is outside submatrix H'$_{b2}$.

In FIG. 27, #0 to #23 denote partial matrixes corresponding to the respective columns, submatrix H'$_{b1}$ is made up of #0 to #12 and submatrix H'$_{b2}$ is made up of #13 to #23. #13 to #23 are made up of unit matrixes ("0") and zero matrixes ("−1"). Thus, parity check matrix $H_b$ of the QC-LDPC code shown in equation 8 includes submatrix H'$_{b2}$ made up of unit matrixes and zero matrixes.

Hereinafter, a case will be described where a coded sequence is punctured using the number of columns of a subblock matrix as a unit.

When parity check matrix $H_b$ in equation 8 is represented using a subblock matrix as 1 unit, a relationship that unit matrixes ("0") are arranged in the i-th row and (i+1)-th row of the j-th column, zero matrixes ("−1") are arranged in rows other than the i-th row and (i+1)-th row of the j-th column, unit matrixes ("0") are arranged in the (i+i)-th row and (i+2)-th row of the (j+1)-th column and zero matrixes ("−1") are arranged in rows other than the (i+1)-th row and (i+2)-th row of the (j+1)-th column holds in submatrix H'$_{b2}$ with j=q, q+1, q+2, ..., q+s−1, q+s (where s is an integer equal to or greater than 1).

To be more specific, as is clear from FIG. 27, unit matrixes ("0") are arranged in the first row and second row of the 14th column, zero matrixes ("−1") are arranged in rows other than the first row and second row (third to 12th rows) of the 14th column, unit matrixes ("0") are arranged in the second row and third row of the 15th column, zero matrixes ("−1") are arranged in rows other than the second row and third row of the 15th column (first row, forth to 12th rows), unit matrixes ("0") are arranged in the 11th row and 12th row of the 24th column and zero matrixes ("−1") are arranged in rows other than the 11th row and 12th row of the 24th column (first to 10th rows). Thus, as shown in the areas enclosed by rectangular frames in submatrix H'$_{b2}$ in FIG. 27, unit matrixes ("0") are arranged neighboring each other in the same row.

In the case of coding rate ½, as is the case with coding rate ⅚, such a puncturing pattern is set that bits corresponding to columns in which unit matrixes are not arranged neighboring each other in the same row are assumed to be bits not to transmit (puncture bits). When, for example, a coded sequence is punctured using the number of columns of a subblock matrix as a unit and bits corresponding to column #20 are assumed to be bits not to transmit (puncture bits), bits corresponding to columns #15 and #23 separated apart by the number of columns of 1 subblock matrix are assumed to be bits not to transmit (puncture bits). Thus, when a coded sequence is punctured using the number of columns of a subblock matrix as a unit, the puncturing interval is set to one unit or more (the number of columns of a subblock matrix). Thus, in submatrix H'$_{b2}$ made up of unit matrixes or zero matrixes, bits erased by puncturing are only one bit for each row, and it is thereby possible to prevent 2-hit erasure and prevent degradation of receiving quality.

Furthermore, for example, bits corresponding to columns #15 and #20 may be assumed to be bits not to transmit (puncture bits). #15 and #20 are separated away from each other by one unit or more. Furthermore, bits corresponding to columns #20 and #23 may also be assumed to be bits not to transmit (puncture hits). #20 and #23 are away from each oilier by one unit or more.

All the hits corresponding to columns #15, #20 and #23 may not be assumed to be bits not to transmit (puncture bits), but bits corresponding to columns #15, #20 and #23 may be assumed to be candidates of bits not to transmit (puncture bits) and bits not to transmit (puncture hits) may be determined from these candidates according to the coding rate. By so doing, it is possible to suppress erasure bit in each row to one bit, obtain good receiving quality and flexibly set the coding rate after the puncturing.

Furthermore, of parity check matrix H$_b$, since the column weight is 3 or more in submatrix H'$_{b1}$, by assuming bits corresponding to columns of submatrix H'$_{b1}$ to be bits not to transmit (puncture bits), the magnitude of an extrinsic value is adequately updated through a column calculation, the log likelihood ratios of erasure bits are appropriately obtained and the reception characteristics are improved.

FIG. 27 illustrates an example where bits corresponding to column #10 in submatrix H'$_{b1}$ are assumed to be bits not to transmit (puncture bits). Zero matrixes ("−1") are arranged in the rows of #10 in which unit matrixes ("0") are arranged in #15, #20 and #23, and therefore when bits corresponding to columns #10, #15, #20 and #23 are assumed to be bits not to transmit (puncture bits), erasure bits in the rows are kept to one bit, which is more likely to suppress degradation of receiving quality.

Although a case has been described above where using the number of columns of subblock matrixes as a unit, one subblock matrix is selected from submatrix H'$_{b1}$, a plurality of subblock matrixes are selected from submatrix H'$_{b2}$ and bits corresponding to columns of the selected subblock matrixes are assumed to be bits not to transmit (puncture bits) or candidates for bits not to transmit (puncture bits), the number of subblock matrixes selected from each submatrix is not limited to this, but a plurality of subblock matrixes may also be selected from submatrix H'$_{b1}$.

The present invention is effective when a parity check matrix or generator matrix has regularity as with a QC-LDPC code.

The present invention is not limited to all the above described embodiments, but may be implemented modified in various ways. For example, although a case has been mainly described in the above described embodiments where the present invention is implemented as an encoder, the present invention is not limited to this, but is also applicable when the present invention is implemented as a power line communication apparatus.

Furthermore, this coding method can also be implemented as software. For example, a program for executing the above described coding method may be stored in a ROM (Read Only Memory) beforehand and the program may be operated by a CPU (Central Processor Unit).

Furthermore, the program for executing the coding method may be stored in a computer-readable storage medium, the program stored in the storage medium may be recorded in a RAM (Random Access Memory) of the computer and the computer may be operated according to the program.

Furthermore, it goes without saying that the present invention is not limited to radio communication, but is also useful for power line communication (PLC), visible light communication and optical communication.

One aspect of the encoder of the present invention includes a coding section that generates coded sequence s that satisfies equation 14-1, equation 14-2 and equation 14-3 for information bit sequence u and a setting section that sets a y-th puncturing pattern which corresponds to the number of columns z from the (z×y+1)-th (y is an integer between 0 and (n$_b$−1)) column to the z×(y+1)-th column and which has a cycle of a divisor of the number of columns z, wherein of the coded sequence s made up of z×n$_b$ bits from the first to z×n$_b$-th bits, bits to be removed are determined from the (z×y+1)-th to z×(y+1)-th bits based on the y-th puncturing pattern, the determined bits to be removed are removed from the z×n$_b$ bits making up the coded sequence s to form a transmission information hit sequence and the transmission information bit sequence is outputted.

$$GH^T=0 \quad \text{(Equation 14-1)}$$

$$s^T=Gu^T \quad \text{(Equation 14-2)}$$

$$Hs=0 \quad \text{(Equation 14-3)}$$

where H is a parity check matrix of an LDPC code of (z×mb) rows and (z×nb) columns configured by arranging submatrixes of z rows and z columns in mb rows and nb columns, G is a generator matrix having a relationship of equation 14-1 with parity check matrix H of the LDPC code and coded sequence s is a coded sequence made up of z×nb bits.

In one aspect of the encoder of the present invention, parity check matrix H of the LDPC code is defined by equation 15.

$$H = \begin{bmatrix} P_{0,0} & P_{0,1} & P_{0,2} & \cdots & P_{0,n_b-2} & P_{0,n_b-1} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix}$$ (Equation 15)

where $P_{i,j}$ is a cyclic permutation matrix of a unit matrix of z rows and z columns or zero matrix of z rows and z columns.

In one aspect of the encoder of the present invention, the LDPC code is a QC-LDPC block code.

In one aspect of the encoder of the present invention, the LDPC code is a QC-LDPC code.

One aspect of the transmitting apparatus of the present invention includes a transmission section that is provided with the above described encoder and transmits the transmission information bit sequence.

One aspect of the coding method of the present invention includes a step of generating coded sequence s that satisfies equation 16-1, equation 16-2 and equation 16-3 for information bit sequence u and a step of setting a y-th puncturing pattern which corresponds to the number of columns z from the $(z \times y + 1)$-th (y is an integer between 0 and $(n_b - 1)$) column to the $z \times (y+1)$-th column and which has a cycle of a divisor of the number of columns z, wherein of the coded sequence s made up of $z \times n_b$ bits from the first to $z \times n_b$-th bits, bits to be removed are determined from the $(z \times y + 1)$-th to $z \times (y+1)$-th bits based on the y-th puncturing pattern, the determined bits to be removed are removed from the $z \times n_b$ bits making up the coded sequence s to form a transmission information bit sequence and the transmission information bit sequence is outputted.

$GH^T = 0$ (Equation 16-1)

$s^T = Gu^T$ (Equation 16-2)

$Hs = 0$ (Equation 16-3)

where H is a parity check matrix of an LDPC code of $(z \times m_b)$ rows and $(z \times n_b)$ columns configured by arranging submatrixes of z rows and z columns in $m_b$ rows and $n_b$ columns, G is a generator matrix having a relationship of equation 16-1 with parity check matrix H of the LDPC code and coded sequence s is a coded sequence made up of $z \times n_b$ bits.

In one aspect of the coding method of the present invention, parity check matrix H of the LDPC code is defined by equation 17.

$$H = \begin{bmatrix} P_{0,0} & P_{0,1} & P_{0,2} & \cdots & P_{0,n_b-2} & P_{0,n_b-1} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix}$$ (Equation 17)

In one aspect of the coding method of the present invention, the LDPC code is a QC-LDPC block code.

In one aspect of the coding method of the present invention, the LDPC code is a QC-LDPC code.

One aspect of the transmission method of the present invention includes the above described coding method and transmits the transmission information bit sequence.

One aspect of the encoder of the present invention includes an arrangement section that generates information bit sequence u by inserting 0's in information bits and a coding section that generates coded sequence s that satisfies equation 18-1, equation 18-2 and equation 18-3 for information bit sequence u, wherein, of the coded sequence s, bits always having "0" values are determined based on positions in which the information bits are arranged and parity check matrix H of the LDPC code, the bits always having "0" values are removed from the coded sequence s to form a transmission information bit sequence and the transmission information bit sequence is outputted.

$GH^T = 0$ (Equation 18-1)

$s^T = Gu^T$ (Equation 18-2)

$Hs = 0$ (Equation 18-3)

where H is a parity check matrix of an LDPC code of $(z \times m_b)$ rows and $(z \times n_b)$ columns configured by arranging submatrixes of z rows and z columns in $m_b$ rows and $n_b$ columns, G is a generator matrix having a relationship of equation 18-1 with parity check matrix H of the LDPC code and coded sequence s is a coded sequence made up of $z \times n_b$ bits.

One aspect of the transmitting apparatus of the present invention includes a transmission section that is provided with the above described encoder and transmits the transmission information bit sequence.

One aspect of the coding method of the present invention includes a step of generating information bit sequence u by inserting 0's in information bits and a step of generating a coded sequence s that satisfies equation 19-1, equation 19-2 and equation 19-3 for the information bit sequence u, wherein, of the coded sequence s, bits always having "0" values are determined based on positions in which the information bits are arranged and parity check matrix H of the LDPC code, the bits always having "0" values are removed from the coded sequence s to form a transmission information bit sequence and the transmission information bit sequence is outputted.

$GH^T = 0$ (Equation 19-1)

$s^T = Gu^T$ (Equation 19-2)

$Hs = 0$ (Equation 19-3)

where H is a parity check matrix of an LDPC code of $(z \times m_b)$ rows and $(z \times n_b)$ columns configured by arranging submatrixes of z rows and z columns in $m_b$ rows and $n_b$ columns, G is a generator matrix having a relationship of equation 19-1 with parity check matrix H of the LDPC code and coded sequence s is a coded sequence made up of $z \times n_b$ bits.

One aspect of the transmission method of the present invention includes the above described coding method and transmits the transmission information bit sequence.

The disclosures of Japanese Patent Application No. 2008-264382, filed on Oct. 10, 2008, and Japanese Patent Application No. 2008-290022, filed on Nov. 12, 2008, including the specifications, drawings and abstracts, are incorporated herein by reference in their entirety.

INDUSTRIAL APPLICABILITY

When, for example, a block code such as QC-LDPC code is used, the present invention can reduce the amount of transmission and suppress deterioration of transmission efficiency while improving receiving quality and is useful as an encoder, transmitting apparatus and coding method for forming a coded sequence using a parity generator matrix partially including zero matrixes such as a QC-LDPC.

REFERENCE SIGNS LIST 100, 100a, 600 Encoder
110, 110a Zero matrix setting section
120, 120a Arrangement section
130, 610 Coding section
140, 630 Puncturing section (data reducing section)
300 Decoder
310 Fixed log likelihood ratio insertion section
320 BP decoding section
400, 500 Communication apparatus
410 Coding section
420 Interleaver
430 Mapping section
440 Transmitting section
510 Receiving section
520 Control information detection section
530 log likelihood ratio calculation section
540 Deinterleaver
550 Decoding section
620 Puncturing pattern setting section

The invention claimed is:

1. A decoder comprising:
    a log likelihood ratio calculation section that calculates first log likelihood ratio sequence using second coded sequence formed by removing bits in first coded sequence s,
        the first coded sequence s satisfying equation 1-1, equation 1-2 and equation 1-3, and being made up of $z \times n_b$ bits from a first bit to a $z \times n_b$-th bit,
        the equation 1-1, equation 1-2 and equation 1-3 being generated for first bit information bit sequence u,
        the second coded sequence being formed by removing the bits from a $z \times y + 1$-th bit to a $z \times (y+1)$-th bit (y is an integer between 0 and ($n_b - 1$)) in the first coded sequence s based on a y-th puncturing pattern, and
        the y-th puncturing pattern corresponding to the number of columns z ranging from $z \times y + 1$ columns to $z \times (y+1)$ columns and having a cycle of divisors of the number of columns z;
    an insertion section that generates second log likelihood ratio sequence in which a predetermined log likelihood ratio is inserted to the first log likelihood ratio sequence based on the y-th puncturing pattern; and
    a BP decoding section that decodes the second log likelihood ratio sequence based on the parity check matrix H and outputs the first information bit sequence u:

$$GH^T = 0 \tag{Equation 1-1}$$

$$s^T = Gu^T \tag{Equation 1-2}$$

$$Hs = 0 \tag{Equation 1-3}$$

where H is a parity check matrix of an low density parity check code of $(z \times m_b)$ rows and $(z \times n_b)$ columns configured by arranging submatrixes of z rows and z columns in $m_b$ rows and $n_b$ columns, G is a generator matrix holding a relationship of equation 1-1 with the parity check matrix H of the low density parity check code and the first coded sequence s is a coded sequence made up of $z \times n_b$ bits.

2. The decoder according to claim 1, wherein the parity check matrix H of the low density parity check code is defined by equation 2:

$$H = \begin{bmatrix} P_{0,0} & P_{0,1} & P_{0,2} & \cdots & P_{0,n_b-2} & P_{0,n_b-1} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & \ddots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} \tag{Equation 2}$$

where $P_{i,j}$ is a cyclic permutation matrix of a unit matrix of z rows and z columns or zero matrix of z rows and z columns.

3. The decoder according to claim 2, wherein the low density parity check code is a quasi cyclic low density parity check block code.

4. The decoder according to claim 2, wherein the low density parity check code is a quasi cyclic low density parity check code.

5. A receiving apparatus comprising:
    a receiving section that receives second coded sequence formed by removing bits in first coded sequence s,
        the first coded sequence s satisfying equation 3-1, equation 3-2 and equation 3-3, and being made up of $z \times n_b$ bits from a first bit to a $z \times n_b$-th bit,
        the equation 3-1, equation 3-2 and equation 3-3 being generated for first information bit sequence u,
        the second coded sequence being formed by removing the bits from a $z \times y + 1$-th bit to a $z \times (y+1)$-th bit (y is an integer between 0 and ($n_b - 1$)) in the first coded sequence s based on a y-th puncturing pattern, and
        the y-th puncturing pattern corresponding to the number of columns z ranging from $z \times y + 1$ columns to $z \times (y+1)$ columns and having a cycle of divisors of the number of columns z;
    a log likelihood ratio calculation section that calculates first log likelihood ratio sequence using the second coded sequence;
    an insertion section that generates second log likelihood ratio sequence in which a predetermined log likelihood ratio is inserted to the first log likelihood ratio sequence based on the y-th puncturing pattern; and a BP decoding section that decodes the second log likelihood ratio sequence based on the parity check matrix H and outputs the first information bit sequence u:

$$GH^T = 0 \quad \text{(Equation 3-1)}$$

$$s^T = Gu^T \quad \text{(Equation 3-2)}$$

$$Hs = 0 \quad \text{(Equation 3-3)}$$

where H is a parity check matrix of an low density parity check code of $(z \times m_b)$ rows and $(z \times n_b)$ columns configured by arranging submatrixes of z rows and z columns in $m_b$ rows and $n_b$ columns, G is a generator matrix holding a relationship of equation 3-1 with the parity check matrix H of the low density parity check code and the first coded sequence s is a coded sequence made up of $z \times n_b$ bits.

6. A decoding method comprising the steps of:
calculating first log likelihood ratio sequence using second coded sequence formed by removing bits in first coded sequence s,
  the first coded sequence s satisfying equation 4-1, equation 4-2 and equation 4-3, and being made up of $z \times n_b$ bits from a first bit to a $z \times n_b$-th bit,
  the equation 4-1, equation 4-2 and equation 4-3 being generated for first information bit sequence u,
  the second coded sequence being formed by removing the bits from a $z \times y+1$-th bit to a $z \times (y+1)$-th bit (y is an integer between 0 and $(n_b-1)$) in the first coded sequence s based on a y-th puncturing pattern, and
  the y-th puncturing pattern corresponding to the number of columns z ranging from $z \times y+1$ columns to $z \times (y+1)$ columns and having a cycle of divisors of the number of columns z;
generating second log likelihood ratio sequence in which a predetermined log likelihood ratio is inserted to the first log likelihood ratio sequence based on the y-th puncturing pattern;
decoding the second log likelihood ratio sequence based on the parity check matrix H; and
outputting the first information bit sequence u:

$$GH^T = 0 \quad \text{(Equation 4-1)}$$

$$s^T = Gu^T \quad \text{(Equation 4-2)}$$

$$Hs = 0 \quad \text{(Equation 4-3)}$$

where H is a parity check matrix of an low density parity check code of $(z \times m_b)$ rows and $(z \times n_b)$ columns configured by arranging submatrixes of z rows and z columns in $m_b$ rows and $n_b$ columns, G is a generator matrix holding a relationship of equation 4-1 with the parity check matrix H of the low density parity check code and the first coded sequence s is a coded sequence made up of $z \times n_b$ bits.

7. The decoding method according to claim 6, wherein the parity check matrix H of the low density parity check code is defined by equation 5:

$$H = \begin{bmatrix} P_{0,0} & P_{0,1} & P_{0,2} & \ldots & P_{0,n_b-2} & P_{0,n_b-1} \\ P_{1,0} & P_{1,1} & P_{1,2} & \ldots & P_{1,n_b-2} & P_{1,n_b-1} \\ P_{2,0} & P_{2,1} & P_{2,2} & \ldots & P_{2,n_b-2} & P_{2,n_b-1} \\ \vdots & \vdots & \vdots & \ldots & \vdots & \vdots \\ P_{m_b-1,0} & P_{m_b-1,1} & P_{m_b-1,2} & \ldots & P_{m_b-1,n_b-2} & P_{m_b-1,n_b-1} \end{bmatrix} \quad \text{(Equation 5)}$$

where $P_{i,j}$ is a cyclic permutation matrix of a unit matrix of z rows and z columns or zero matrix of z rows and z columns.

8. The decoding method according to claim 7, wherein the low density parity check code is a quasi cyclic low density parity check block code.

9. The decoding method according to claim 7, wherein the low density parity check code is a quasi cyclic low density parity check code.

10. A receiving method comprising the steps of:
receiving second coded sequence formed by removing bits in first coded sequence s,
  the first coded sequence s satisfying equation 6-1, equation 6-2 and equation 6-3, and being made up of $z \times n_b$ bits from a first bit to a $z \times n_b$-th bit,
  the equation 6-1, equation 6-2 and equation 6-3 being generated for first information bit sequence u,
  the second coded sequence being formed by removing the bits from a $z \times y+1$-th bit to a $z \times (y+1)$-th bit (y is an integer between 0 and $(n_b-1)$) in the first coded sequence s based on a y-th puncturing pattern, and
  the y-th puncturing pattern corresponding to the number of columns z ranging from $z \times y+1$ columns to $z \times (y+1)$ columns and having a cycle of divisors of the number of columns z;
calculating first log likelihood ratio sequence using the second coded sequence;
generating second log likelihood ratio sequence in which a predetermined log likelihood ratio is inserted to the first log likelihood ratio sequence based on the y-th puncturing pattern;
decoding the second log likelihood ratio sequence based on the parity check matrix H; and
outputting the first information bit sequence u:

$$GH^T = 0 \quad \text{(Equation 6-1)}$$

$$s^T = Gu^T \quad \text{(Equation 6-2)}$$

$$Hs = 0 \quad \text{(Equation 6-3)}$$

where H is a parity check matrix of an low density parity check code of $(z \times m_b)$ rows and $(z \times n_b)$ columns configured by arranging submatrixes of z rows and z columns in $m_b$ rows and $n_b$ columns, G is a generator matrix holding a relationship of equation 6-1 with the parity check matrix H of the low density parity check code and the first coded sequence s is a coded sequence made up of $z \times n_b$ bits.

* * * * *

UNITED STATES PATENT AND TRADEMARK OFFICE
CERTIFICATE OF CORRECTION

| | |
|---|---|
| PATENT NO. | : 8,607,131 B2 |
| APPLICATION NO. | : 13/900264 |
| DATED | : December 10, 2013 |
| INVENTOR(S) | : Yutaka Murakami et al. |

It is certified that error appears in the above-identified patent and that said Letters Patent is hereby corrected as shown below:

In the Claims

Claim 5, column 39, line 3 incorrectly reads:

"and outputs the first information hit sequence u:"

and should read:

"and outputs the first information bit sequence u:".

Claim 6, column 39, line 26 incorrectly reads:

"generated for first information hit sequence u,"

and should read:

"generated for first information bit sequence u,".

Signed and Sealed this
Twenty-ninth Day of April, 2014

Michelle K. Lee
*Deputy Director of the United States Patent and Trademark Office*